United States Patent [19]
Hamamoto et al.

[11] Patent Number: 6,166,989
[45] Date of Patent: Dec. 26, 2000

[54] CLOCK SYNCHRONOUS TYPE SEMICONDUCTOR MEMORY DEVICE THAT CAN SWITCH WORD CONFIGURATION

[75] Inventors: Takeshi Hamamoto; Takuya Ariki; Mikio Asakura; Takayuki Nishiyama, all of Hyogo, Japan

[73] Assignee: Mitsubishi Denki Kabushiki Kaisha, Tokyo, Japan

[21] Appl. No.: 09/261,153

[22] Filed: Mar. 3, 1999

[30] Foreign Application Priority Data

Jul. 28, 1998 [JP] Japan .................................. 10-212492

[51] Int. Cl.[7] ..................................................... G11C 8/00
[52] U.S. Cl. ........................ 365/233; 365/230.03; 365/51; 365/63; 365/190; 365/191; 365/220; 365/221; 365/189.05; 365/189.01; 365/194; 365/195; 365/168; 365/205

[58] Field of Search ................................. 365/233, 51, 63, 365/230.03, 190, 191, 220, 221, 189.05, 189.01, 194, 168, 195, 205

[56] References Cited

U.S. PATENT DOCUMENTS 5,903,514  5/1999  Sawada .................................... 365/233

FOREIGN PATENT DOCUMENTS 4-114395  4/1992  Japan ............................ G11C 11/409
4-252494  9/1992  Japan ............................ G11C 11/409

*Primary Examiner*—Andrew Q. Tran
*Attorney, Agent, or Firm*—McDermott, Will & Emery

[57] ABSTRACT

Data buses are arranged in a one-to-one correspondence to pads. These data buses are arranged in common to a plurality of memory arrays. A read data driver is rendered active selectively according to a word configuration to switch equivalently the connection between a memory array and a data bus.

29 Claims, 37 Drawing Sheets

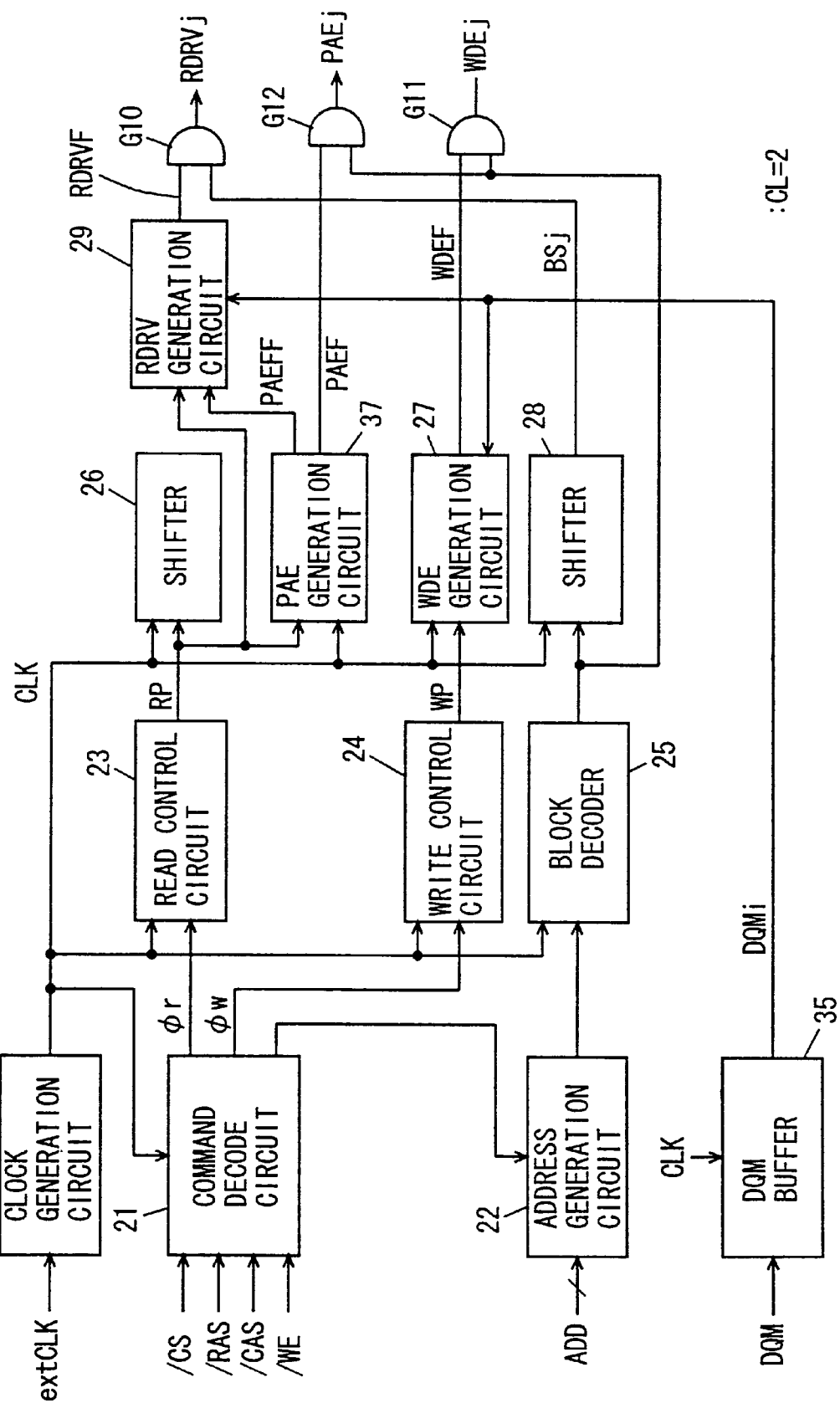
F I G. 16

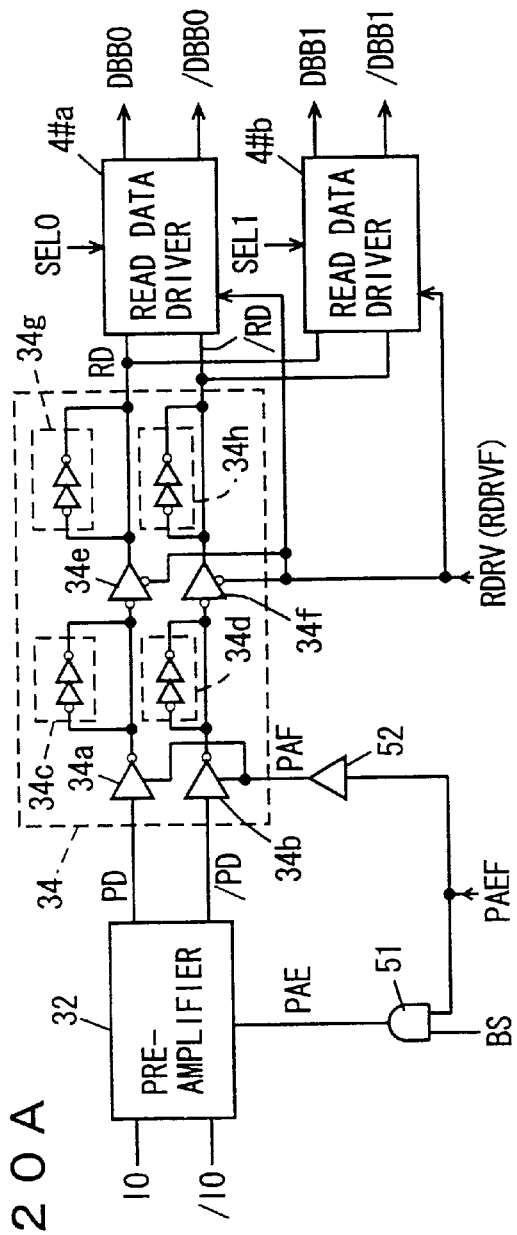
F I G. 20A
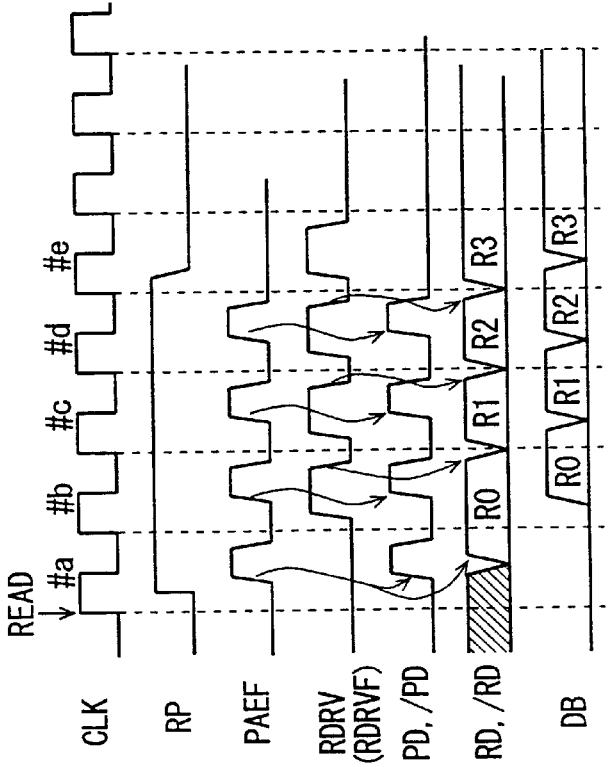
F I G. 20B

Z×4, Z×2 : ×4, ×2 OF BLOCK OTHER THAN END BLOCK
S×4, S×2 : ×4, ×2 FOR END BLOCK

CLOCK SYNCHRONOUS TYPE SEMICONDUCTOR MEMORY DEVICE THAT CAN SWITCH WORD CONFIGURATION

BACKGROUND OF THE INVENTION

1. Field of the Invention

The present invention relates to semiconductor memory devices, particularly to a clock synchronous semiconductor memory device that operates in synchronization with a clock signal. More particularly, the present invention relates to the structure of an internal data transfer scheme of a clock synchronous semiconductor memory device that can switch the word configuration.

2. Description of the Background Art

FIG. 58 schematically shows an entire structure of a conventional synchronous semiconductor memory device. Referring to FIG. 58, a synchronous semiconductor memory device 900 includes memory arrays MAa, MAb, MAc and MAd each having a plurality of memory cells arranged in rows and columns, multibit internal data buses 910a–910d provided corresponding to memory arrays MAa, MAb, MAc and MAd, respectively, a selector/driver 915 selecting bus lines of multibit internal data buses 910a–910d according to an address signal CA and a select signal φsel, an internal read data bus 920 transmitting data from selector/driver 915, and an output circuit OB generating external data according to data applied through internal read data bus 920.

Memory arrays MAa–MAd form banks #0–#3, respectively, and are driven to a selected state independent of each other. Here, "a selected state" refers to the state where a word line is driven to a selected state in a memory array and the data in a memory cell connected to the selected word line is retained.

Select signal φsel is set selectively and fixedly according to the bit width of output data DQ from output circuit OB. One chip can accommodate a plurality of word configurations such as ×4, ×8, ×16 and ×32 bits.

The reason why multibit internal data buses 910a–910d are provided corresponding to memory arrays MAa–MAd, respectively, is described in the following. Banks #0–#3 are driven to a selected state independent of each other, so that a plurality of banks can be maintained at a selected state. However, the access operation of writing/reading data with respect to a memory cell is carried out for one bank. The number of these banks can be altered. Therefore, internal data buses 910a–910d are provided corresponding to memory arrays MAa–MAd, respectively, in order to readily accommodate an arbitrary bank configuration. The bit width of internal data buses 910a–910d is equal to the bit width of internal read bus 920. Selector/driver 915 selects an internal data bus according to a selected bank to be coupled to internal read data bus 920. Selector/driver 915 is responsive to select signal φsel and address signal CA for switching the bus connection path according to a bit width of output data DQ.

FIG. 59 schematically shows a structure of selector/driver 915. The circuitry for one internal data bus is shown as a representative in FIG. 59. Internal data bus 910 (910a–910d) includes bus lines 910-0–910-3 of 4 bits. The output data of preamplifiers 925-0–925-3 that amplify memory cell data IO0–IO3 are transmitted to data bus lines 910-0–910-3, respectively.

Similarly, read data bus 920 includes read data bus lines 920-0–920-3 of 4 bits. Output circuits OB0–OB3 are provided for these read data bus lines 920-0–920-3, respectively. Output data DQ0–DQ3 are provided from output circuits OB0–OB3, respectively.

Selector/driver 915 includes an OR circuit 915a receiving address signal CA and select signal φsel, an inverter 915b inverting the output signal of OR circuit 915a, drive circuits DV0–DV3 provided corresponding to read data bus lines 920-0–920-3, respectively, a transfer gate TX0 coupling data bus line 910-0 to the input of drive circuit DV1 according to the output signal of inverter 915b, a transfer gate TX1 coupling data bus line 910-1 to the input of drive circuit DV1 according to the output signal of OR circuit 915a, a transfer gate TX2 coupling data bus line 910-2 to the input unit of data circuit DV3 according to the output signal of inverter 915b, and a transfer gate TX3 coupling data bus line 910-3 to the input of drive circuit DV3 according to the output signal of OR circuit 915a. Drive circuits DV0 and DV2 are enabled when select signal φsel is at an H level (logical high), to drive read data bus lines 920-0–920-2 according to the data read out on data bus lines 910-0 and 910-2.

Select signal φsel indicates a ×4-bit configuration and a ×2-bit configuration for the word configuration (number of output data bits) at an H level and an L level Logical low), respectively. The operation of selector/driver 915 of FIG. 59 will be described briefly now.

When the word configuration corresponds to a ×4-bit configuration, select signal φsel is fixed at an H level. In this state, the output signal of OR circuit 915a is at an H level. Transfer gates TX1 and TX3 are conductive, and transfer gates TX0 and TX2 are non-conductive. Also, drive circuits DV0 and DV2 are set at an operable state. Therefore, read data bus lines 920-0–920-3 are driven by drive circuits DV0–DV3 according to the data transmitted through data bus lines 910-0–910-3, whereby 4 bits of data DQ0–DQ3 are output via output circuits OB0–OB3.

When select signal φsel is at an L level, drive circuits DV0 and DV2 are set at operation disabled state. Under this state, transfer gates TX0–TX3 are selectively rendered conductive according to the H level/L level of address signal CA. When address signal CA is at an H level, OR circuit 915a provides an output signal of an H level. Transfer gates TX1 and TX3 are rendered conductive. Data bus lines 910-1 and 910-3 are coupled to drive circuits DV1 and DV3, respectively. Therefore, memory cell data IO1 and IO3 are transmitted to output circuits OB1 and OB3, respectively, whereby data DQ1 and DQ3 are generated. When address signal CA is at an H level, transfer gates TX1 and TX3 are rendered non-conductive, whereas transfer gates TX0 and TX2 are rendered conductive. Data bus lines 910-0 and 910-2 are coupled to drive circuits DV1 and DV3, respectively. In this case, memory cell data IO0 and IO2 are transmitted to output circuits OB1 and OB3, whereby data bits DQ1 and Q3 are generated. As a result, data of a 2-bit configuration is output. Output circuits OB0 and OB2 are set at a non-operable state when the word configuration corresponds to a ×2-bit configuration.

By employing selector/driver 915 shown in FIG. 59, a plurality of word configurations can be accommodated without modifying the internal circuit configuration.

When data buses are arranged corresponding to respective memory arrays MAa–MAd as shown in FIG. 58, the area occupied by the data buses increases. Particularly in the case where the word configuration is as large as ×16 bits or ×32 bits, the area occupied by the buses becomes large. In a case of switching the bus connection according to the word configuration by use of selector/driver 915, signal propagation is delayed in the transfer gate that switches the connection, leading to a problem that a signal cannot be transmitted at high speed. Particularly in the case where the word configuration is switched between ×16 bits and ×32 bits, the number of the transfer gates for this selector/driver is increased to result in a larger occupying area. When the number of word configurations that can be selected is increased so that any of ×4, ×8, and ×16, can be selected, the selector/driver requires the select operation of three stages, i.e. the selection of 16 bits from 32 bits, the selection of 8 bits from 16 bits, and the selection of 4 bits from 8 bits. The occupying area of this selector/driver is increased, which further delays the signal propagation. Therefore, data can not be read out at high speed.

Such a selector/diver is also provided for the data write path. Thus, there is a similar problem that data cannot be transmitted to a selected memory cell at high speed.

In a clock synchronous semiconductor memory device, an operation parameter called "CAS latency" is present. This is the number of cycles of the clock signal required from the application of an access command (a read command designating data reading or a write command designating data writing) up to the actual writing of data into a memory cell or actual data read out. Internally, the circuitry is driven according to this CAS latency. Therefore, address signal CA for the selector/driver must have the activation timing modified according to this CAS latency in the structure of FIG. 59, resulting in discrepancy between the ascertained timing of address signal CA and the ascertained timing of the output data from preamplifiers 925-0–925-3. Therefore, the issue of timing margin must be considered, and data cannot be read out at high speed. The same applies for data writing.

SUMMARY OF THE INVENTION

An object of the present invention is to provide a semiconductor memory device that can transfer internal data speedily in writing/reading with a simple circuit structure.

Another object of the present invention is to provide a semiconductor memory device that can transfer internal data speedily regardless of the word configuration.

A further object of the present invention is to provide a clock synchronous semiconductor memory device that can transfer internal data speedily and stably with a smaller occupying area.

A semiconductor memory device according to an aspect of the present invention includes a plurality of pads, a plurality of memory arrays each having a plurality of memory cells, a plurality of data buses provided corresponding to the plurality of pads, respectively, and provided common to the plurality of memory arrays, and a plurality of read data drivers arranged corresponding to the plurality of data buses in each of the plurality of memory arrays to transmit data from a corresponding memory array to a corresponding data bus. Read data driver driving the same data bus, and read data drivers driving data buses differing from each other are provided in each memory array.

A semiconductor memory device according to another aspect of the present invention includes a data bus, a memory array having a plurality of memory cells, a preamplifier for amplifying data read out from a selected memory cell in the memory array, a read data driver for driving a data bus according to the output data from the preamplifier, and a mask control circuit incorporating a mask designation signal render the read data driver inactive in response to data output mask designation of the mask designation signal in synchronization with a clock signal.

A semiconductor memory device according to a further aspect of the present invention includes complementary data buses transmitting complementary data, an equalize circuit for equalizing the complementary data buses to a predetermined potential in synchronization with a clock signal in a data read out operation, a read amplifier amplifying data of the complementary data bus when active, a read control circuit rendering the read amplifier active in accordance with a read detect signal activated in synchronization with the clock signal in response to read out designation and a read out clock signal synchronous with the clock signal, and an output circuit that incorporates and outputs the amplified data from the read amplifier according to a read out clock signal.

By providing a plurality of data buses corresponding to the plurality of pads respectively and common to a plurality of memory arrays, it is not necessary to switch the bus connection path for switching the word configuration. A bus selector does not have to be provided which reduces the area occupied by the bus and also enable a data signal to be transmitted speedily.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 16 shows a modification of the control signal generation circuitry of FIG. 12.

FIG. 20A shows a structure of the internal read out circuit of FIG. 19, and FIG. 20B is a timing chart representing an operation thereof.

DESCRIPTION OF THE PREFERRED EMBODIMENTS

First Embodiment

Figure 1:
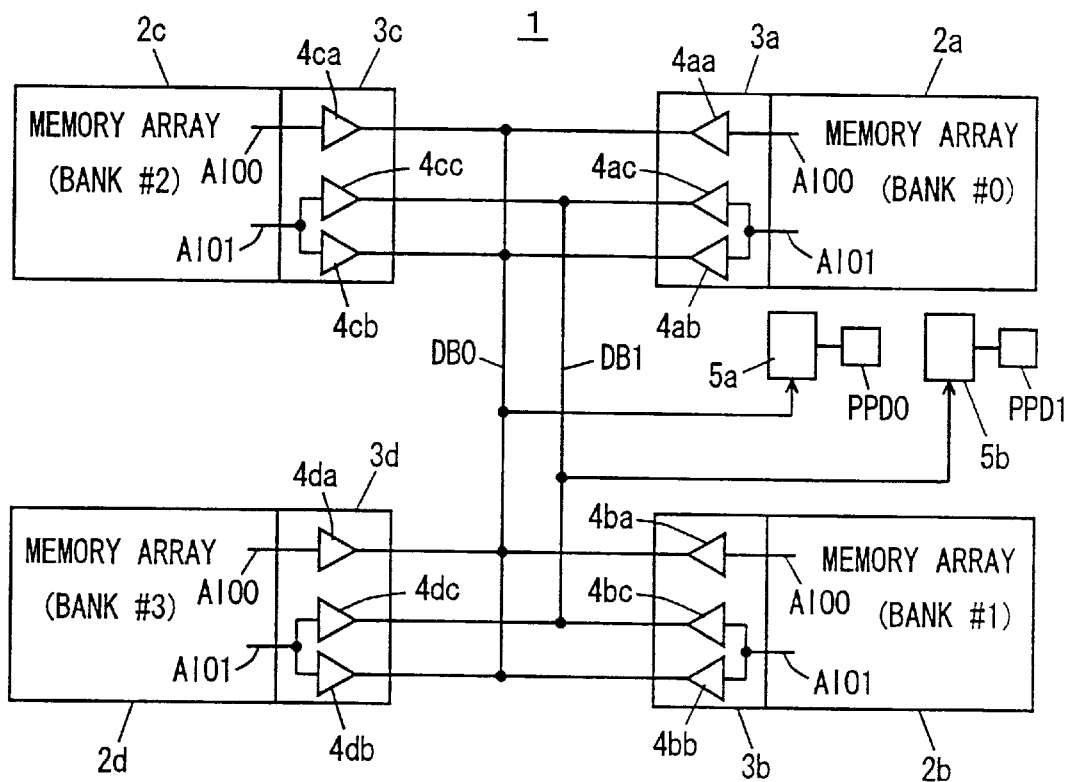
FIG. 1 schematically shows a structure of a main part of a semiconductor memory device according to a first embodiment of the present invention.

Referring to FIG. 1, a semiconductor memory device 1 according to a first embodiment of the present invention includes memory arrays 2a–2d having a plurality of memory cells arranged in rows and columns, column local circuits 3a–3d provided in each of memory arrays 2a–2d for writing/reading data of a memory cell of a corresponding memory array, pads PPD0 and PPD1 for inputting/outputting data, and data buses DB0 and DB1 provided in a one-to-one correspondence with respect to pads PPD0 and PPD1. Data buses DB0 and DB1 are each formed of a continuous aluminum line of low resistance, for example, and arranged common to memory arrays 2a–2d. A bus selector/driver for switching the connection path according to the word configuration is not provided to data buses DB0 and DB1. A data bit is externally input/output via pads PPD0 and PPD1. Semiconductor memory device 1 is operable in either a ×2-bit configuration or a ×1-bit configuration. The word configuration is specified, for example, by setting a particular bonding pad at a predetermined voltage level.

Each of memory arrays 2a–2d can be driven to a selected state independently of each other. Memory arrays 2a–2d form banks #0–#3, respectively. In memory arrays 2a–2d, array IO lines AIO0 and AIO1 corresponding to pads PPD0 and PPD1 respectively are arranged. In a ×2-bit configuration, data is transmitted to array IO lines AIO and AIO1. In a ×1-bit configuration, the data to be read out is output to one of array IO lines AIO0 and AIO1. The manner of selection will be described in detail afterwards. Here, it is simply stated that a plurality of memory cells are selected simultaneously in memory arrays 2a–2d irrespective of the word configuration.

Array IO line AIO0 is coupled to data bus DB0 via read data drivers 4aa, 4ba, 4ca and 4da in each of memory arrays 2a–2d. In contrast, array IO line AIO1 is coupled to data buses DB0 and DB1 via two read data drivers provided within the column local circuit in each of memory arrays 2a–2d. More specifically, in memory array 2a, array IO line AIO1 is coupled to data buses DB0 and DB1 via read data drivers 4ab and 4ac. In memory array 2b, array IO line AIO1 is coupled to data buses DB0 and DB1 via read data drivers 4bb and 4bc, respectively. In memory array 2c, array IO line AIO1 is coupled to data buses DB0 and DB1 via read data drivers 4cb and 4cc, respectively. In memory array 2d, array IO line AIO1 is coupled to data buses DB0 and DB1 via read data drivers 4db and dc, respectively.

Either of the group of read data drivers 4ab, 4bb, 4cb and 4db or the group of read data drivers 4ac, 4bc, 4cc and 4dc is set to an operable state according to the word configuration. In a ×1-bit configuration, 1-bit data is transferred via data bus DB0. Here, pad PPD0 is used, not pad PPD1. Output control circuits 5a and 5b are arranged in the proximity of pads PPD0 and PPD1. Output control circuits 5a and 5b amplify the data transferred via data buses DB0 and DB1 to provide the amplified data to corresponding pads PPD0 and PPD1, respectively.

Figure 2:
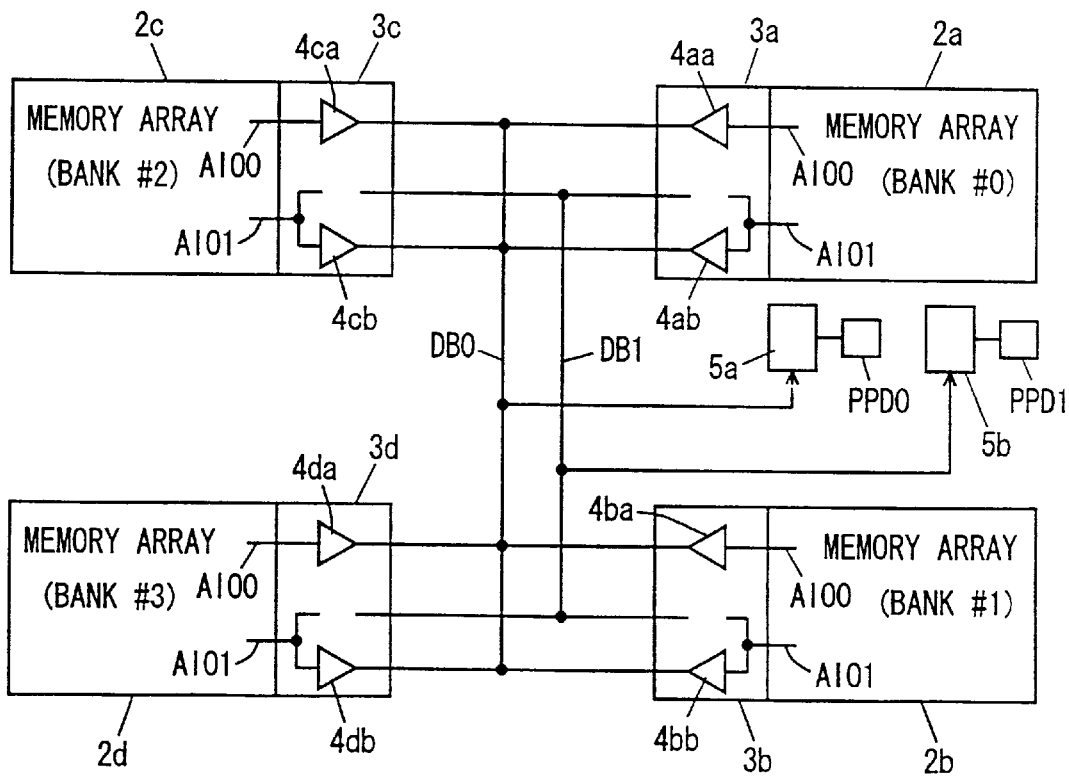
FIG. 2 schematically shows a bus arrangement in a ×1-bit configuration of the semiconductor memory device of FIG. 1.

FIG. 2 shows an arrangement of the read data drivers in a ×1-bit configuration of the semiconductor memory device of FIG. 1. In the ×1-bit configuration of FIG. 2, read data drivers 4ab, 4bb, 4cb and 4db are set to an operable state. Array IO lines AIO0 and AIO1 of each of memory arrays 2a–2d are coupled to data bus DB0. Determination of which of the two read data drivers is to be selected is made using bit of a column address signal. When memory array 2a is accessed, for example, one of read data drivers 4aa and 4ab is selected according to the address signal, to provide data to data bus DB0. In this case, the address data may not be applied to read data drivers 4aa–4bb if selective activation of a preamplifier at a preceding stage according to, for example, an address signal bit is effected to set the read data driver at an output high impedance state according to that read out data, as will be described afterwards. Accordingly, 1-bit data can be input/output via pad PPD0.

Figure 3:
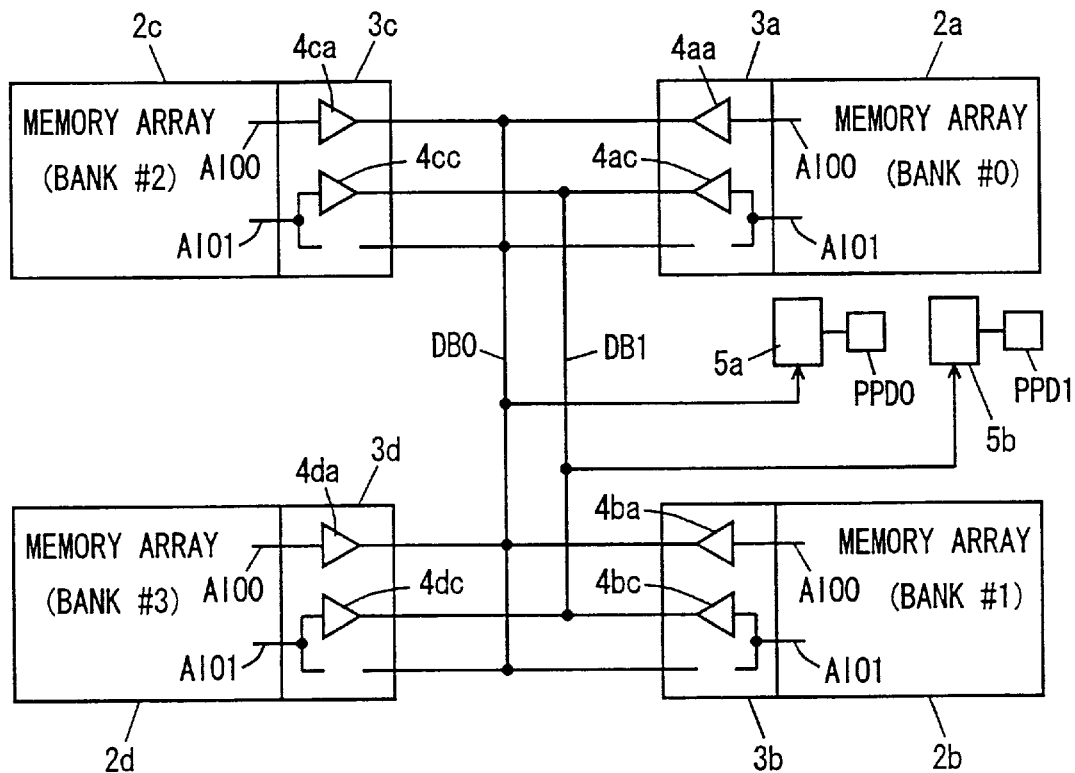
FIG. 3 schematically shows a bus arrangement of a ×2-bit configuration of the semiconductor memory device of FIG. 1.

FIG. 3 shows an arrangement of the read data drivers in a ×2-bit configuration of semiconductor memory device 1. In memory arrays 2a–2d of FIG. 3, read data drivers 4ac, 4bc, 4cc and 4dc are set at an operable state. According to the arrangement of FIG. 3, array IO lines AIO0 and AIO1 of memory arrays 2a–2d correspond to data buses DB0 and DB1, respectively, to read out data of 2 bits.

Since the read data drivers are set selectively to an operable state according to the word configuration to alter the correspondence between an array IO line and a data bus, the selector for altering the data bus connection path is not required. High speed data transfer can thus be implemented.

Figure 4:
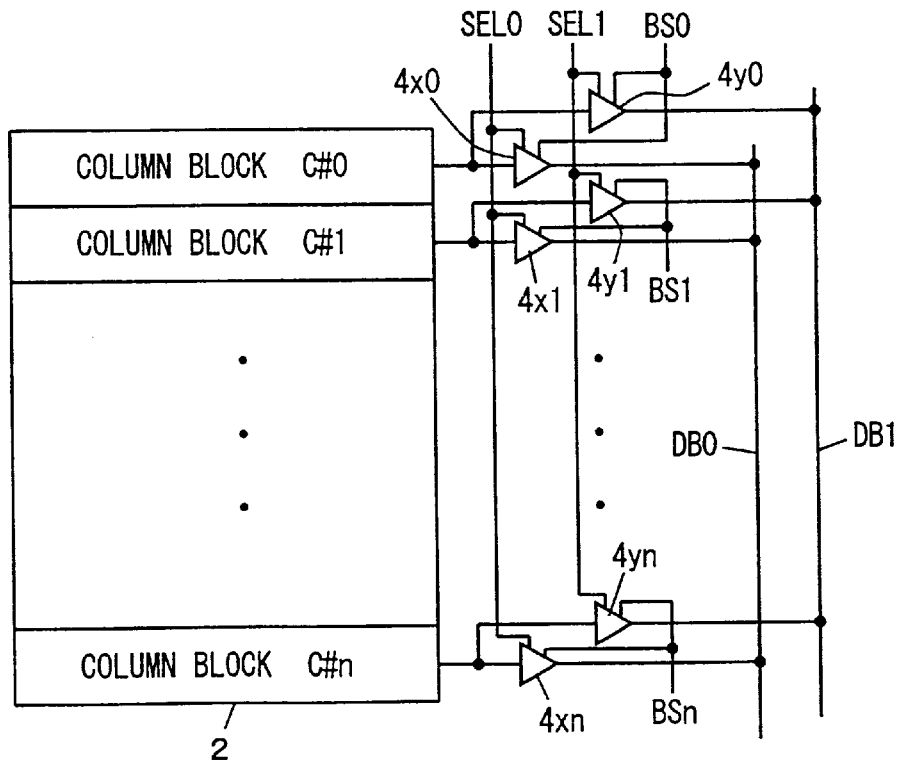
FIG. 4 schematically shows a structure of a column local circuit for one memory array in the semiconductor memory device of FIG. 1.

FIG. 4 specifically-shows a structure for one memory array. The structure of the portion corresponding to array IO line AIO1 is shown in FIG. 4. Memory array 2 is divided into a plurality of column blocks C#0–C#n. Read data drivers 4x0–4xn set to an operable state when a select signal SEL0 is active, and read data drivers 4y0–4yn set to an operable state when a select signal SEL1 is active are provided for column blocks C#0–C#n. Read data drivers 4x0–4xn have respective outputs connected common to data bus DB0. Read data drivers 4y0–4yn have their outputs connected common to data bus DB1. Read data drivers 4x0 and 4y0 are rendered active, when a block select signal BS0 is active, to amplify the data read out from column block C#0. Read data drivers 4x1 and 4y1 are rendered active when a block select signal BS1 is active. Read data drivers 4xn and 4yn are set at an operable state when block select signal BSn is active. These block select signals BS0–BSn indicate the selection of column blocks C#0–C#n, respectively. Read data drivers 4x0–4xn and 4y0–4yn are set to an output high impedance state when set in an inactive state. When select signal SEL (SEL0, SEL1) and block select signal (BS0–BSn) are both active, a corresponding read data driver is rendered active, whereby the data read out from a corresponding column block is transferred to data bus DB0 or DB1.

By providing a read data driver for each of column blocks C#0–C#n, the signal propagation time from each column block to data bus DB0 or DB1 becomes equal. It is therefore not necessary to consider the timing margin, and data can be read out at high speed.

Block select signals BS0–BSn are generated by decoding the lower bit(s) of the column address signal.

Figure 5:
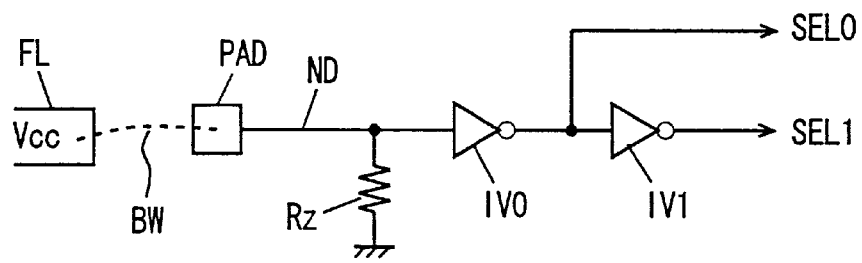
FIG. 5 shows an example of a structure of select signal generation circuitry.

FIG. 5 shows an example of a structure of select signal generation circuitry. In FIG. 5, a resistance element Rz of high resistance connected between a node ND connecting to a particular pad PAD and the ground node, an inverter IV0 inverting the signal of node ND and an inverter IV1 inverting the output signal of inverter IV0 are provided. Select signal SEL0 is output from inverter IV0. Select signal SEL1 is output from inverter IV1. Pad PAD is connected to frame lead FL that selectively transmits power supply voltage Vcc via bonding wire BW. When pad PAD and frame lead FL are connected by bonding wire BW, node ND attains the level of power supply voltage Vcc, and responsively select signal SEL0 attains the L level, and select signal SEL1 the H level, whereby the connection of data bus DB1 is specified. When bonding wire BW is not provided for pad PAD, or when pad PD is set at the level of the ground voltage (when there is a ground pad in the neighborhood), node ND attains the level of the ground voltage, and responsively select signal SEL the H level, and select signal SEL1 the L level, whereby the connection to data bus DB0 is specified.

When switching is made between ×2 bits and ×1 bit in the generation of block select signals BS0–BSn, the least significant bit of the address signal used for block selection is set to a degenerated state (complementary bits both at selected state) according to select signal SEL0 that is rendered active in a ×1-bit configuration. Thus, data are output in parallel from two column blocks in a ×2-bit configuration, whereas data is output from one column block to data bus DB0 in a ×1-bit configuration.

FIG. 4 depicts a structure in which column blocks C#0–C#n each are comprised of columns adjacent to each other. However, these column blocks C#0–C#n each may be comprised of columns distributed over memory array 2. In other words, adjacent columns may be included in different column blocks.

In the structure of FIG. 4, a set of read data drivers is arranged for each of column blocks C#0–C#n. However, a structure may be such that a preamplifier is provided for each of column blocks C#0–C#n, and the outputs of the preamplifiers of column blocks C#0–C#n are coupled common to the set of the read data drivers. A structure in which the read data driver is set to an output high impedance state when the preamplifier is not selected has only to be employed.

Modification

Figure 6:
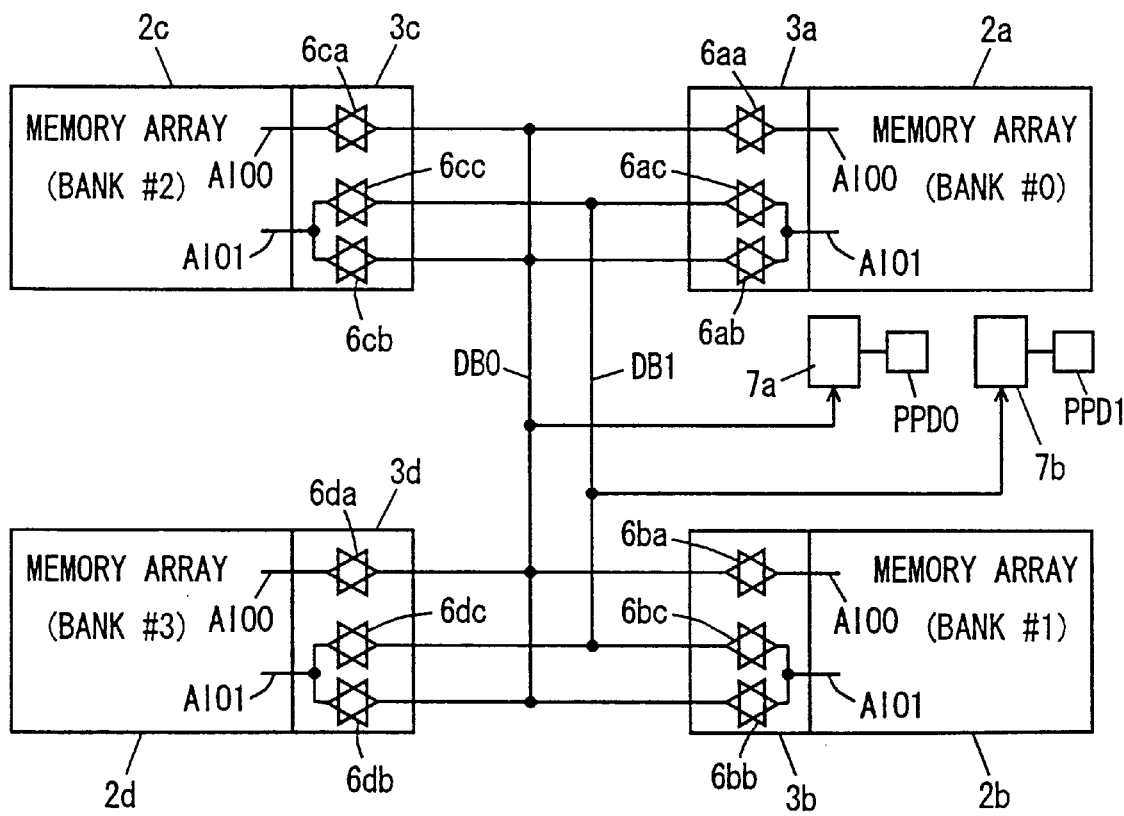
FIG. 6 schematically shows a structure of a modification of the first embodiment.

FIG. 6 schematically shows a structure of a modification of the first embodiment of the present invention. FIG. 6 shows a semiconductor memory device that can switch the word configuration between a ×1-bit configuration and ×2-bit configuration. The semiconductor memory device of FIG. 6 includes a data bus control circuit for reading and writing data instead of the read data driver. More specifically, in memory array 2a, a data bus control circuit 6aa is provided corresponding to array IO line AIO0, and data bus control circuits 6ab and 6ac are provided corresponding to array IO line AIO1. In memory array 2b, a data bus control circuit 6ba is provided corresponding to array IO line AIO0, and data bus control circuits 6bb and 6bc are arranged corresponding to array IO line AIO1. In memory array 2c, a data bus control circuit 6ca is provided corresponding to array IO line AIO0, and data bus control circuits 6cb and 6cc are provided corresponding to array IO line AIO1. In memory array 2d, a data bus control circuit 6da is provided corresponding to array IO line AIO0, and data bus control circuits 6db and 6dc are provided corresponding to array IO line AIO1.

Input/output control circuits 7a and 7b for data input/output are arranged in close proximity of pads PPD0 and PPD1.

According to the structure of FIG. 6, data buses DB0 and DB1 transfer both write data and read data. The remaining structure is similar to that of FIG. 1. According to the structure of FIG. 6, both the write data and the read data can be transmitted at high speed. Also, data buses DB0 and DB1 are both used to transmit both the write data and the read data. Therefore, the bus occupying area can be reduced significantly in comparison to the structure where the data bus for transmitting write data and the data bus for transmitting read data are provided separately, because a selector for switching the path is not required in each bus.

Data bus control circuits 6aa, 6ba, 6ca and 6da are constantly set at an operable state irrespective of the word configuration. The data bus control circuit corresponding to a selected bank (memory array) is rendered active. Either the set of data bus control circuits 6ab, 6bb, 6cb and 6db or the set of data bus control circuits 6ac, 6bc, 6cc and 6dc is set at an operable state according to the select signal.

Figure 7:
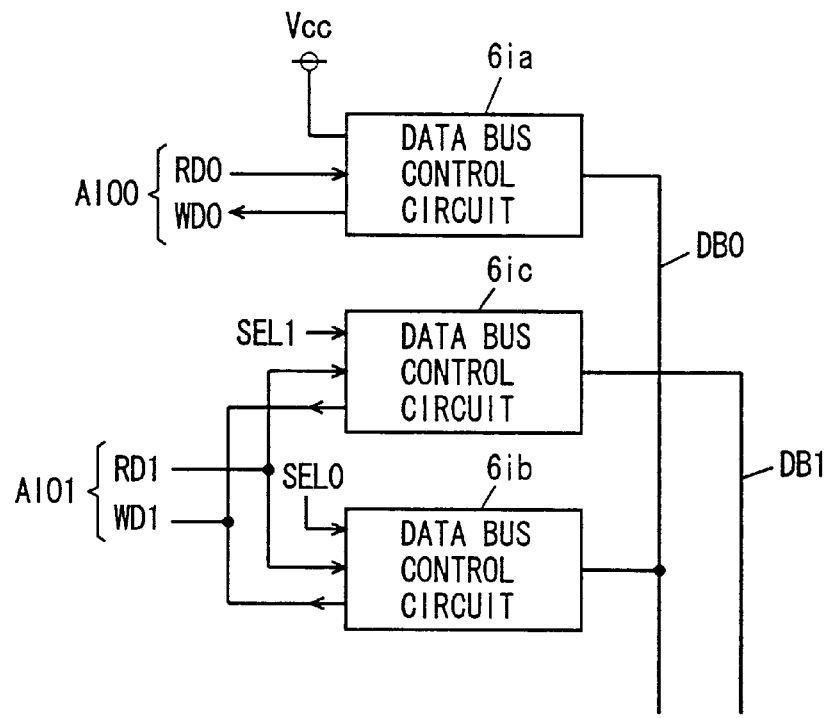
FIG. 7 shows in further detail the structure of a main part of the semiconductor memory device of FIG. 6.

FIG. 7 schematically shows a structure of data bus control circuits for one memory array (bank) of FIG. 6. In FIG. 7, a data bus control circuit 6ia (i=a~d) is provided for array IO line AIO0, and data bus control circuits 6ic and 6ib are provided corresponding to array IO line AIO. Data bus control circuit 6ia receives power supply voltage Vcc as the select signal to be constantly set to an operable state, whereby read out data RD0 is transmitted to data bus DB0 and write data WD0 is generated from the data on data bus DB0.

Data bus control circuit 6ib is set to an operable state when select signal SEL0 is active, to transfer read data RD1 and write data WD1 between data bus DB0 and array IO line AIO1. Data bus control circuit 6ic is set at an operable state when select signal SEL1 is active, to transfer read data RD1 and write data WD1 between array IO line AIO1 and data bus DB1. In the write/read operation, array IO line AIO1 is selectively coupled to data bus DB0 or DB1 according to the word configuration.

Data bus control circuits 6ia, 6ib and 6ic are arranged corresponding to each of column blocks of the memory array as shown in the previous FIG. 4.

Figure 8:
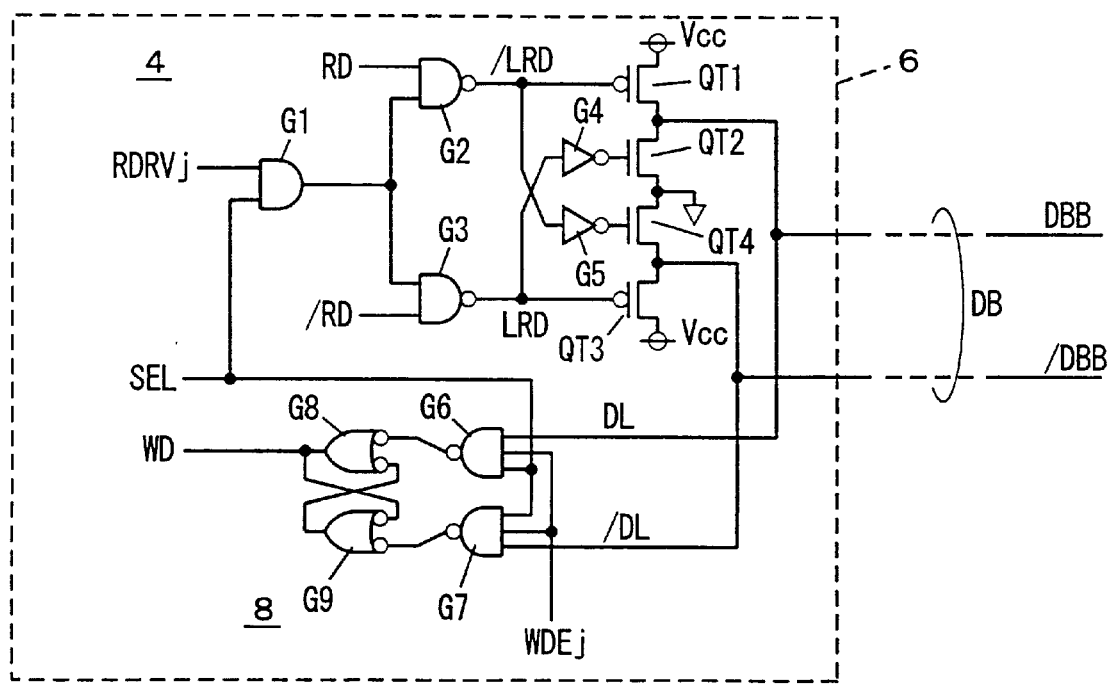
FIG. 8 shows a structure of a data bus control circuit of FIG. 7.

FIG. 8 shows an example of a specific structure of the data bus control circuit of FIG. 7. Since data bus control circuits 6ia–6ic have the same structure, only one data bus control circuit 6 is representatively shown in FIG. 8. Data bus control circuit 6 includes a read data driver 4 driving data bus DB according to complementary read out data RD and /RD, and a write data driver 8 generating internal write data WD according to the data from data bus DB. Data bus DB includes complementary bus lines DBB and /DBB.

Read data driver 4 includes an AND circuit G1 receiving a read data driver activation signal RDRVj and select signal SEL, a NAND circuit G2 receiving read data RD and the output signal of AND circuit G1, a NAND circuit G3 receiving the output signal of AND circuit G1 and complementary read out data /RD, an inverter G4 receiving the output signal of NAND circuit G3, an inverter G5 receiving an output signal of NAND circuit G2, a p channel MOS transistor QT1 rendered conductive when the output signal of NAND circuit G2 is at an L level, to drive an output node DL to the level of power supply voltage Vcc, an n channel MOS transistor QT2 rendered conductive when the output signal of inverter G4 is at an H level, to drive output node DL to the level of the ground voltage, a p channel MOS transistor QT3 rendered conductive when the output signal of NAND circuit G3 is at an L level, to drive an output node /DL to the level of power supply voltage Vcc, and an n channel MOS transistor QT4 rendered conductive when the output signal of inverter G5 is at an H level, to drive output node /DL to the level of the ground voltage.

Output nodes DL and /DL are connected to data bus lines DBB and /DBB, respectively. Select signal SEL is selectively set at an H level or an L level according to the word configuration, and corresponds to select signal SEL1 or SEL0 or to the level of power supply voltage Vcc shown in FIG. 7.

Write data driver 8 includes a NAND circuit G6 receiving a write data driver activation signal WDEj, select signal SEL and the signal of output node DL, a NAND circuit G7 receiving select signal SEL, write data driver activation signal WDEj and the signal of node /DL, a NAND circuit G8 receiving the output signal of NAND circuit G6, and a NAND circuit G9 receiving the output signal of NAND circuit G7. The output signal of NAND circuit G8 is provided to the input of NAND circuit G9. The output signal of NAND circuit G9 is applied to the input of NAND circuit G8. NAND circuits G8 and G9 form a flip-flop. Write data WD is generated from NAND circuit G8. Although write data WD does not take the form of complementary signals, this write data WD is complementary data when an array IO line is provided in common for data reading and data writing. Alternatively, the write driver provided in the memory array may be configured to generate complementary data from the write data WD for writing into the selected memory cell. The operation of data bus control circuit 8 of FIG. 8 will now be described.

When select signal SEL is at an L level, the output signal of AND circuit G1 is at an L level, whereas the output signals of NAND circuits G2 and G3 are at an H level. As a result, nodes LRD and /LRD attain an H level. Therefore, MOS transistors QT1–QT4 are all rendered non-conductive, and read data driver 4 attains an output high impedance state.

In write data driver 8, the output signals of NAND circuits G6 and G7 are fixed at an H level to inhibit transmission of write data WD at nodes DL and /DL.

When select signal SEL is set at an H level, AND circuit G1 operates as a buffer circuit. When read data driver activation signal RDRVj attains an active state of an H level in read data driver 4, the output signal of AND circuit G1 is driven to an H level. NAND circuits G2 and G3 operate as an inverter to invert read out data RD and/RD. When read out data RD is at an H level, node /LRD is pulled down to an L level. MOS transistors QT1 and QT4 conduct, whereby nodes DL and /DL are driven to an H level and an L level, respectively. In contrast, when read out data RD is at an L level and read out data /RD is at an H level, node LRD and /LRD attain an H level and L level, respectively. MOS transistors QT2 and QT3 conduct, whereby nodes DL and /DL attain an L level and an H level, respectively. Thus, read data can be generated according to read out data RD and /RD, to be transmitted to data bus lines DBB and /DBB when read data driver activation signal RDRVj is active.

When write data driver activation signal WDEj is at an H level in write data driver 8, NAND circuits G6 and G7 function as an inverter, and the data transmitted via data bus DB to nodes DL and /DL is transmitted to NAND circuits G8 and G9 to be latched therein. When node DL is at an H level, the output signal of NAND circuit G6 is driven to an L level, and write data WD from NAND circuit G8 is driven to an H level. In contrast, when nodes DL and /DL are at an L level and an H level, respectively, NAND circuit G7 provides an output signal of an L level, and NAND circuit G6 provides an output signal of an H level. Therefore, write data WD from NAND circuit G8 attains an L level if it is a non-selected state.

In data bus control circuit 6 of FIG. 8, the output high impedance state is maintained when data is to be read out. Therefore, even in the case where data bus control circuits 6ia and 6ib are both coupled to data bus DB0 in FIG. 7, the selected data bus control circuit 6ia or 6ib can properly transmit the read out data to data bus DB0. In data writing, the write data driver is inhibited from incorporating data in a non-selected state. Therefore, the selected data bus control circuit can transmit data to the selected memory cell of the memory block in the corresponding memory array according to the write data on the data bus properly.

Similarly to the previous structure of FIG. 4, the data bus control circuit of FIG. 8 is arranged corresponding to each memory column block in a corresponding memory array. Activation signals RDRVj and WDEj are rendered active with respect to the data bus control circuit provided corresponding to a selected column block.

Figure 9:
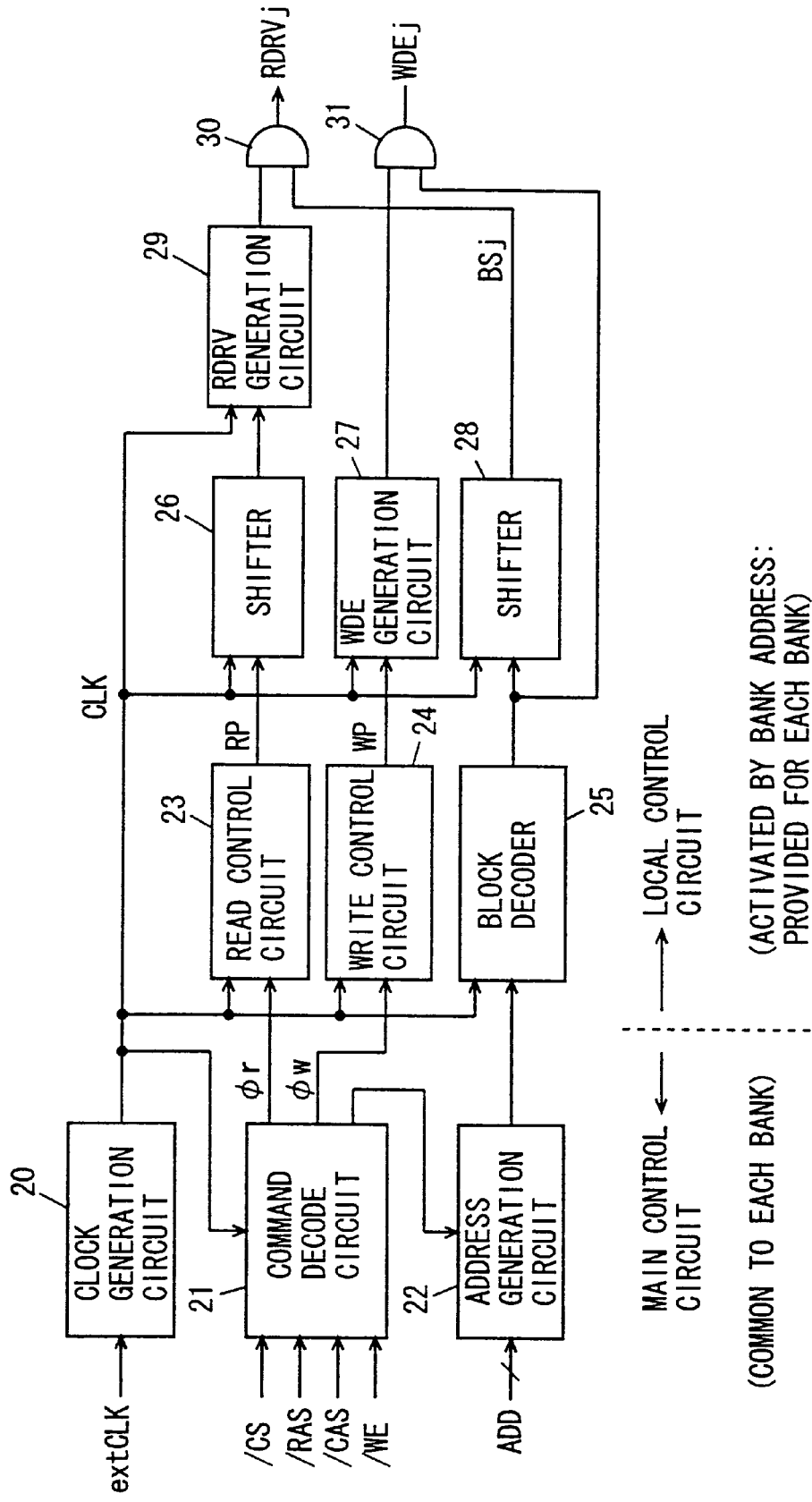
FIG. 9 schematically shows a structure of control signal generation circuitry in the semiconductor memory device of FIG. 6.

FIG. 9 schematically shows a structure of the generation circuitry of the activation signal of FIG. 8. Referring to FIG. 9, the control circuit includes a clock generation circuit 20 receiving an externally applied clock signal extCLK to generate an internal clock signal CLK, a command decode circuit 21 incorporating externally applied control signals, i.e., a chip select signal /CS, a row address strobe signal /RAS, a column address strobe signal /CAS, and a write enable signal /WE in synchronization with internal clock signal CLK from clock generation circuit 20 to determine the specified operation mode to output a signal indicating the determination result, and an address generation circuit 22 responsive to a control signal from command decode circuit 21 to incorporate an externally applied address signal ADD to generate an internal row and column address signals. Clock generation circuit 20, command decode circuit 21 and address generation circuit 22 form a main control circuit used in common by banks #0–#3. Command decode circuit 21 determines a specified operation mode according to the states of external control signals /CS, /RAS, /CAS and /WE at the rising edge of internal clock signal CLK. The combination of the states of external control signals /CS, /RAS, /CAS and /WE at the rising edge of internal clock signal CLK is referred to as a "command". Command decode circuit 21 decodes this command to generate a read out operation designation signal $\phi r$, a write operation designation signal $\phi w$, and the like according to the decoding result.

Address ADD applied to address generation circuit 22 includes a bank address specifying a bank, and a block address specifying a column block included in one memory array.

The control circuit further includes a read control circuit 23 retaining a read activation signal RP at an active state for a predetermined number of cycles of internal clock signal CLK according to activation of read operation designation signal $\phi r$ from command decode circuit 21, a write control circuit 24 maintaining a write activation signal WP at an active state for a predetermined number of cycle(s) of internal clock signal CLK according to activation of write operation designation signal $\phi w$ from command decode circuit 21, and a block decoder 25 operated in response to internal clock signal CLK to decode the block address out of the internal address applied from address generation circuit 22 to generate a signal indicating a memory column block.

Read control circuit 23 and write control circuit 24 each include a counter that counts internal clock signal CLK to render activation signals RP and WP active during a burst length period. Here, "burst length" indicates the number of data that can be read out or written successively in response to the application of one read command or write command.

The control circuit further includes a shifter 26 shifting read out activation signal RP from read control circuit 23 in accordance with internal clock signal CLK for delaying by a predetermined time, a WDE generation circuit 27 generating a write data driver activation signal WDE in synchronization with internal clock signal CLK in response to activation of write activation signal WP from write control circuit 24, a shifter 28 shifting the block select signal from block decoder 20 in synchronization with internal clock signal CLK, a RDRV generation circuit 29 generating a read data driver activation signal RDRV according to the output signal of shifter 26, an AND circuit 30 receiving activation signal RDRV from RDRV generation circuit 29 and block select signal BSj from shifter 28 to generate a read data driver activation signal RDRVj, and an AND circuit 31 receiving block select signal BSj from shifter 28 and activation signal WDE from WDE generation circuit 20 to generate write data driver activation signal WDEj.

Read control circuit 23, write control circuit 24, block decoder 25 and circuitry of the succeeding stage form a local control circuit to be rendered active according to a bank address signal applied from address generation circuit 22. A local control circuit is provided corresponding to each bank. WDE generation circuit 27 and RDRV generation circuit 29 are each formed of a one shot pulse generation circuit that generates a one shot pulse in response to a rise of internal clock signal CLK. The operation of the control circuit of FIG. 9 will now be described with reference to the timing charts of FIGS. 10A and 10B.

Figure 10A:
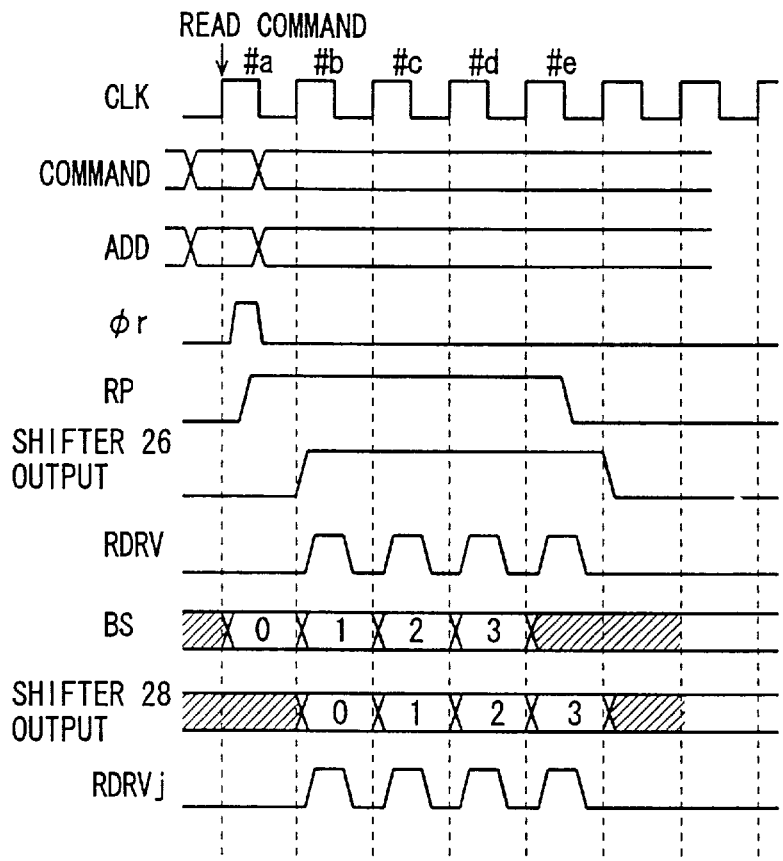
FIGS. 10A and 10B are timing charts of the operation of the control signal generation circuitry of FIG. 9.

First, a data read out operation will be described with reference to FIG. 10A. In FIG. 10A, external control signals /CS, /RAS, /CAS and /WE are generically indicated as a command. At clock cycle #a, a read command designating data read out is applied. In response to this read command, read out designation signal $\phi r$ from command decode circuit 21 is driven to an active state of an H level for a predetermined time. Read out activation signal RP from read control circuit 23 is maintained at an active state of an H level during the burst length period. In response to this read command, the address from address generation circuit 22 is applied to block decoder 25.

Block decoder 25 decodes the block address from address generation circuit 22 to generate block select signal BS that specifies a memory column block. The block select signal from block decoder 25 is altered every clock cycle of internal clock signal CLK. Address signals are generated at a predetermined sequence using a counter with the address signal applied at clock cycle #a as the head address. Shifter 26 shifts read out activation signal RP from read control circuit 2 according to internal clock signal CLK. This shifter 26 carries out a shift operation during the (CAS latency −2) clock cycle period. FIG. 10A represents an operation where the CAS latency is 3. Therefore, the output signal of shifter 26 is pulled up to an H level at clock cycle #b and maintained at the H level during the burst length period, i.e. during four clock cycles. RDRV generation circuit 29 is enabled when the output signal of shifter 26 is at an active state of an H level, to generate read data drive activation signal RDRV in a one shot pulse signal form in synchronization with the rise of internal clock signal CLK.

Also, shifter 28 shifts the block select signal from block decoder 25 for the (CAS latency −2) clock cycles. Therefore, block select signal BSj sequentially attains an ascertained state from clock cycle #b. AND circuit 30 is responsive to the output signal from RDRV generation circuit 29 and the block select signal from shifter 28 for generating read data driver activation signal RDRVj of the read data driver provided corresponding to each memory column block. Therefore, read data driver activation signal RDRVj is sequentially driven to an active state for a predetermined time according to the block select signal during the period from clock cycle #b to clock cycle #e.

The reason why read data drive activation signal RDRVj is delayed by one clock cycle from the application of the read command is that the period of one clock cycle is required for the data to be transferred from a selected memory cell to the read data driver via the preamplifier.

Figure 10B:
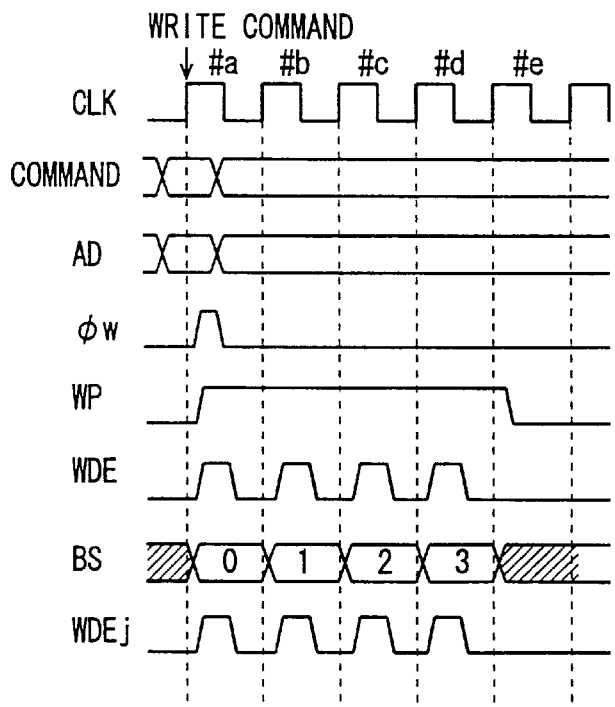

A data writing operation will now be described with reference to the timing chart of FIG. 10B. At clock cycle #a, a write command is applied. In response, write operation designation signal φw from command decode circuit 21 is driven to an active state of an H level for a predetermined time. In response, write activation signal WP from write control circuit 24 is maintained at an active state of an H level for the clock cycle(s) of the burst length. FIG. 10B represents the case where the burst length period is 4 clock cycles. In response to activation of write activation signal WP, WDE generation circuit 27 generates write data driver activation signal WDE in a one shot pulse signal form in response to the rise of internal clock signal CLK. Block select signal BS is output from block decoder 25 in each of clock cycle #a to clock cycle #d. In response to block select signal BS and write data driver activation signal WDE, AND circuit 31 sequentially generates write data driver activation signal WDEj to activate the write data driver provided corresponding to the selected column block. When the CAS latency is 2 in FIG. 10B, write data driver activation signal WDE is generated at the same timing. This is because the period of one dock cycle is required before the data from the write data driver is written into the selected memory cell via the write driver. (In read out, one clock cycle is required before the data of the selected memory cell is transmitted to the read data driver, and the same clock cycle period is also required for writing).

By shifting block select signal BS using shifter 28 as shown in FIG. 9, the read data driver activation signal can be driven to an active state correctly according to the transmission timing of the read out data.

According to the first embodiment of the present invention, the connection between the IO line of the memory array and a data bus provided corresponding to each pad is switched by selectively rendering active a read data driver or a write data driver. Therefore, a selector for switching the bus connection of the data bus is no longer required, to allow data transfer at high speed. Elimination of a selector provides the advantage that the circuit occupying area can be reduced.

Second Embodiment

Figure 11:
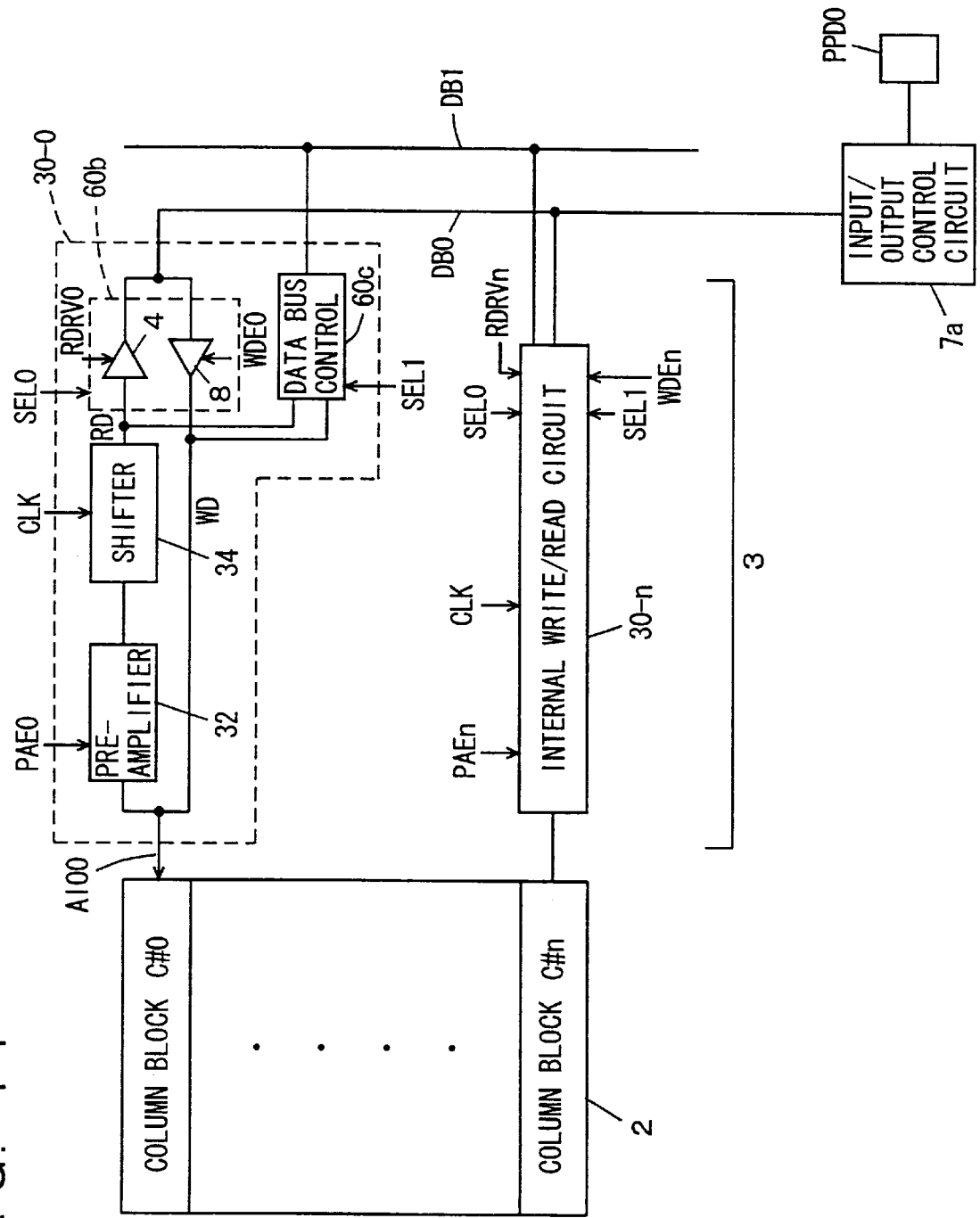
FIG. 11 schematically shows a structure of a main part of a semiconductor memory device according to a second embodiment of the present invention.

FIG. 11 schematically shows a structure of a main part of a semiconductor memory device according to a second embodiment of the present invention. In FIG. 11, the structure of a column local circuit 3 corresponding to one memory array 2 is indicated representatively. A similar structure is provided for the remaining memory arrays.

Memory array 2 is divided into a plurality of column blocks C#0–C#n. Internal write/read circuits 30-0~30-n are provided corresponding to column blocks C#0–C#n, respectively, in column local circuit 3. Each of internal write/read circuits 30-0~30-n has the same structure. In FIG. 11, the structure of internal write/read circuit 30-0 is representatively indicated.

Internal write/read circuit 30-0 includes a preamplifier 32 amplifying the data on array IO line AIO0 provided corresponding to column block C#0 in response to activation of a preamplifier activation signal PEA0, a shifter 34 shifting the output signal of preamplifier 32 in synchronization with internal clock signal CLK, a data bus control circuit 60b transmitting output data RD of shifter 34 to data bus DB0, and a data bus control circuit 60c transmitting internal read out data RD from shifter 34 to data bus DB1. Data bus control circuits 60b and 60c also generate internal write data WD according to the data on data buses DB0 and DB1 respectively in data writing. The operation enabled/disabled state of data bus control circuits 60b and 60c is set by select signals SEL0 and SEL1. Since data bus control circuits 60b and 60c have the same structure, the structure of data bus control circuit 60b is representatively shown in FIG. 11.

Data bus control circuit 60b includes a read data driver 4 rendered active according to select signal SEL0 and activation of read data driver activation signal RDRV0 to drive data bus DB0 according to read out data RD from shifter 35, and write data driver 8 rendered active according to select signal SEL0 and activation of write data driver activation signal WDE0 to generate internal write data WD from the data on data bus DB0. The specific structure of data bus control circuits 60b and 60c is identical to that of FIG. 8. However, preamplifier 32 is not particularly required to generate complementary data RD and /RD, and may be configured to generate only data RD, similarly to write data WD. Therefore, the structure of preamplifier 32 is arbitrary in the second embodiment. Array IO line AIO0 is generally formed of complementary bus lines. The write driver generates complementary data according to write data WD from data bus control circuits 60b and 60c to transmit the generated data onto complementary data bus lines of column block C#0, which is not illustrated in FIG. 11.

Shifter 34 carries out a shift operation during the clock cycle(s) of (CAS latency −2). More specifically, the output data of preamplifier 32 is delayed by the clock cycle(s) of (CAS latency −2). When mask designation signal DQMi that designates masking of data writing/reading in column local circuit 3 is rendered active, the data bus control circuit is rendered inactive during that clock cycle. A data mask is not applied in input/output control circuit 7a. A mask is applied on the writing/reading in the internal write/read circuit. Accordingly, collision of the write data and the read data in data bus DB0 or DB1 can be avoided in the interrupt operation of switching to data writing during data reading, as will be described afterwards.

Figure 12:
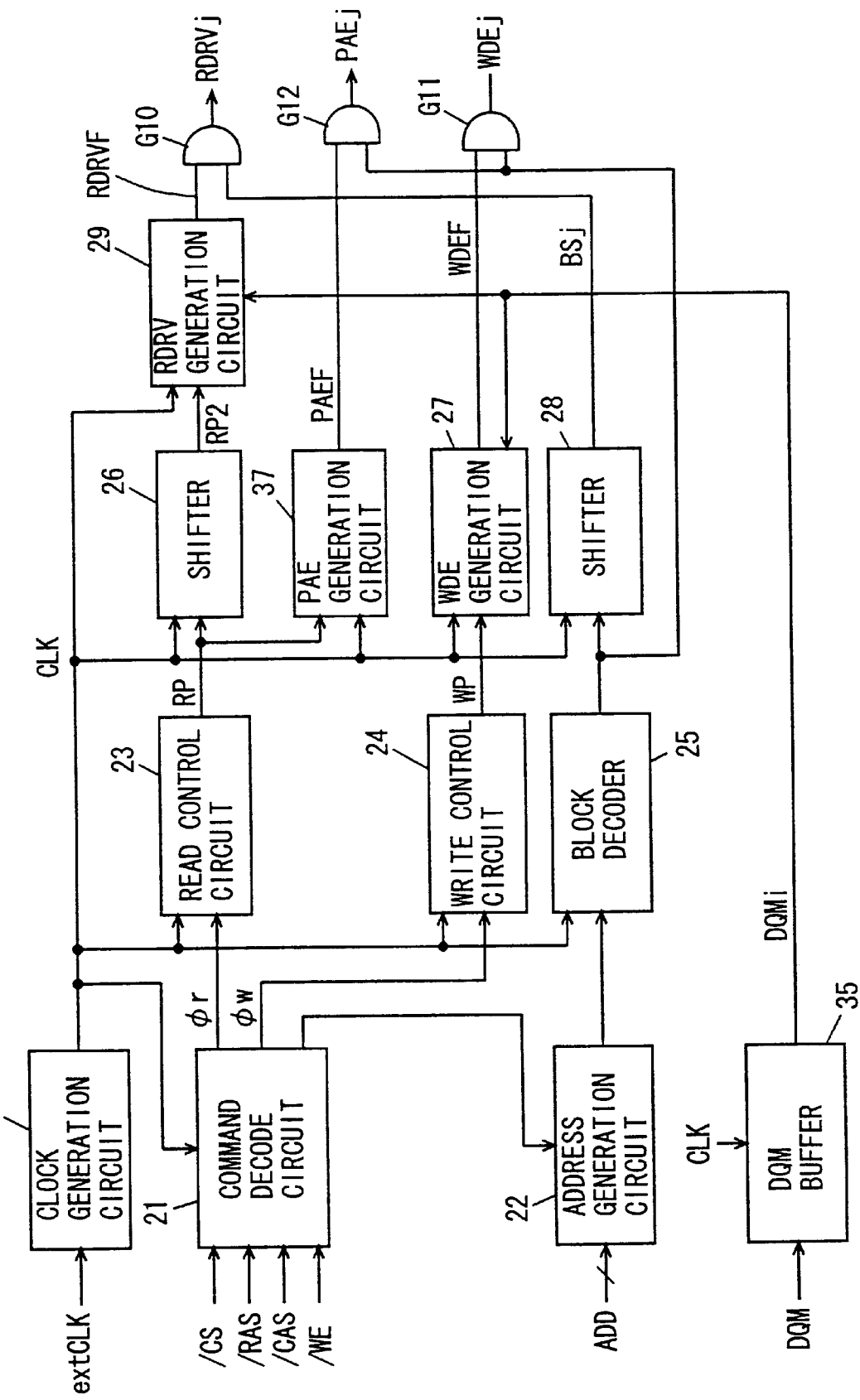
FIG. 12 schematically shows a structure of control signal generation circuitry in the semiconductor memory device of FIG. 11.

FIG. 12 schematically shows a structure of control signal generation circuitry of a semiconductor memory device according to the second embodiment of the present invention. The control signal generation circuitry of FIG. 12 includes, in addition to the structure of the control signal generation circuitry of FIG. 9, a DQM buffer 35 receiving an externally applied mask designation signal DQM to generate an internal mask designation signal DQMi, and a PAE generation circuit 37 generating a preamplifier activation signal PAEF in synchronization with internal clock signal CLK when read activation signal RP from read control circuit 23 is active. Preamplifier activation signal PAEF from PAE generation circuit 37 is logically ANDed with block select signal BSj from block decoder 25 in gate circuit G12, whereby a preamplifier activation signal PAEj for column block C#j is generated.

DQM buffer 35 receives externally applied mask designation signal DQM in synchronization with a rise of internal clock signal CLK and retains the input mask designation signal DQM during that clock cycle period to generate an internal mask designation signal DQMi. RDRV generation circuit 29 and WDE generation circuit 27 are disabled when internal mask designation signal DQMi from DQM buffer 35 is active, to drive activation signals WDEF and RDRVF inactive. Therefore, the internal data bus control circuit is rendered inactive during the clock cycle of the application of an externally applied mask designation, to inhibit internal data read out/writing during that clock cycle. The structure of the control circuitry of FIG. 12 is for the CAS latency CL of 3. Shifters 26 and 28 carry out a shift operation for one clock cycle. The operation of the circuits of FIGS. 11 and 12 will be described with reference to the timing chart of FIG. 13.

A read command is applied at cycle #a of clock signal CLK, whereby read out activation signal RP from read control circuit 23 is maintained at an active state for the burst length period (4 clock cycles). Shifter 26 delays read out activation signal RP from read control circuit 23 by one clock cycle to generate a delayed read out activation signal RP2 to RDRV generation circuit 29. PAE generation circuit 37 is enabled when read out activation signal RP from read control circuit 23 is rendered active, to generate preamplifier activation signal PAEF in a one shot pulse form in response to internal clock signal CLK. PAE generation circuit 37 drives preamplifier activation signal PAEF to an active state at each of clock cycles #a, #b, #c and #d.

At the elapse of one clock cycle from the application of a read command, RDRV generation circuit 29 generates read data driver activation signal RDRVF in a one shot pulse form in synchronization with internal clock signal CLK. The activation timing of read data driver activation signal RDRVF is earlier than the activation timing of preamplifier activation signal PAEF in each clock cycle. This is done to correctly transmit the data onto data bus DB without data collision even when the CAS latency is 2.

When external mask designation signal DQM is driven to an active state of an H level at clock cycle #c, internal mask designation signal DQMi is driven to an active state of an H level, whereby RDRV generation circuit 29 is rendered inactive during this clock cycle #c. Therefore, all the read data drivers are rendered inactive to attain an output high impedance state in clock cycle #c. No new data is transmitted onto data bus DB (DB0, DB1). In this state, data bus DB is maintained at the level of a predetermined voltage of a standby state. (This will be described in detail afterwards).

In clock cycle #b, the read data driver is rendered active according to read data driver activation signal RDRVF, whereby the first read out data R0 is transmitted onto data bus DB. Data R0 passes through data bus DB and input/output control circuit 7 (7a, 7b) to be output as external data DQ.

Since read data driver activation signal RDRVF is at an inactive state in clock cycle #c, the external data is in a masked state in clock cycle #d.

External mask designation signal DQM is at an inactive state of an L level in clock cycle #d, whereby internal mask designation signal DQMi attains an L level during this clock cycle. Therefore, read data driver activation signal RDRVF is activated again, whereby data is newly transmitted onto data bus DB.

In clock cycle #e, external data mask designation signal DQM is driven to an active state of an H level again, whereby internal mask designation signal DQMi is pulled up to an H level during this clock cycle #e. Therefore, read data driver activation signal RDRVF is rendered inactive again, whereby read data drivers 60b and 60c are set at an output high impedance state.

A write command is applied at the next clock cycle #f. External write data W0 is applied simultaneously to this write command. In response to this write command, write activation signal WP from write control circuit 24 is driven to an active state. As a result, write data driver activation signal WDEF from WDE generation circuit 27 is driven to an active state. Accordingly, the data transmitted from input/output control circuit 7 (7a, 7b) to data bus DB (DB0, DB1) is amplified by write data driver 8 to be written into a selected memory cell. When external mask designation signal DQM is driven again to an active state of an H level at clock cycle #g, internal mask designation signal DQMi attains an H level during this clock cycle #g. Responsively, write data driver activation signal WDEF is maintained at an inactive state to inhibit the writing of data W1 transmitted on data bus DB into a selected memory cell.

Figure 13:
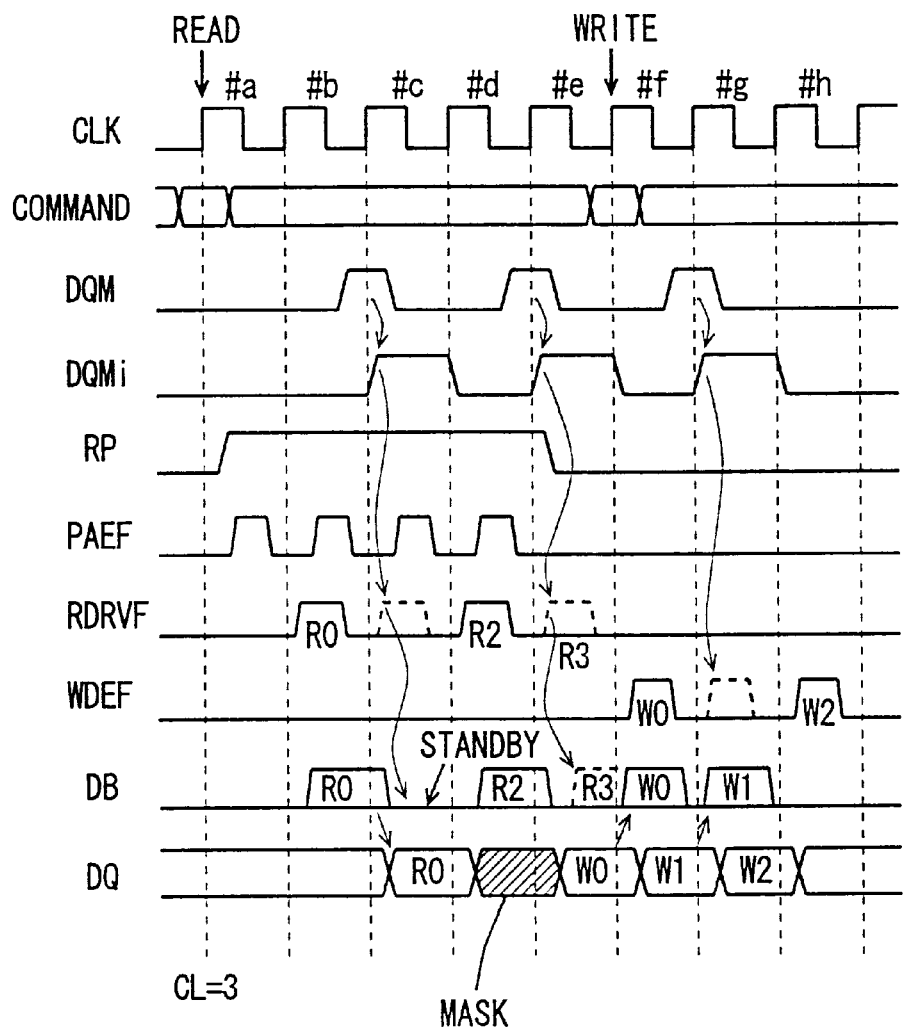
FIG. 13 is a timing chart of the operation of the control signal generation circuitry of FIG. 12.

As shown in FIG. 13, the DQM latency (the clock cycle period required from input of external mask designation up to the actual masking of data) is 2 in a read out mode. A mask is applied on the read out data at the preceding-by-one clock cycle internally. Thus, collision of read out data R3 and write data W0 on data bus DB during the transition from a read operation to a write operation can be prevented. Therefore, data can be written and read out properly with no data collision even in the case where data bus DB is used for both data writing and data reading.

As to read out data R2, read out activation signal RP is rendered inactive to complete a read out operation when a write command is applied. The input/output control circuit is so implemented that the data input circuit is rendered active and the data output circuit is rendered inactive. Therefore, the collision of internal read out data and external write data at external data input/output terminal DQ can be prevented.

Figure 14:
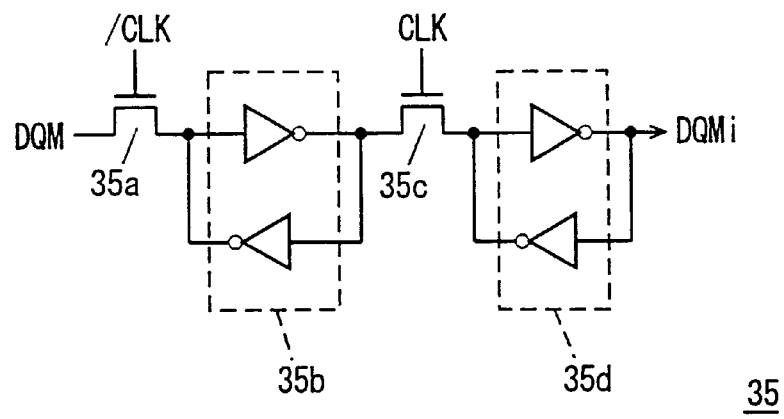
FIG. 14 shows an example of a structure of a DQM buffer of FIG. 12.

FIG. 14 shows an example of a structure of the DQM buffer. Referring to FIG. 14, a DQM buffer 35 includes a transfer gate 35a selectively rendered conductive in response to internal clock signal /CLK, an inverter latch 35b inverting the data from transfer gate 35a and latching the inverted data, a transfer gate 35c rendered conductive in synchronization with internal clock signal CLK to transmit the latched signal of inverter latch 35b, and an inverter latch 35d latching and inverting the signal from transfer gate 35c to generate internal mask designation signal DQMi.

When internal clock signal CLK is at an H level in the structure of DQM buffer 35 of FIG. 14, transfer gate 35a is rendered non-conductive whereas transfer gate 35c is rendered conductive, so that the latched signal in inverter latch 35b is transmitted to inverter latch 35d. When internal clock signal CLK is at an L level, transfer gate 35a is rendered conductive whereas transfer gate 35c is rendered non-conductive, so that external mask designation signal DQM is newly latched by inverter latch 35b. Inverter latch 35d generates an internal mask designation signal DQMi according to the signal transmitted when internal clock signal CLK is at an H level. External mask designation signal DQM is incorporated at a rise of internal clock signal CLK to generate internal mask designation signal DQMi according to the incorporated external mask designation signal DQM during that clock cycle.

For RDRV generation circuit 29 and PAE generation circuit 37 an arrangement which is enabled when read out activation signal RP2 or RP is rendered active to generate a one shot pulse signal in response to the rise of internal clock signal CLK can be employed. Generation of this one shot pulse is inhibited when internal mask designation signal DQMi is at an H level. This is readily realized by ANDing the output signal of the one shot pulse generation circuit and the inverted signal of internal mask designation signal DQMi.

By rendering write data driver activation signal WDEF from WDE generation circuit 27 inactive according to mask designation signal DQMi, the collision of write data on the data bus and the array IO line can be prevented during the transition from a data write operation to a data read operation, as set forth in the following.

Figure 15:
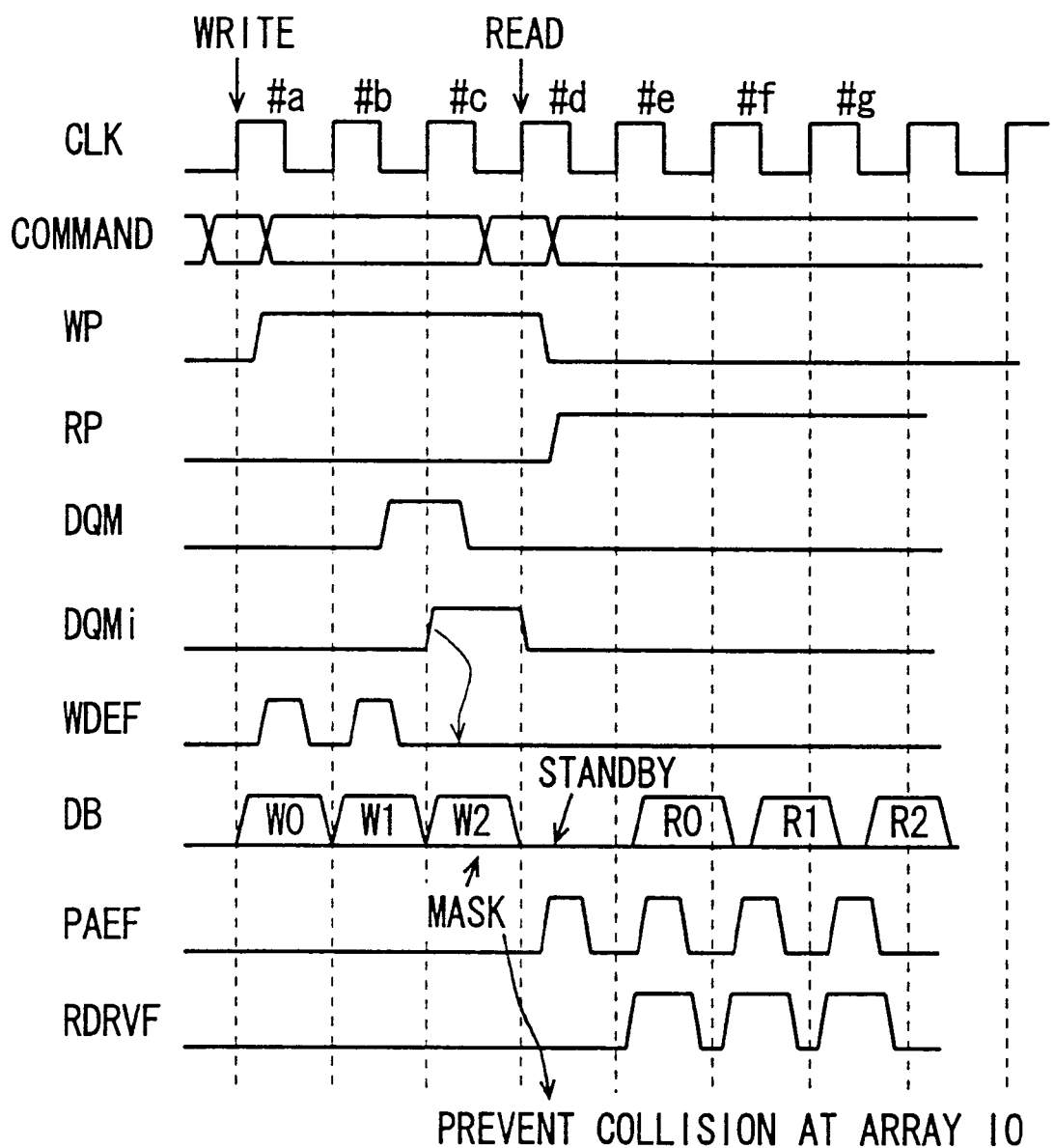
FIG. 15 is a timing chart representing an operation of data writing in the control signal generation circuitry of FIG. 12.

FIG. 15 is a timing chart representing an operation of interrupting a write operation with a read operation. A write command is applied during clock cycle #a, whereby write activation signal WP is driven to an active state. In response to this write activation signal WP, WDE generation circuit 27 drives write data driver activation signal WDEF to an active state in synchronization with internal clock signal CLK, whereby write data W0 and W1 generated according to externally applied write data and transmitted onto data bus DB are written into a selected memory cell.

When external mask designation signal DQM is pulled up to an H level in clock cycle #c, internal mask designation signal DQMi is driven to an active state of an H level in clock cycle #c. In this case, WDE generation circuit 27 is rendered inactive, and write data driver activation signal WDEF is driven to an inactive state of an L level. Therefore, write data WD2 transmitted to data bus DB will not be sent to the selected memory cell.

When a read command is applied in clock cycle #d, read activation signal RP from read control circuit 23 is driven to an active state. In response, preamplifier activation signal PAEF is driven to an active state in synchronization with an internal clock signal CLK at each clock cycle from clock cycle #d. Write activation signal WP is driven to an inactive state according to this read command. Therefore, write data driver activation signal WDEF maintains an inactive state. Data bus DB is in a standby state during clock cycle #d. The data of a selected memory cell in the memory array is transmitted to the preamplifier via the array IO line in clock cycle #d. Write data is not transmitted during this clock cycle #d (by internal mask designation signal DQMi). Therefore, collision of the write data and the read data on the array IO line can be prevented. Read out data R0, R1, and R2 can be sequentially output onto data bus DB according to read data driver activation signal RDRVF at clock cycle #e et seq. Thus, by controlling WDE generation circuit 27 by means of internal mask designation signal DQMi, collision of the write data and the read data can be prevented even at the transition from a write operation to a read operation.

Figure 17:
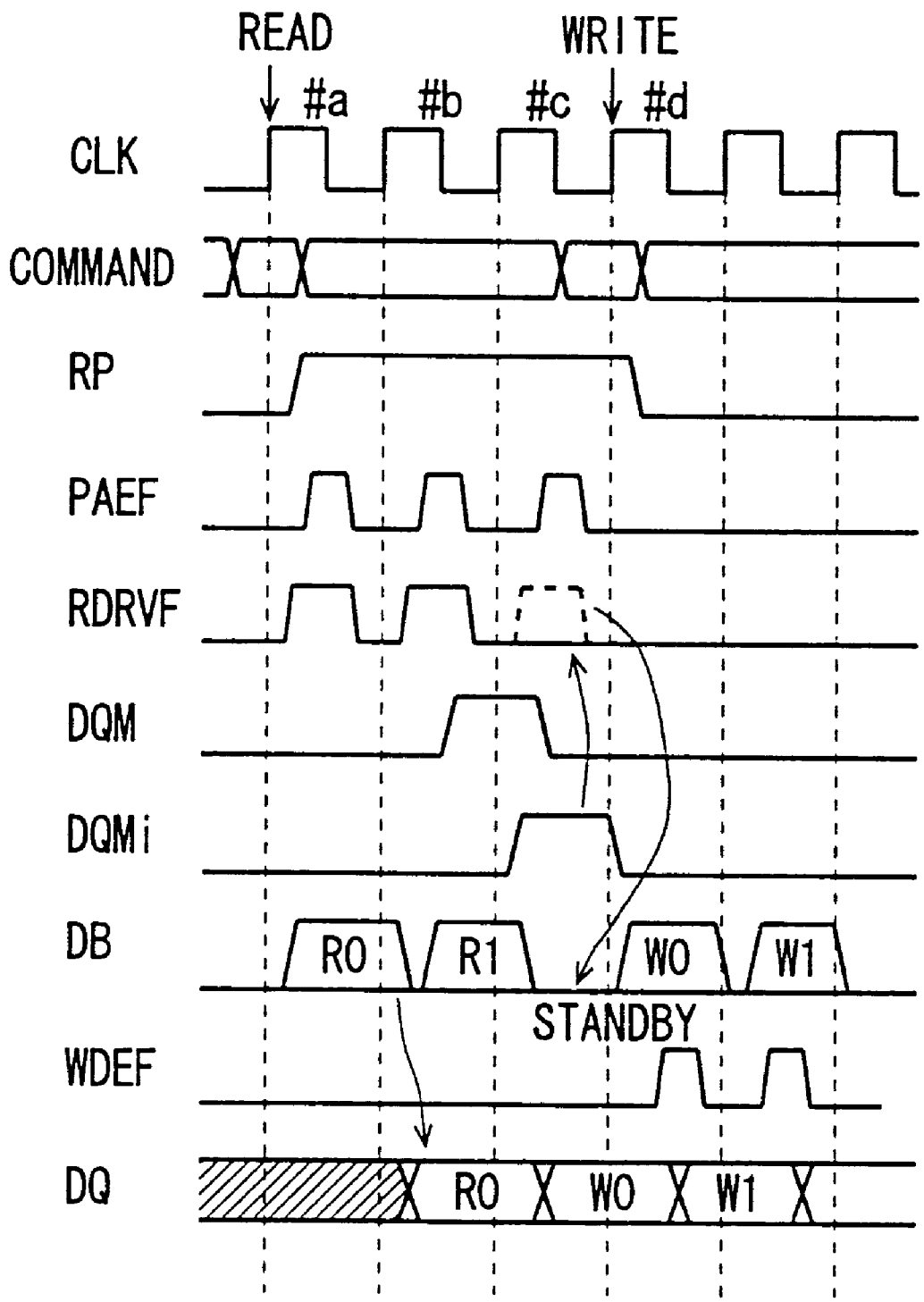
FIG. 17 is a timing chart representing an operation of the circuit shown in FIG. 16.

FIG. 16 schematically shows a structure of the control circuit where the CAS latency is 2. Here, read activation signal RP is applied from read control circuit 23 to RDRV generation circuit 29. Also, preamplifier activation signal PAEFF is applied from PAE generation circuit 37 to RDRV generation circuit 29. The remaining structure is similar to that of FIG. 12. Preamplifier activation signal PAEFF is driven to an active state at a timing earlier than activation of preamplifier activation signal PAEFF. RDRV generation circuit 29 is responsive to the activation of preamplifier activation signal PAEFF when read out activation signal RP is active, for driving read data driver activation signal RDRVF to an active state. The operation of the control circuit shown in FIG. 16 will be described with reference to the timing chart of FIG. 17.

When a read command is applied at clock cycle #a, read activation signal RP from read control circuit 23 is driven to an active state. PAE generation circuit 37 generates preamplifier activation signals PAEF and PAEFF according to internal clock signal CLK from clock cycle #0. In response to preamplifier activation signal PAEFF, RDRV generation circuit 29 drives read data drive activation signal RDRVF to an active state. Accordingly, the read data driver amplifies the data read out from a selected memory cell and transmits the amplified data onto data bus DB. Therefore, read out data R0 and R1 are transmitted to data bus DB at clock cycles #a and #b. In clock cycle #b, data R0 on data bus DB is output to be sampled by an external device at the rise of clock signal CLK in clock cycle #c.

When external mask designation signal DQM is set at an H level in clock cycle #c, internal mask designation signal DQMi is driven to an active state of an H level at clock cycle #c, whereby RDRV generation circuit 29 is rendered inactive. Therefore, read data driver activation signal RDRVF maintains an inactive state during this dock cycle #c, and data bus DB maintains a standby state.

When a read command is applied at clock cycle #d, read out activation signal RP is rendered in active, whereby write activation signal WP from write control circuit 24 is driven to an active state, WDE generation circuit 27 drives read data driver activation signal WDEF to an active state from this clock cycle #d. Therefore, write data W0 and W1 are transmitted onto data bus DB according to externally applied write data W0 and W1. The write data W0 and W1 on data bus DB are transmitted to selected memory cells by a write data driver.

By rendering external mask designation signal DQM active at a cycle preceding by one clock cycle to the cycle where the read out operation is interrupted when the CAS latency is 2, collision of read data and write data can be prevented on data bus DB.

The structure of FIG. 16 is shown not using shifter 29 when the CAS latency is 2. However, the number of shift stages in shifter 26 is only required to be altered according to the information indicating CAS latency CL. In other words, the number of shift stages would be set to 0. Also, a structure of selecting either internal clock signal CLK or preamplifier activation signal PAEFF according to CAS latency information CL can be employed for RDRV generation circuit 29. Therefore, the CAS latency of both 2 and 3 can be accommodated using the same circuit configuration, without a dedicated circuit structure.

According to the second embodiment of the present invention, the read data driver and the write data driver are maintained at an inactive state during the clock cycle where an external mask designation signal is applied. Therefore, collision of the read data and the write data can be prevented reliably in the case where a read out operation is interrupted to enter a write operation, or vice versa. Thus, the data bus can be used to transmit both the write data and the read data.

Third Embodiment

Figure 18:
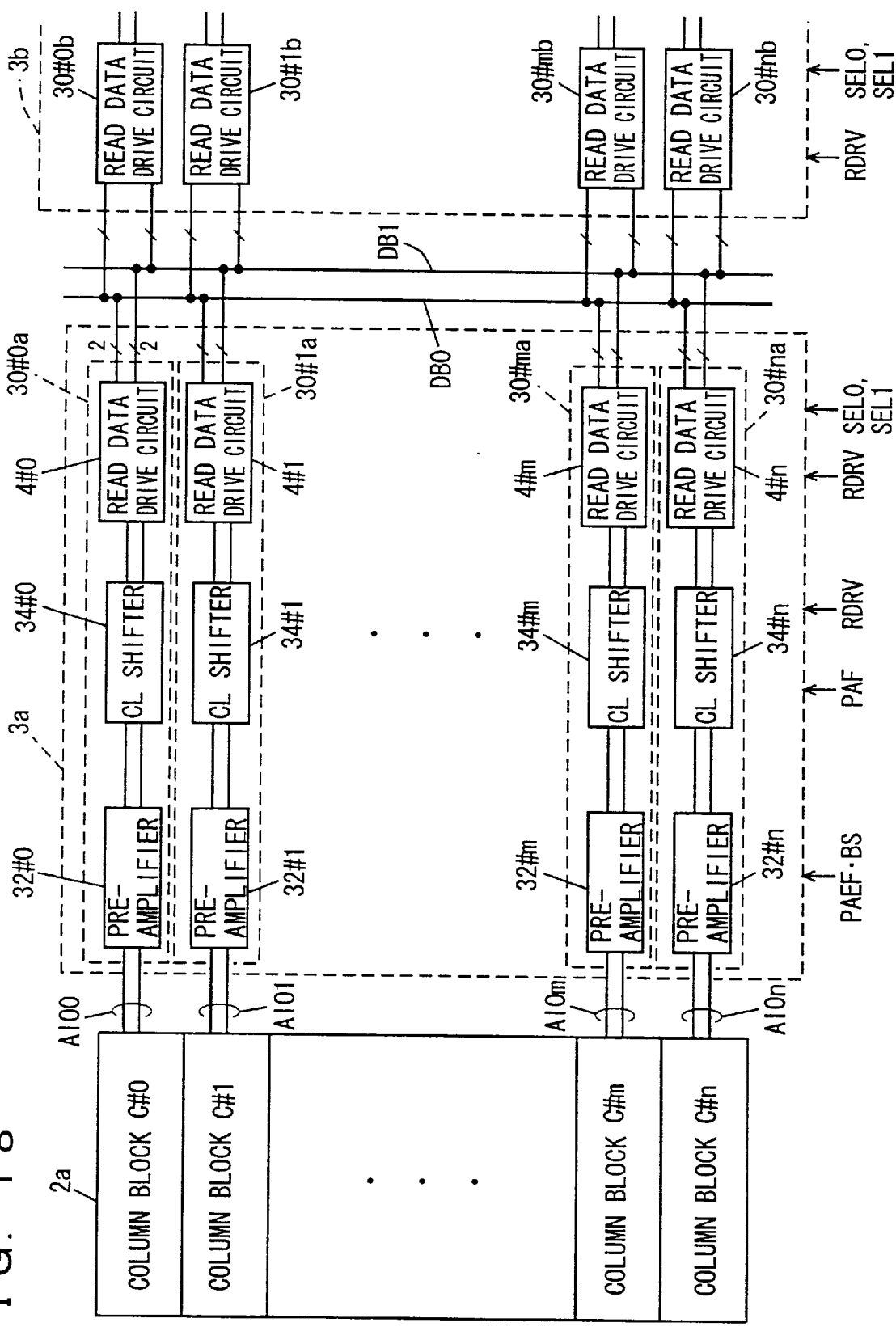
FIG. 18 schematically shows a structure of a main part of a semiconductor memory device according to a third embodiment of the present invention.

FIG. 18 schematically shows a structure of a main part of a semiconductor memory device according to a third embodiment of the present invention. Referring to FIG. 18, the structure of a column local circuit 3a for memory array 2a is illustrated. Column local circuits 3b–3d of the same structure are also provided for the remaining memory arrays 2b–2c, respectively. Memory array 2a is divided into a plurality of column blocks C#0, C#1, . . . , C#m, C#n. Array IO pairs AIO0–AIOn for transmitting complementary data signals are provided corresponding to column blocks C#0, C#1, . . . , C#m, C#n, respectively.

Column local circuit 3a includes internal read circuits 30#0a–30#na provided corresponding to array IO line pairs AIO0–AIOn, respectively. Internal read circuits 30#0a–30#na include preamplifiers 32#0–32#n amplifying the complementary signals of corresponding array IO line pairs AIO–AIOn, CL shifters 34#0–34#n shifting the output signals of corresponding preamplifiers 32#0–32#n, and read data drive circuits 4#0–4#n driving data bus DB0 or DB1 according to the output signals of corresponding CL shifters 34#0–34#n.

Preamplifiers 32#0–32#n are selectively rendered active by a preamplifier activation signal PAF (PAEF or PAEFF) and a block select signal BS. Preamplifiers 32#0–32#n can output ternary data. In a standby state, the complementary output signals are both set at an L level.

CL shifters 34#0–34#n transfer output signals of corresponding preamplifiers 32#0–32#n according to preamplifier activation signal PAF (PAEF) and read data driver activation signal RDRV. Each of CL shifters 34#0–34#n can transmit complementary data signals (ternary data). Preamplifier activation signal PAEF is buffered to generate signal PAF.

Each of read data driver circuits 4#0–4#n includes two read data drivers set to an operable state by select signals SEL0 and SEL1 and drives data bus DB0 or DB1 according to select signals SEL0 and SEL1. Read data driver activation signal RDRV is commonly applied to read data drive circuits 4#0–4#n. Read data drive circuits 4#0–4#n can take an output-three-state, and set to an output high impedance state when the signal applied via CL shifters 34#0–34#n at an inactive state of corresponding preamplifiers 32#0–32#n is in a standby state.

Preamplifier activation signal PAF and read data driver activation signal RDRV do not include a block select signal. CL shifters 34#0–34#n and read data drive circuits 4#0–4#n operate in common according to control signals PAF and RDRV. Therefore, a block select signal does not have to be applied to CL shifters 34#0–34#n and read data drive circuit 4#0–4#n. It is no longer necessary to consider the timing margin between the block select signal and the activation signals and a data write operation and a data read operation can be carried out properly. It is also not necessary to shift the block select signal according to CL shifters 34#0–34#n and read data drive circuits 4#0–4#n. Therefore, the circuit configuration is simplified.

As for column local circuit 3b provided corresponding to bank #1, the memory array is divided into column blocks, and an internal read circuit is provided corresponding to each column block. In FIG. 18, read data drive circuits 30#0b–30#nb are depicted in column local circuit 3b. Select signals SEL0 and SEL1 and read data driver activation signal RDRV are applied to read data drive circuits 30#0b–30#nb. The operation of the column local circuit of FIG. 18 will be described now.

Figure 19:
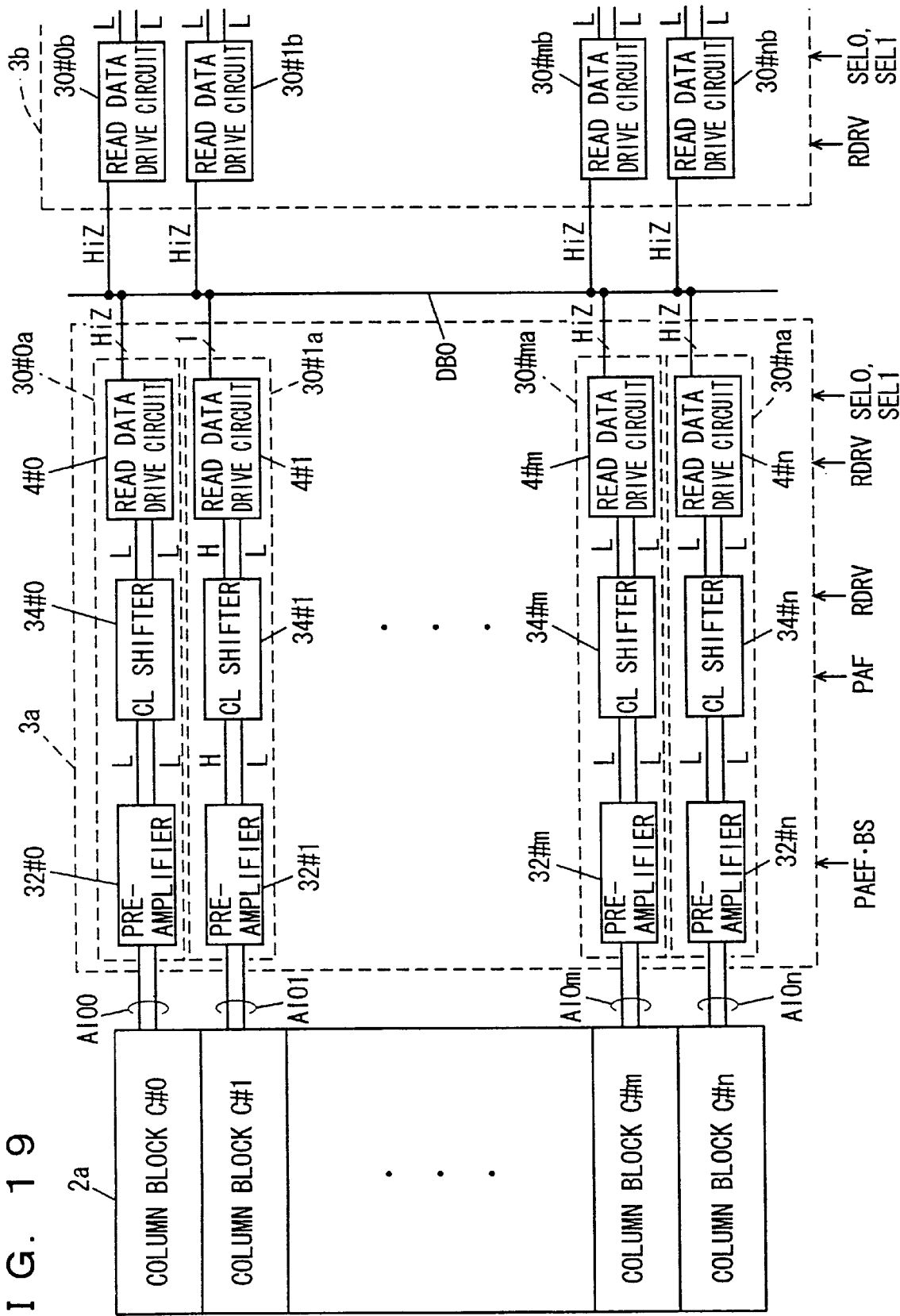
FIG. 19 shows an example of an output signal in an operating mode of the semiconductor memory device of FIG. 18.

The case is considered where column block C#1 is selected, and data "1" is read out as shown in FIG. 19. In this case, preamplifier 32#1 in column local circuit 3a is rendered active according to the preamplifier activation signal (PAEF.BS). The remaining preamplifiers 32#0, 32#2, . . . , 32#m and 32#n each are kept inactive to output signals both at an L level from the complementary output nodes. Preamplifier 32#1 is rendered active according to this preamplifier activation signal (PAEF.BS), whereby complementary data signals of an H level and an L level are generated according to the data read out on array IO line pair AIO1 from column block C#1.

CL shifters 34#0–34#n incorporate the data applied from corresponding preamplifiers 32#0–32#n according to preamplifier activation signal PAF. The incorporated data signals are output according to inactivation of read data driver activation signal RDRV. Therefore, complementary data signals of an H level and an L level are output from CL shifter 34#1, whereas complementary data signals both at the L level are output from the remaining CL shifters 34#0, 34#2, . . . , 34#m and 34#n.

Consider the case where read data drive circuits 30#0a–30#na are coupled to data bus DB0 according to select signal SEL0. In this case, read data drive circuits 30#0b–30#nb in column local circuit 3b are also coupled to data bus DB0. Read data drive circuit 4#1 provides a signal of "1" onto data bus DB0 according to the data signals of an H level and an L level from the corresponding CL shifter 34#1. Read data drive circuits 30#0a, 30#12a, . . . , 30#ma, and 30#na attain an output high impedance state (HiZ state) according to the signals both at the L level from the CL shifter. Read data drive circuits 30#0b–30#nb in column local circuit 3b of bank #1 maintain an output high impedance state (HiZ) even when read data driver activation signal RDRV is driven to an active state since the corresponding preamplifier is kept inactive.

Therefore, a data signal of 1 is transmitted to data bus DB0 according to read data driver activation signal RDRV from read data drive circuit 4#1 in column local circuit 3a.

As shown in FIG. 19, the internal read out circuit is provided for each column block. Only the preamplifiers are selectively rendered active according to a column block designation signal. The CL shifter and the read data driver circuit are both driven according to a preamplifier activation signal and the read data driver activation signal, and therefore it is not necessary to shift the block select signal, resulting in reduction of the area occupied by the interconnection lines. Furthermore, the circuit for shifting the block select line is no longer required, so that the area occupied by the circuitry can be reduced. There is no need for taking account of a margin for the timing skews among preamplifier activation signal PAF and read data driver activation signal RDRV and the block select signal. Thus, high speed operation can be realized.

FIG. 20A shows a structure of internal read out circuits 30#0a–30#na of FIG. 19. In FIG. 20A, the structure of one internal read out circuit is shown. A preamplifier 32 amplifies the complementary signals on array IO line pair IO and /IO from a corresponding column block in response to preamplifier activation signal PAE to transmit the amplified signals to output nodes PD and /PD. Preamplifier activation signal PAE is output from AND circuit 51 receiving block select signal BS and preamplifier activation signal PAEF. Block select signal BS specifies one of column blocks C#0–C#n. Therefore, only the preamplifier provided corresponding to the select column block is driven to an active state.

CL shifter 34 includes a tri-state inverter buffer 34a responsive to activation of activation signal PAF to amplify the signal at an output node PD of preamplifier 32, a tri-state inverter buffer 34b responsive to activation of activation signal PAF for amplifying the signal from an output node /PD of preamplifier 32, an inverter latch 34c for latching the output signal of tri-state inverter buffer 34a, an inverter latch 34d latching the output signal of tri-state inverter buffer 34b, a tri-state inverter buffer 34e activated when read data drive signal RDRV is inactive, to amplify the data latched in inverter latch 34c, a tri-state inverter buffer 34f rendered active when read data driver activation signal RDRV is inactive, to amplify the signal latched in inverter latch 34d, an inverter latch 34g latching the output signal of tri-state inverter buffer 34e, and an inverter latch 34h latching the output signal of tri-state inverter buffer 34f. Activation signal PAF is output from buffer 52 that receives preamplifier activation signal PAEF. Activation signal PAEF is a signal independent of the block select signal. Therefore, CL shifters 34#0–34#n in the column local circuit incorporate a signal from the output node of a corresponding preamplifier at the same time.

Read data driver activation signal RDRV also does not include a block select signal. Therefore, tri-state inverter buffers 34e and 34f operate simultaneously in CL shifters 34#0–34#n to transmit the input complementary signals to the output nodes of RD and /RD.

Read data drive circuit 4# (4#0~4#n) includes a read data driver 4#a for transmitting output signals RD and /RD from CL shifter 34 onto data bus lines DBB0 and /DBB0, and a read data driver 4#b transmitting output signals RD and /RD of CL shifter 34 onto data bus lines DBB1 and /DBB1. Read data driver 4#a is rendered active when select signal SEL0 and read data driver activation signal RDRV are active. Read data driver 4#b is rendered active when select signal SEL1 and read data driver activation signal RDRV are both active. Read data driver activation signal RDRV is a signal similar to read data driver activation signal RDRVF shown in the second embodiment, and does not include a block select signal. Therefore, the read data drive circuits operate simultaneously in the column local circuit. The operation of the internal read out circuit of FIG. 20A will be described with reference to the timing chart of FIG. 20B.

When a read command is applied at clock cycle #a, read out activation signal RP is driven to an active state of an H level for a predetermined time. FIG. 20B represents an operation where the burst length is 4. Preamplifier activation signal PAEF is driven to an active state for a predetermined time sequentially from clock cycle #a in response to the rise of clock signal CLK recording to activation of read out activation signal RP. Read data driver activation signal RDRV is rendered active one clock cycle behind, when the CAS latency is 3 as shown in the previous second embodiment (read out activation signal RP is shifted in one clock cycle by the shifter circuit). Therefore, read data driver activation signal RDRV is driven to an active state for a predetermined period at each clock cycle from clock cycle #b.

When preamplifier activation signal PAEF is rendered active at clock cycle #a and data is read out from preamplifier 32 to output nodes PD and /PD, tri-state inverter buffers 34a and 34b in CL shifter 34 operate in response to activation of preamplifier activation signal PAEF, whereby the output data of preamplifier 32 is incorporated and latched. Here, read driver activation signal RDRV is at an inactive state, and tri-state inverter buffers 34c and 34f are in an inactive state during clock cycle #a. The data from tri-state inverter buffers 34a and 34b are inverted to be transmitted to read data drivers 4#a and 4#b. However, read data drivers 4#a and 4#b are both at an inactive state (read data driver activation signal RDRV is at an inactive state). Therefore, read data drivers 4#a and 4#b are in an output high impedance state.

When read data driver activation signal RDRV (RDRVF) is driven to an active state at clock cycle #b, tri-state inverter buffers 34e and 34f are driven to an inactive state to attain an output high impedance state. In contrast, either read data driver 4#a or 4#b is rendered active to amplify signals RD and /RD shifted out from CL shifter 34. The amplified signals are transmitted onto data bus lines DBB0 and /DBB0 or to DBB1 and /DBB1.

In clock cycle #b, tri-state inverter buffers 34a and 34b are rendered active in response to activation of preamplifier activation signal PAEF, to incorporate and latch the new data from preamplifier 32. When read data driver activation signal RDRV attains an inactive state, tri-state inverter buffers 34e and 34f are rendered active to incorporate the newly applied data. The data are transmitted to read data drivers 4#a and 4#b. Subsequently, at each of clock cycles #b, #c, #d and #e, the read out data is transmitted onto a corresponding data bus DB by read data driver 4#a or 4#b.

As shown in FIG. 20A, the output signal of the preamplifier is incorporated in response to activation of the preamplifier activation signal into a CL shifter. The incorporated signal is transmitted when read data driver activation signal RDRV is inactive. Therefore, internal data transfer can be carried out according to the operation of the preamplifier and the read data driver without using an internal clock signal, and a signal can be incorporated and transferred properly without taking the timing margin into account. The operation of incorporating the output signal from an active preamplifier 32 to transfer the incorporated data to a read data driver when the read data driver is in active state in CL shifter 32 is carried out repeatedly. The control signals shown in FIG. 20A can be generated by means of the control circuit shown in FIGS. 9 and 12 of the previous second embodiment.

The structure of FIG. 20A copes with the operation when the CAS latency is 3. When the CAS latency is 2, CL shifter 34 is simply set to a transparent state, i.e. to a passing through state. This can be implemented by switching the connection path of output nodes PD and /PD of preamplifier 32 according to CAS latency information CL, or by employing a structure in which inverter buffers 34a, 34b, 34e and 34f in CL shifter are constantly set to an operative state when the CAS latency is 2. For example, when the CAS latency is 2, an output signal of the OR circuit receiving preamplifier activation signal PAEF and the CAS latency information CL=2 (indicating that the CAS latency is 2) can be applied as activation signal PAF to tri-state inverter buffers 34a and 34b. Also, in tri-state inverter buffers 34e and 34f, an output signal of an AND circuit receiving an inverted signal of the CAS latency information CL=2 and a read data driver activation signal RDRV can be applied.

Read data drivers 4#a and 4#b are rendered active when the output signal of preamplifier 32 is in a standby state even when the CAS latency is 2. However, when preamplifier 32 is inactive, a signal of an L level is output to output nodes PD and /PD. Therefore, read data drivers 4#a and 4#b are set to an output high impedance state at that stage. The structure of read data drivers 4#a and 4#b is similar to that shown in FIG. 8.

Figure 21:
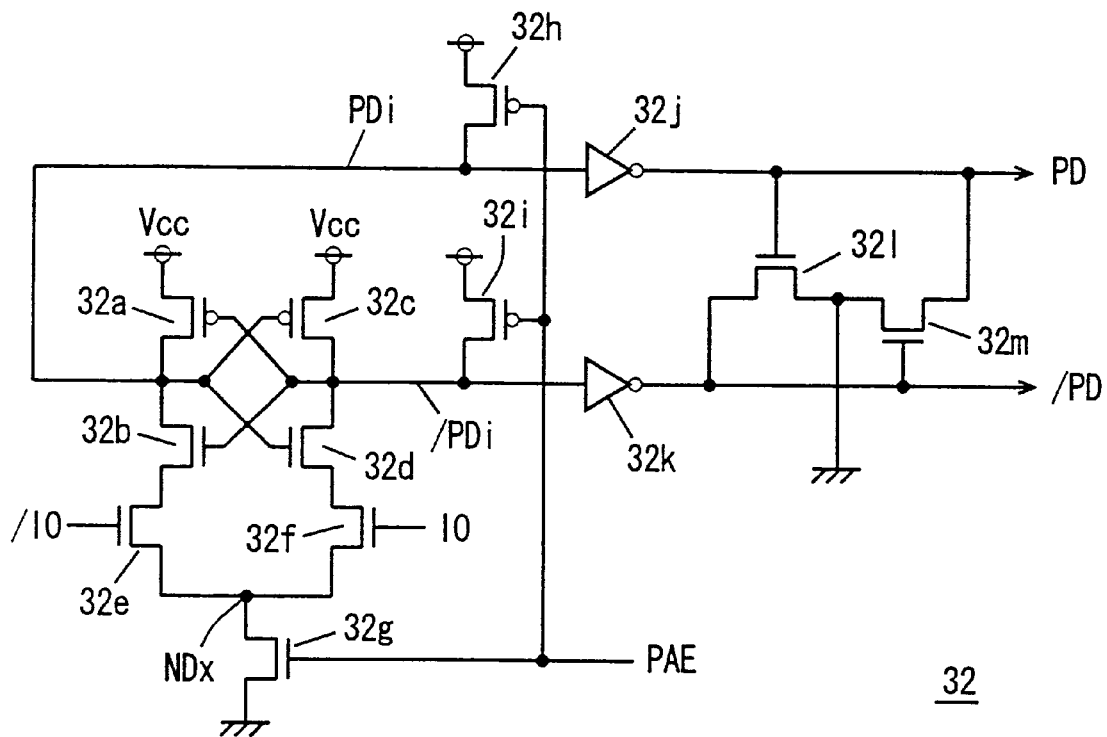
FIG. 21 shows a structure of the preamplifier in FIG. 20.

FIG. 21 specifically shows an example of preamplifier 32 of FIG. 20. Referring to FIG. 21, preamplifier 32 includes a p channel MOS transistor 32a connected between a power supply node and a node PDi and having a gate connected to a node /PDi, n channel MOS transistors 32b and 32e connected in series between a node PDi and a node NDx, a p channel MOS transistor 32c connected between the power supply node and node /PDi and having a gate connected to node PDi, n channel MOS transistors 32d and 32f connected in series between node /PDi and node NDx, and n channel MOS transistor 32g connected between node NDx and the ground node and receiving preamplifier activation signal PAE at its gate.

N channel MOS transistor 32b has its gate connected to node /PDi. N channel MOS transistor 32e has its gate connected to array IO line /IO. N channel MOS transistor 32d has its gate connected to node PDi. N channel MOS transistors 32f has its gate connected to array IO line IO. Preamplifier 32 further includes p channel MOS transistors 32h and 32i rendered conductive when preamplifier activation signal PAE is inactive, to precharge nodes PDi and /PDi to the level of power supply voltage Vcc, an inverter 32a for inverting the signal on node /PDi and transmitting the inverted signal onto output node PD, an inverter 32k inverting the signal on node PDi to transmit the inverted signal to output node /PD, and n channel MOS transistors 32l and 32m cross-coupled to output nodes PD and /PD. N channel MOS transistor 32l has a gate connected to the output of inverter 32j, one conduction node connected to the output node of inverter 32k, and the other conduction node connected to the ground node. N channel MOS transistor 32m has a gate connected to the output node of inverter 32k, one conduction node connected to the output (output node PD) of inverter 32j, and the other conduction node connected to the ground node. N channel MOS transistors 32l and 32m prevent output nodes PD and /PD both from being driven to an H level. The operation of preamplifier 32 of FIG. 21 will now be described briefly.

When preamplifier activation signal PAE is inactive, MOS transistor 32g is non-conductive, and the amplifying operation of the signals on array IO lines IO and /IO is inhibited. In contrast, p channel MOS transistors 32h and 32i conduct, so that nodes PDi and /PDi are precharged to the level of power supply voltage Vcc. Therefore, output nodes PD and /PD are maintained at the L level of the ground voltage by inverters 32j and 32k. More specifically, preamplifier 32 in an inactive state has the output nodes PD and /PD both set at an L level. In this state, MOS transistors 32l and 32m are both non-conductive.

When preamplifier activation signal PAE is rendered active, MOS transistors 32h and 32i are rendered non-conductive. MOS transistor 32g is turned on, whereby the amplifying operation of the signals on array IO lines IO and /IO is carried out.

Consider the case where the signal on array IO line IO has a potential higher than that of the signal on array IO line /IO. In this case, the conductance of n channel MOS transistor 32f becomes greater than the conductance of n channel MOS transistor 32e. Therefore, the voltage of node /PDi precharges to the level of power supply voltage Vcc is reduced. Here, nodes PDi and /PDi are precharged to the level of power supply voltage Vcc, and n channel MOS transistors 32b and 32d are both conductive. When the voltage of node /PDi is reduced, MOS transistor 32a begins to conduct to compensate for reduction in the voltage level of node PDi. As a result, node PDi is driven to the level of power supply voltage Vcc. In contrast, p channel MOS transistor 32c maintains the non-conductive state. Node /PDi is discharged via MOS transistors 32d, 32f and 32g, so that the voltage level thereof is reduced. This causes reduction in the conductance of n channel MOS transistor 32b, whereby the voltage difference between nodes PDi and /PDi is increased. Inverters 32j and 32k invert the signals on nodes PDi and /PDi to transmit the inverted signals to output nodes PD and /PD. Therefore, nodes PD and /PD attain an L level and an H level, respectively. Here, n channel MOS transistor 32m conducts to drive output node PD to the level of the ground voltage.

N channel MOS transistors 32l and 32m prevent output nodes PD and /PD from being driven to an H level. This corresponds to the state where nodes PDi and /PDi are both driven to an L level. For example, even when preamplifier 32 is rendered active rapidly in the case where the voltage levels of array IO lines IO and /IO are high and the voltage levels of internal nodes PDi and /PDi drops rapidly, either output node PD or /PD is properly driven to an L level. The provision of MOS transistors 32l and 32m prevents erroneous operation of the read data driver. More specifically, the read data driver has a structure as shown in FIG. 8, and the output stage thereof drives the complementary data bus lines by the pair of the p and n channel MOS transistors. When read data RD and /RD are at an H level, (i.e., output nodes PD and /PDi are both at an H level), nodes /LRD and LRD of the read data driver (refer to FIG. 8) attains an L level. All MOS transistors QT1–QT4 of the read data driver are rendered conductive, so that data cannot be read out properly, and in addition large current flows through data bus lines DDB and /DDB. The cross-coupled n channel MOS transistors 32l and 32m are provided to prevent such an unstable state and to set the output state to either one of the three states according to the read out data.

Thus, an internal read out circuit that provides data of the three states of "1", "0", and high impedance (HiZ) on the data bus line can be realized. It is to be noted that the 3-state data output from the preamplifier is "H, L", "L, H", "L, L", and does not take a HiZ state.

In the foregoing, if it is described that read data drive activation signal RDRV is a signal independent of the block select signal, and all the read data drive circuits are rendered active. However, a bank address signal can be combined with this read data driver activation signal RDRV to activate read data driver activation signal RDRV with respect to only the selected bank. In this case, the CL shifter and the read data driver can be operated only at a selected bank to reduce power consumption.

According to the third embodiment of the present invention, the preamplifier provides 3-value data, which is transmitted to a read data driver via a CL shifter. The read data driver drives the data bus into 3 states. Therefore, data can be read out with an internal read out circuit of the same structure for each column block, and therefore the circuit layout can be simplified. Furthermore, since only the preamplifier is rendered active according to a block select signal, and the CL shifter and the read data driver are operated independent of the block select signal, the circuit and interconnection lines for shifting the clock select signal are not required. Therefore, the interconnection line occupying area is reduced. Furthermore, a shift operation is not needed, so that power consumption can be reduced.

Figure 22:
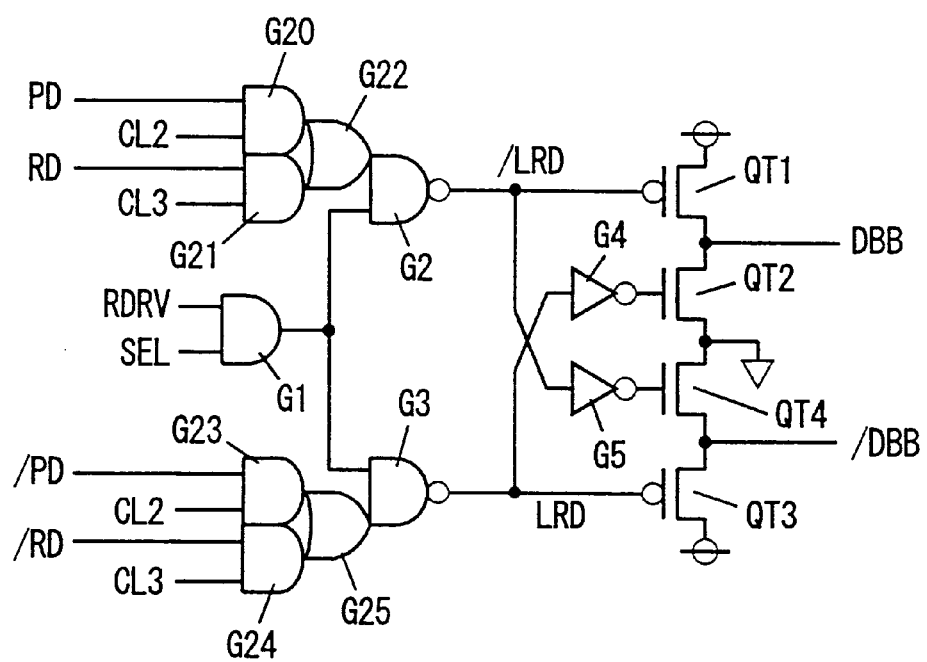
FIG. 22 shows a structure of the read data driver in FIG. 20A.

FIG. 22 shows a structure of the read data driver of FIG. 20. The read data driver of FIG. 22 includes, in addition to the structure of FIG. 8, an AND circuit G20 receiving output data PD from preamplifier 32 and CAS latency information CL2, an AND circuit G21 receiving output signal RD from CL shifter 34 and CAS latency information CL3, an OR circuit G22 receiving the output signals of AND circuits G20 and G21, an AND circuit G23 receiving the output signal /RD from preamplifier 32 and CAS latency information CL2, an AND circuit G24 receiving output signal /RD from CL shifter 34 and CAS latency information CL3, and an OR circuit G25 receiving the output signals of AND circuits G23 and G24. OR circuit G22 has its output signal applied to the first input of NAND circuit G2. OR circuit G25 has its output signal applied to the first input of NAND circuit G3. The output signal of AND circuit G1 receiving read data driver activation signal RDRV and select signal SEL is applied to each second input of NAND circuits G2 and G3. The remaining structure is similar to that of FIG. 8. Corresponding components have the same reference characters allotted, and detailed description thereof will not be repeated. The node and the signal thereof are referenced by the same reference characters.

CAS latency information CL2 indicates that the CAS latency is 2. CAS latency information CL3 indicates that the CAS latency is 3. CAS latency information CL2 and CL3 are set at an H level when made active.

When the CAS latency is 2 in the structure of FIG. 22, AND circuits G20 and G23 operate as buffers. AND circuits G21 and G24 have their output signals fixed at an L level. Therefore, output signals PD and /PD from preamplifier 32 are applied to the read data driver via AND circuits G20 and G23 and OR circuits G22 and G25 when the CAS latency is 2. In this state, output data signals RD and /RD from CL shifter 34 are ignored. When the CAS latency is 3, CAS latency information CL3 is driven to an H level. AND circuits G21 and G24 operate as buffers, whereas AND circuits G20 and G23 have their output signals fixed at an L level. Therefore, output data signals RD and /RD from the CL shifter are transmitted via AND circuits G21 and G24 and OR circuits G22 and G25 to the read data drivers to be amplified. The output data signals of the preamplifier and the CL shifter can be selected according to the CAS latency information by taking advantage of AND circuits G20, G21, G23, G24 and OR circuits G22 and G25. By providing a similar structure (select gate) in the read data driver of FIG. 8, data can be also read out according to the CAS latency. Thus, in a structure in which the output data of the preamplifier is shifted using activation control signals PAF and RDRV, not an internal clock signal, the output signal of the preamplifier and the CL shifter can be selected according to the CAS latency information (when a shift operation is carried out using an internal clock signal, the CAS latency can be accommodated by altering the number of shift stages).

Fourth Embodiment

Figure 23:
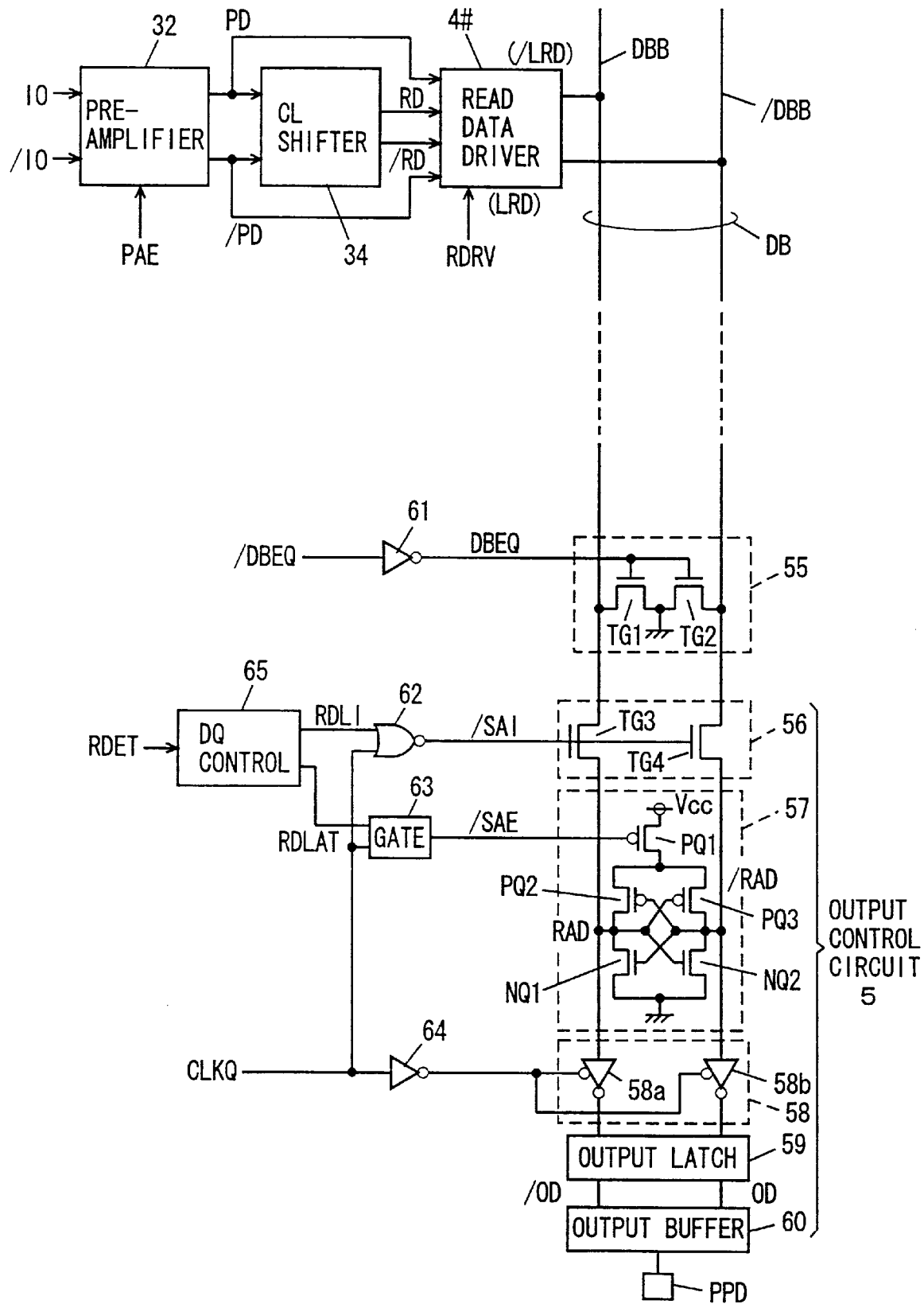
FIG. 23 schematically shows a structure of a main part of a semiconductor memory device according to a fourth embodiment of the present invention.

FIG. 23 shows a structure of a main part of a semiconductor memory device according to a fourth embodiment of the present invention. FIG. 23 shows a structure of an output control circuit 5 arranged in the proximity of pad PPD. A plurality of internal read/write circuits are coupled in parallel to data bus lines DBB and /DBB. In FIG. 23, preamplifier 32, CL shifter 34, and read data driver 4# forming one internal read out circuit are shown representatively. The structures of preamplifier 32, CL shifter 34, and read data driver 4# are similar to those shown in FIGS. 21, 20A, and 22.

Referring to FIG. 23, a data bus equalize circuit 55 is provided to equalize data bus lines DBB and /DBB to the level of the ground voltage according to an output signal DBEQ from inverter 61 receiving a data bus equalize designation signal /DBEQ for data bus lines DBB and /DBB. Data bus equalize circuit 55 includes transfer gates TG1 and TG2 rendered conductive in response to activation (H level) of data bus equalize designation signal DBEQ to transmit the ground voltage to data bus lines DBB and /DBB, respectively.

Output control circuit 5 includes a read amplifier isolation gate 56 rendered non-conductive in response to activation (L level) of an isolation designation signal /SAI, a read amplifier 57 coupled to data bus DB via read amplifier isolation gate 56 to amplify the applied data in response to activation of a read amplifier activation signal /SAE, a transfer circuit 58 for transferring complementary output data RAD and /RAD from read amplifier 57 according to a read out clock signal CLKQ, an output latch 59 for latching the data from transfer circuit 58, and an output buffer 60 for transmitting latch data OD and /OD of output latch 59 to pad PPD.

Read amplifier isolation gate 56 includes transfer gates TG3 and TG4 rendered non-conductive when read amplifier isolation designation signal /SAI is active to isolate data bus lines DBB and /DBB from read amplifier 57.

Read amplifier 57 includes a p channel MOS transistor PQ1 rendered conductive in response to activation (L level) of read amplifier activation signal /SAE to transmit power supply voltage Vcc, a p channel MOS transistor PQ2 connected between p channel MOS transistor PQ1 and a node RAD and having a gate connected to a node /RAD, a p channel MOS transistor PQ3 connected between MOS transistor PQ1 and node /RAD and having a gate connected to node RAD, an n channel MOS transistor NQ1 connected between node RAD and the ground node and having a gate connected to node /RAD, and an n channel MOS transistor NQ2 connected between node /RAD and the ground node and having a gate connected to node RAD.

Read amplifier 57 has a structure of a cross-coupled type sense amplifier. The amplifying portion formed of cross-coupled p channel MOS transistors PQ2 and PQ3 is rendered active. Nodes RAD and /RAD are connected to data bus lines DBB and /DBB via read amplifier isolation gate 56. In a standby state, nodes RAD and /RAD are equalized to the level of the ground voltage. Therefore, when read amplifier 57 is active, the voltage of node RAD or /RAD that is at a higher potential is boosted. The data bus line at the lower potential maintains the level of the ground voltage.

Read amplifier isolation designation signal /SAI is output from NOR circuit 62 receiving the output signal RDLI from DQ control circuit 65 and read out clock signal CLKQ. Read amplifier activation signal /SAE is generated by a gate circuit 63 receiving the output signal RDLAT of DQ control circuit 65 and read out clock signal CLKQ.

Transfer circuit 58 includes tri-state inverter buffers 58a and 58b attaining an operative state when the output signal of inverter 64 receiving clock signal CLKQ is inactive (L level), to amplify the signals of nodes RAD and /RAD. Transfer circuit 58 further amplifies the data amplified by read amplifier 57 during the H level of read out clock signal CLKQ to transmit the amplified data to output latch 59. When read out clock CLKQ is at an L level, transfer circuit 58 attains an output high impedance state. The operation of the output control circuit and the internal read out circuit of FIG. 23 will now be described with reference to the timing chart of FIGS. 24 and 25.

Figure 24:
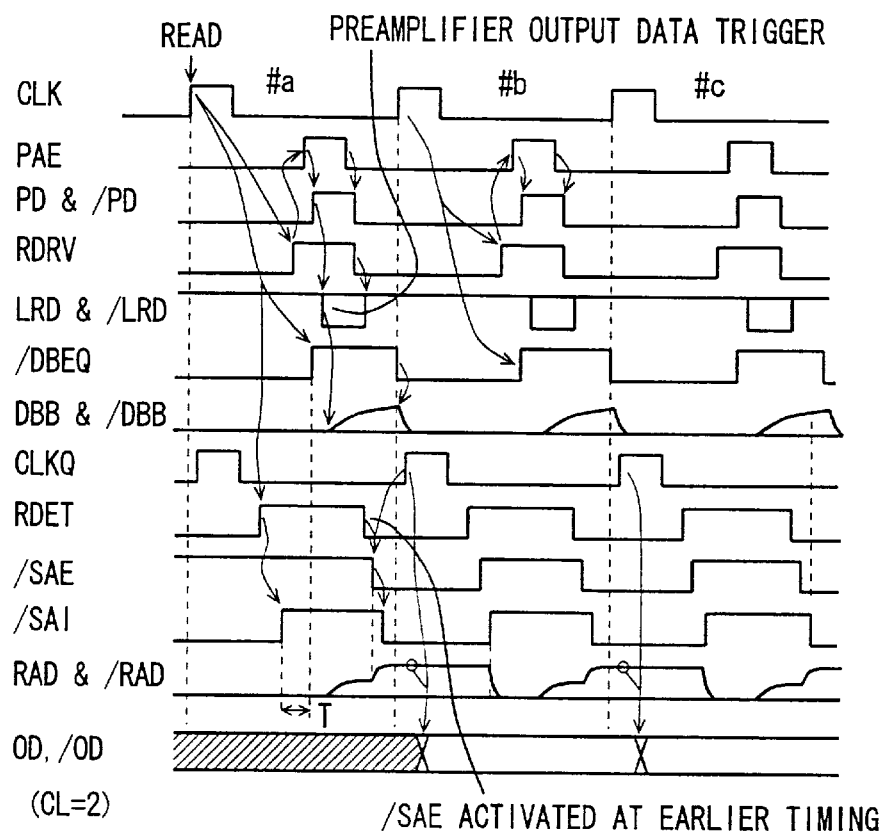
FIGS. 24 and 25 are timing charts representing an operation of the semiconductor memory device of FIG. 23.

First, the data read out operation when the CAS latency is 2 will be described with reference to FIG. 24.

When a read command is applied at clock cycle #a, read data driver activation signal RDRV attains an active state for a predetermined time in response to a rise of internal clock signal CLK. Then, preamplifier activation signal PAE is rendered active. Responsively, selected preamplifier 32 amplifies the data read out onto array IO lines IO and /IO to provide the amplified data to read data driver 4#. When the CAS latency is 2, CL shifter 34 is bypassed, and the output signals PD and /PD from preamplifier 32 are directly applied to read data driver 4#. In response to activation of read data driver activation signal RDRV, read data driver 4# carries out an amplifying operation, and the voltage level of internal nodes LRD and /LRD (refer to FIG. 22) changes according to signals PD and /PD transmitted from preamplifier 32. Then, the voltage levels of data bus lines DBB and /DBB change from the precharged level of an L level by the amplifying operation of read data driver 4#.

In response to a rise of internal clock signal CLK, a read detect signal RDET is rendered active. Under control of DQ control circuit 65, an isolation designation signal /SAI is pulled up to an H level via NOR circuit 62 (during this period, read out clock signal CLKQ is at an L level). Accordingly, read amplifier isolation gate 56 conducts, so that the potential of the signals on data bus lines DBB and /DBB is transmitted to read amplifier 57. Following the transition of read amplifier isolation gate 56 to a conductive state, data bus equalize designation signal /DBEQ attains an H level in response to the rise of internal dock signal CLK. As a result, data bus equalize designation signal DBEQ from inverter 61 is pulled down to an L level, whereby data bus equalize circuit 55 is rendered inactive. In response, the data from read data driver 4# is transmitted to read amplifier 57 via data bus lines DBB and /DBB. By maintaining data bus lines DBB and /DBB still at an equalized state when read amplifier isolation gate 56 attains a conductive state, the internal nodes of read amplifier 57 can be reliably reset to the initial state of an L level.

Then, read amplifier activation signal /SAE is driven to an active state of an L level at the inactivation timing of read detect signal RDET or the activation (rising) timing of clock signal CLKQ, whichever is earlier. Gate circuit 63 receives read out clock signal CLKQ and read data latch designation signal RDLAT from DQ control circuit 65. When one of the signals are driven to the ground level, read amplifier activation signal /SAE is pulled down to an active state of an L level to make read amplifier activation signal /SAE is rendered active, read amplifier isolation designation signal /SAI attains an L level. Read amplifier isolation gate 56 non-conductive. As a result, read amplifier 57 is isolated from data bus lines DBB and /DBB. The load on the sense node (nodes RAD and /RAD) is alleviated, so that an amplifying operation can be carried out at high speed. One of nodes RAD and /RAD has its voltage raised from the level of the ground voltage to the level of power supply voltage Vcc according to the read out data.

When read amplifier 57 carries out an amplifying operation and latches the amplified data in response to read amplifier activation signal /SAE, the output signal of inverter 64 attains an L level in response to the rise of read out clock signal CLKQ. Transfer circuit 58 is rendered active, so that the data amplified by read amplifier 57 is transmitted onto output latch 59, and then to output nodes OD and /OD of output latch 59. Then, the data latched in output latch 59 is transmitted to pad PPD by output buffer 60. Therefore, when a read command is applied at clock cycle #a, the ascertained data is sampled by an external device at the rising edge of internal clock signal CLK at clock cycle #3. Thus, data read out with the CAS latency of 2 (CL=2) is realized.

When read amplifier isolation designation signal /SAI attains an L level, so that data bus lines DBB and /DBB are disconnected from read amplifier 57, data bus equalize designation signal /DBEQ attains an L level. In response, data bus equalize circuit 55 is rendered active, so that the voltages on data bus lines DBB and /DBB are equalized to the level of the ground voltage. Then, read amplifier activation signal /SAE is driven to an inactive state of an H level, whereby read amplifier 57 is rendered inactive. Then, read amplifier isolation designation signal /SAI attains an H level, whereby read amplifier 57 is connected to data bus lines DBB and /DBB via read amplifier isolation gate 56. Thus, nodes RAD and /RAD are reset to the level of the ground voltage.

In clock cycle #b, preamplifier activation signal PAE and read data driver activation signal RDRV are activated again, whereby the next data is transmitted to data bus lines DBB and /DBB. Data bus equalize designation signal /DBEQ attains an inactive state of an H level, and data bus equalize circuit 55 is rendered inactive, whereby the data from read data driver 4# is transmitted to data bus lines DBB and /DBB. Upon the read out of data to data bus lines DBB and /DBB, read amplifier isolation designation signal /SAI is at an H level, and read amplifier isolation gate 56 is at a conductive state to transmit the data on data bus lines DBB and /DBB to read amplifier 57. Then, read amplifier activation signal /SAE is rendered active, whereby read amplifier 57 carries out an amplifying operation. In response to a rise of read out clock signal CLKQ, transfer circuit 58 amplifies the data from read amplifier 57 and provides the amplified data to output latch 59. This operation is repeated thereafter until the elapse of the number of the burst length cycles or until a read out operation stop (interrupt or precharge) command is applied.

Read amplifier 57 carries out an amplifying operation while being isolated from data bus DB by read amplifier isolation gate 56. Therefore, when the voltage difference between nodes RAD and /RAD in read amplifier 57 attains a sensible range, read amplifier 57 can be immediately set to start amplifying operation. Thus, read amplifier 57 can carry out an amplifying operation before a signal of the CMOS level is transmitted to data bus lines DBB and /DBB. In other words, a data signal of a small amplitude can be transmitted to data bus lines DBB and /DBB to enable a high speed read out.

Figure 25:
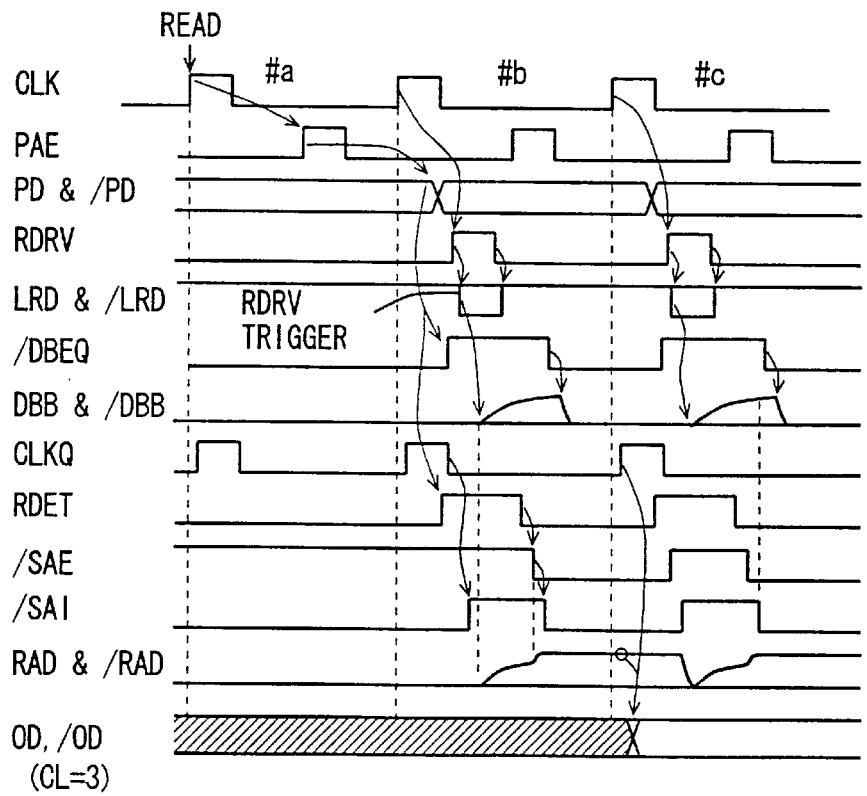

A data read out operation when the CAS latency is 3 will now be described with reference to FIG. 25. In response to application of a read command at clock cycle #a, preamplifier activation signal PAE is first rendered active. Preamplifier 32 amplifies the signals on array IO lines IO and /IO and transmits the amplified signal to CL shifter 34. When the CAS latency is 3 (CL=3), CL shifter 34 carries out a shift operation, incorporates the output data signal from preamplifier 32 in response to activation of preamplifier activation signal PAE, and transmits the incorporated data signal to read data driver 4# in response to inactivation of read data driver activation signal RDRV. Since read data driver activation signal RDRV is at an inactive state during this clock cycle #a, the signal from CL shifter 34 is applied to read data driver 4#. Since read detect signal RDET is rendered active also one clock cycle behind when the CAS latency is 3, it maintains the inactive state and therefore read amplifier activation signal /SAE is at an inactive state of an H level in clock cycle #a. Also, read amplifier isolation designation signal /SAI is at an L level to isolate data bus DB from read amplifier 57. Data bus equalize designation signal /DBEQ is at an L level, and data bus equalize circuit 55 is rendered active to equalize data bus lines DBB and /DBB to the level of the ground voltage.

At clock cycle #b, read data driver activation signal RDRV is driven to an active state in response to a rise of internal clock signal CLK, and respectively, read data driver 4# carries out an amplifying operation to amplify the data transmitted from CL shifter 34. Accordingly, the levels of the voltages at internal nodes LRD and /LRD of read data driver 4# change in response to activation of read data driver activation signal RDRV.

When read detect signal RDET is rendered active and read out clock signal CLKQ is pulled down to an L level in response to a rise of internal clock signal CLK at clock cycle #b, read amplifier isolation designation signal /SAI is pulled up to an H level, whereby data bus lines DBB and /DBB are coupled to read amplifier 57. Read bus equalize designation signal /DBEQ attains an H level in response to the rise of internal clock signal CLK, and the data bus equalize circuit 55 is rendered inactive. The levels of the voltages on data bus lines DBB and /DBB are altered according to the output data signal of read data driver 4#. Also, the levels of the voltages at nodes RAD and /RAD of read amplifier 57 are altered according to the signals applied from read data driver 4# via data bus lines DBB and /DBB.

When read data driver activation signal RDRV is rendered inactive at an L level, read data driver 4# attains an output high impedance state. Here, data bus equalize designation signal /DBEQ maintains the H level, and data bus equalize circuit 55 is at an inactive state. Read amplifier activation signal /SAE is rendered active when read detect signal RDET is pulled down to an L level. Then, read amplifier isolation designation signal /SAI attains an L level. Accordingly, read amplifier 57 carries out an amplifying operation while isolated from data bus lines DBB and /DBB. The levels of the voltages at nodes RAD and /RAD are set to the voltage levels according to the levels of the transmitted signals.

During the amplifying operation of read amplifier 57 with data bus line isolation designation signal /SAI at an active state (L level), data bus equalize designation signal /DBEQ attains an L level. Therefore, data bus lines DBB and /DBB are equalized to the level of the ground voltage by data bus equalize circuit 55.

At clock cycle #b, preamplifier activation signal PAE is rendered active, and responsively, preamplifier 32 carries out an amplifying operation. The next data is transmitted to and latched in CL shifter 34. The data amplified by preamplifier 32 at clock cycle #b is incorporated by read data driver 4# to be amplified according to the activation of read data driver activation signal RDRV at clock cycle #c. The amplified data from read data driver 4# is transmitted to data bus lines DBB and /DBB. An operation identical to that in clock cycle #b is repeatedly executed thereafter.

The data latched in output latch 59 is transmitted to pad PPD via output buffer 60 at that clock cycle.

Valid data is output to pad PPD at clock cycle #c to be sampled by an external device at the rising edge of internal clock signal CLK in the next clock cycle #d not shown. Thus, data is read out with the CAS latency of 3.

Figure 26:
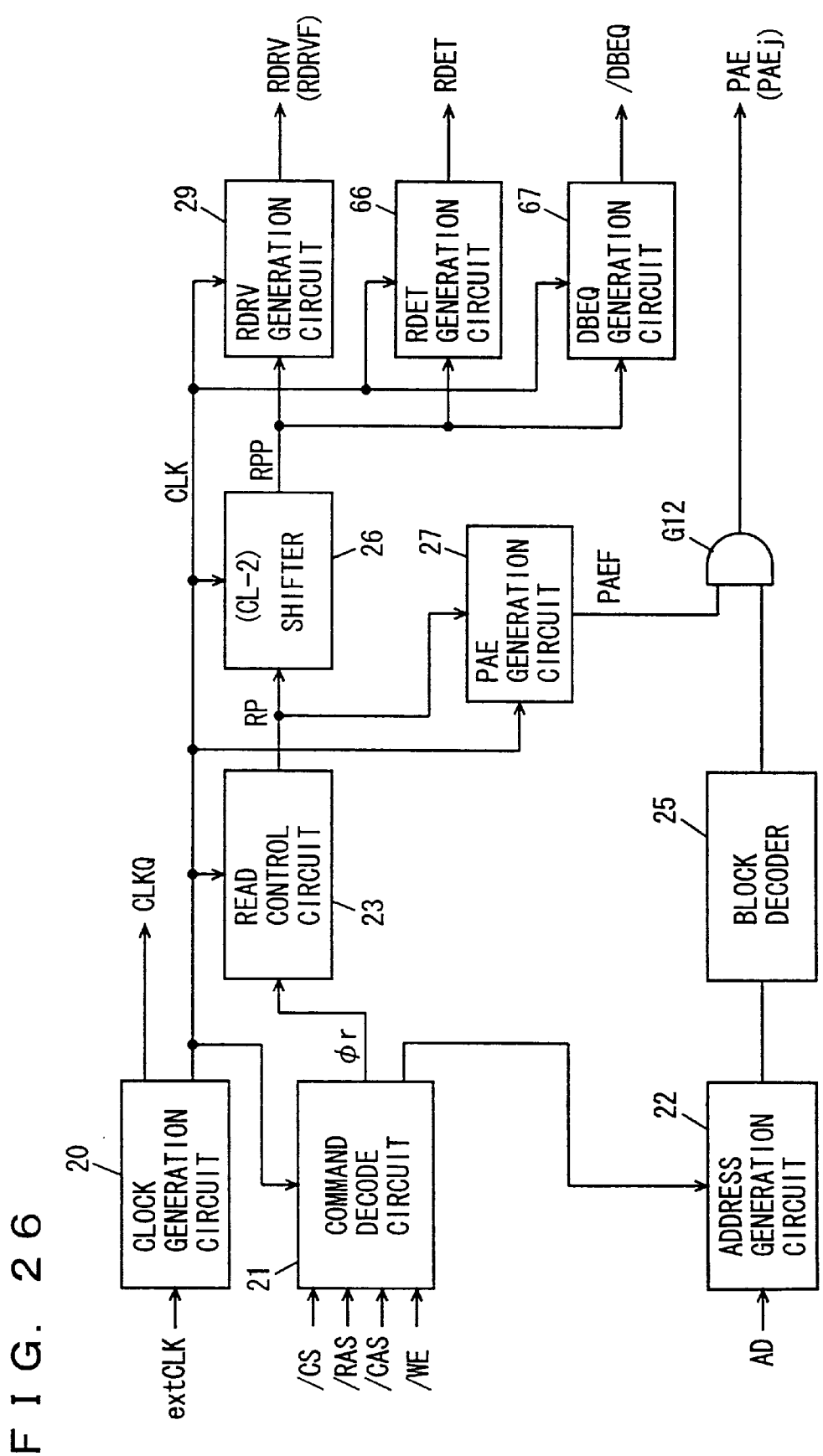
FIG. 26 schematically shows a structure of a circuit generating a control signal of FIG. 23.

FIG. 26 schematically shows a structure of the portion generating the control signals shown in FIG. 23. Referring to FIG. 26, a control signal generation circuitry includes a clock generation circuit 20 receiving externally applied clock signal ext.CLK to generate internal clock signal CLK and read out clock signal CLKQ, a command decode circuit 21 incorporating externally applied control signals (command) /CS, /RAS, /CAS and /WE in synchronization with internal clock signal CLK from clock generation circuit 0 to generate a signal designating a specified operation mode, an address generation circuit 22 incorporating an externally applied address signal AD according to an output signal from command decode circuit 21 to generate an internal address signal, a read control circuit 23 driving a read out activation signal RP to an active state for a burst length period in response to activation of read operation designation signal φr from command decode circuit 21, a (CL−2) shifter 26 shifting read out activation signal RP from read control circuit 23 by (CAS latency −2) clock cycles, and a PAE generation circuit 27 enabled when read out activation signal RP from read control circuit 23 is rendered active, to generate preamplifier activation signal PAE in synchronization with internal clock signal CLK.

The structure of the circuitry is similar to that of the control signal generation circuitry shown in FIG. 16. (CL−2) shifter 26 directly transmits read out activation signal RP from read control circuit 23 to generate read out operation activation signal RPP when the CAS latency is 2. When the CAS latency is 3, (CL−2) shifter 26 shifts read out activation signal RP from read control circuit 23 for 1 clock cycle period to generate read out operation activation signal RPP.

The control signal generation circuit further includes a block decoder 25 decoding the internal address signal from address generation circuit 22 to generate a block select signal specifying a memory column block, and a gate circuit G12 receiving preamplifier activation signal PAEF from PAE generation circuit 27 and a block select signal from block decoder 25 to generate a preamplifier activation signal PAE (PAEj). Only the preamplifier corresponding to a selected column block is rendered active according to preamplifier activation signal PAE (PAEj). The remaining preamplifiers maintain an inactive state.

The control signal generation circuitry further includes a RDRV generation circuit 29 generating a read data driver activation signal RDRV (RDRVF) in synchronization with internal clock signal CLK when read out operation activation signal RPP from (CL−2) shifter 26 is active, a RDET generation circuit 66 generating a read data detect signal RDET in response to internal clock signal CLK when read out operation activation signal RPP is active, and a DBEQ generation circuit 67 driving a data bus equalize designation signal /DBEQ in synchronization with internal clock signal CLK when read out operation activation signal RPP is active. When read out operation activation signal RPP is inactive, RDRV generation circuit 29 and RDET generation circuit 66 maintain signals RDRV and RDET at the inactive state of an L level. DBEQ generation circuit 67 maintains data bus equalize designation signal /DBEQ at an L level of an active state when read out operation activation signal RPP is inactive.

Figure 27A:
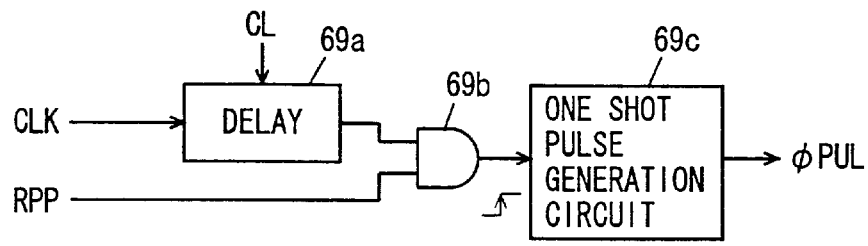
FIG. 27A shows a structure of the signal generation circuit of FIG. 26.

FIG. 27A schematically shows the structure of RDRV generation circuit 29, RDET generation circuit 66, and DBEQ generation circuit 67 of FIG. 26. Since RDRV generation circuit 29, RDET generation circuit 66 and DBEQ generation circuit 67 have substantially the same structure, the structure of one circuit among them is representatively shown in FIG. 27A. Referring to FIG. 27A, each of generation circuits 29, 66 and 67 includes a delay circuit 69a for delaying internal clock signal CLK by a predetermined time, an AND circuit 69b receiving an output signal of delay circuit 69a and read out operation activation signal RPP, and a one shot pulse generation circuit 69c generating a one shot pulse signal φPUL having a predetermined time width in response to a rise of the output signal of AND circuit 69b. The delay time of delay circuit 69a is variable according to CAS latency information CL. Therefore, the generation timing of each designation signal can be differed as shown in FIGS. 24 and 25. The operation of the signal generation circuit of FIG. 27A will be described with reference to the timing charts of FIGS. 27B and 27C.

Figure 27B:
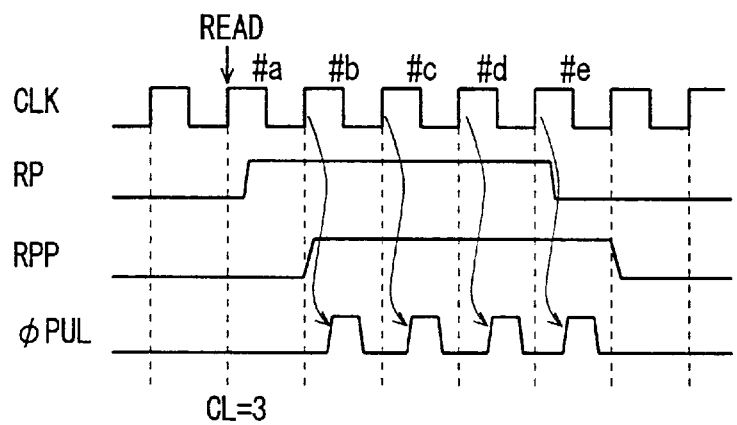
FIG. 27B shows an operation thereof.

The operation when the CAS latency is 3 (CL=3) will now be described with reference to FIG. 27B. With application of a read command at clock cycle #a, read out activation signal RP is driven to an active state for a predetermined time (burst length period). When the CAS latency is 3, read out operation activation signal RPP is driven to an active state at the next clock cycle #b by (CL−2) shifter 26. AND circuit 69b generates an output signal according to read out operation activation signal RPP and the delayed internal clock signal from delay circuit 69a. Therefore, a signal that rises to an H level at an elapse of a predetermined time from the rise of internal clock signal CLK is sequentially output from AND circuit 69b. One shot pulse generation circuit 69c generates one shot pulse signal φPUL in response to the rise of the output signal of AND circuit 69b. Therefore, when read out operation activation signal RPP is at an active state, one shot pulse signal φPUL is rendered active in clock cycles #b, #c, #d and #e. During the L level period of read out operation activation signal RPP, the output signal of AND circuit 71 is fixed at an L level, and one shot pulse signal φPUL is fixed at an L level.

Figure 27C:
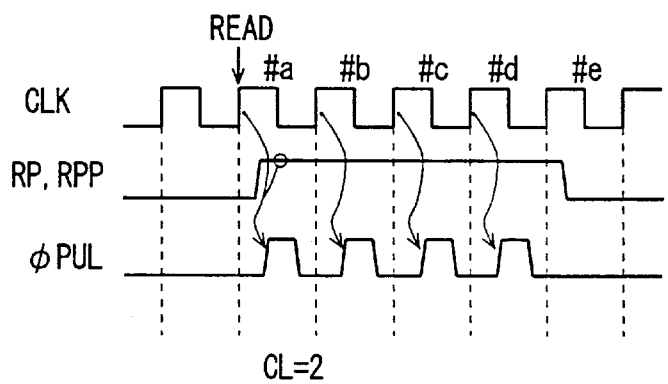
FIG. 27C is a timing chart representing an operation of the circuit of FIG. 27A.

The operation when the CAS latency is 2 will now be described with reference to FIG. 27C. With application of the read command at clock cycle #a, read out activation signal RP and read out operation activation signal RPP are both driven to an H level in clock cycle #a. (CL−2) shifter 26 does not carry out a shift operation when the CAS latency is 2. Therefore, from clock cycle #a, the output signal of AND circuit 69b is pulled up to an H level according to internal clock signal CLK, and one shot pulse generation circuit 69c generates one shot pulse signal φPUL.

By delaying internal clock signal CLK by use of delay circuit 69a, a one shot pulse signal can be generated according to internal clock signal CLK in response to read out activation signal RP driven to an active state even during clock cycle #a where a read command is applied. Therefore, a one shot pulse signal having a predetermined time width can be generated properly.

Delay circuit 69a can have its delay time easily altered by changing the number of stages of the inverters according to CAS latency information CL.

Figure 28:
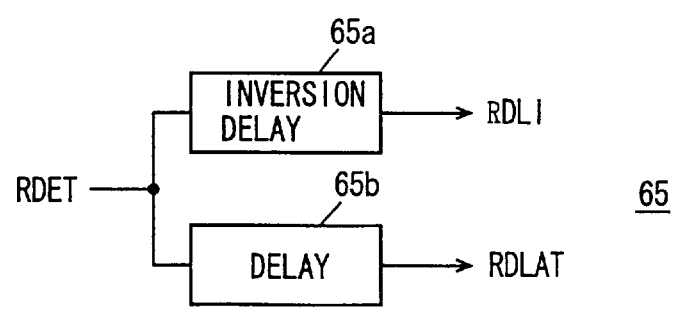
FIG. 28 schematically shows a structure of the DQ control circuit of FIG. 23.

FIG. 28 schematically shows a structure of DQ control circuit 65 of FIG. 23. Referring to FIG. 28, DQ control circuit 65 includes an inversion delay circuit 65 delaying read detect signal RDET by a predetermined time and inverting the delayed signal to generate a signal RDLI, and a delay circuit 65b delaying read detect signal RDET by a predetermined time to output read data latch designation signal RDLAT. Signal RDLI is applied to NOR circuit 62 shown in FIG. 23. Read data latch designation signal RDLAT is applied to gate circuit 63 shown in FIG. 23.

The manner of generation of a read amplifier isolation designation signal /SAI will now be described with reference to FIGS. 28, 23, 29A and 29B.

Figure 29A:
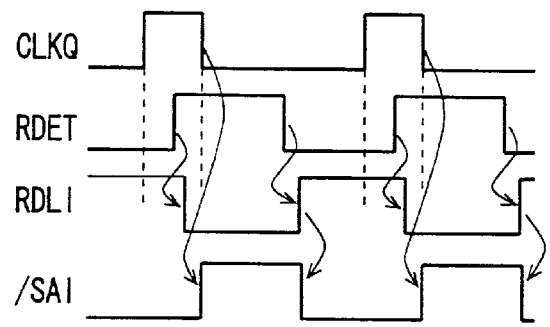
FIGS. 29A and 29B are signal waveform diagrams representing an operation of the DQ control circuit of FIG. 28.

Referring to FIG. 29A, read detect signal RDET is driven to an H level for a predetermined time subsequently to the rise of read clock signal CLKQ. Signal RDLI which is a delayed and inverted version of read detect signal RDET is output from inversion delay circuit 65a. Therefore, read amplifier isolation designation signal /SAI is driven to an H level and an L level in synchronization with a fall of read out clock signal CLKQ and a rise of signal RDLI, respectively. When signal /SAI is at an H level, read amplifier isolation gate 56 attains a non-conductive state, whereby read bus DB is isolated from read amplifier 57.

Figure 29B:
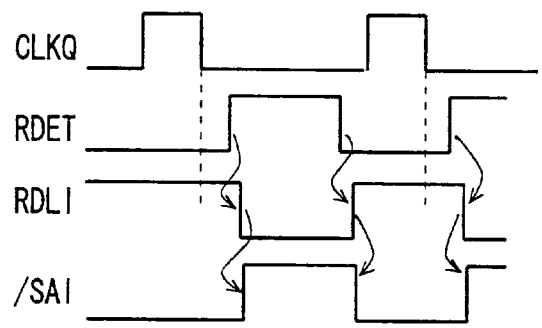

In the case where read detect signal RDET is driven to an H level after the fall of read out clock signal CLKQ and driven to an L level prior to the rise of the next read out clock signal CLK as shown in FIG. 29B, read amplifier isolation designation signal /SAI is pulled up and down in synchronization with the fall and rise of signal RDLI. In this case, isolation between read amplifier 57 and data bus DB is under control of read detect signal RDET.

The usage of NOR circuit 62 provides the advantage that data bus DB can be connected to read amplifier 57 with isolation designation signal /SAI driven to an H level subsequently to transfer circuit 58 shown in FIG. 23 attaining an output high impedance state, even when the timing of read clock signal CLKQ and read detect signal RDET deviate from each other. Thus, the next new data is prevented from being transmitted to output buffer 60 via output latch 59.

Figure 30:
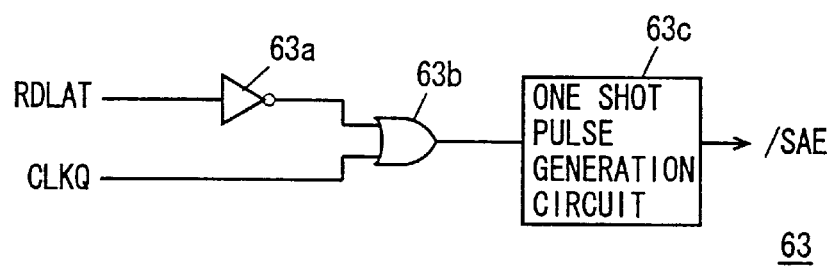
FIG. 30 schematically shows a structure of the gate circuit of FIG. 23.

FIG. 30 shows an example of a structure of gate circuit 63 of FIG. 23. Referring to FIG. 30, gate circuit 63 includes an inverter 63a receiving read data latch designation signal RDLAT, an OR circuit 63b receiving the output signal of inverter 63a and read out clock signal CLKQ, and a one shot pulse generation circuit 63c generating a one shot pulse signal having a predetermined time width in response to a rise of the output signal of OR circuit 63b. One shot pulse generation circuit 63c generates a one shot pulse signal that is driven to an L level from an H level. Read amplifier activation signal /SAE is output from this one shot pulse generation circuit 63c. The operation of gate circuit 63 of FIG. 30 will be described with reference to the signal waveform diagrams of FIGS. 31 and 32.

Figure 31:
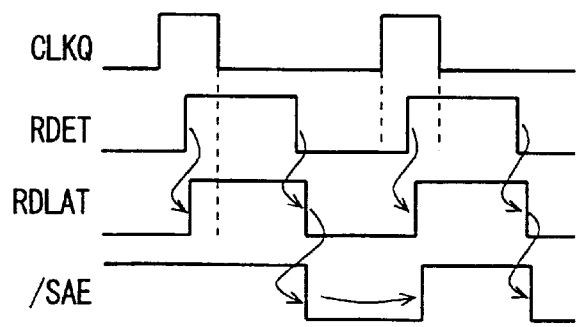
FIGS. 31 and 32 are signal waveform diagrams representing an operation of the gate circuit of FIG. 30.

When the rise of read detect signal RDET is behind the rise of read out clock signal CLKQ as shown in FIG. 31, read data latch designation signal RDLAT is also driven to an H level behind read clock signal CLKQ. One shot pulse generation circuit 63c maintains read amplifier activation signal /SAE at an H level. Assuming that read out clock signal CLKQ now is at an L level and read detect signal RDET is driven to an L level, followed by the fall of read data latch designation signal RDLAT to an L level, the output signal of inverter 63a attains an H level and the output signal of OR circuit 63b is pulled to an H level. In response, one shot pulse generation circuit 63c generates a one shot pulse signal of an L level, and read amplifier activation signal /SAE attains an active state of an L level for a predetermined time.

Figure 32:
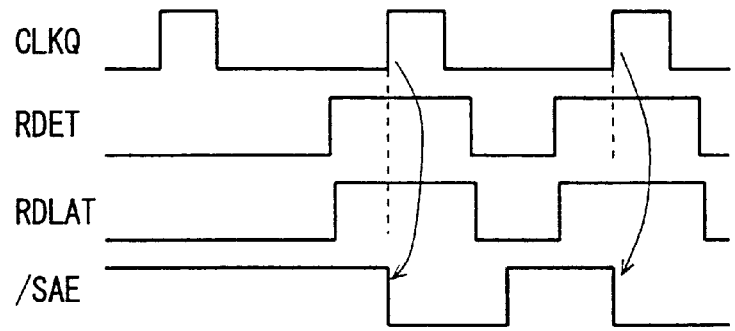

When read detect signal RDET rises before read clock signal CLKQ as shown in FIG. 32, the output signal of OR circuit 63b is pulled up to an H level in response to a rise (activation) of read out clock signal CLKQ. Therefore, read amplifier activation signal /SAE from one shot pulse generation circuit 63c is rendered active in response to activation (rise) of read out clock signal CLKQ. Even if read data latch designation signal RDLAT falls to an L level, read amplifier activation signal /SAE from one shot pulse generation circuit 63c does not change since it is already driven to an L level. By employing a set/reset flip-flop reset by an output signal of the flip-flop delayed by a predetermined time as the structure of the circuitry for generating a one shot pulse signal, two-fold generation of a one shot pulse can be prevented.

By rendering the read amplifier active in response to activation (rise) of read out clock signal CLKQ or inactivation (L level) of read detect signal RDET whichever is earlier, a sense operation can be carried out properly in synchronization with a high speed clock signal even when the CAS latency differs and the clock frequency changes.

Modification

Figure 33:
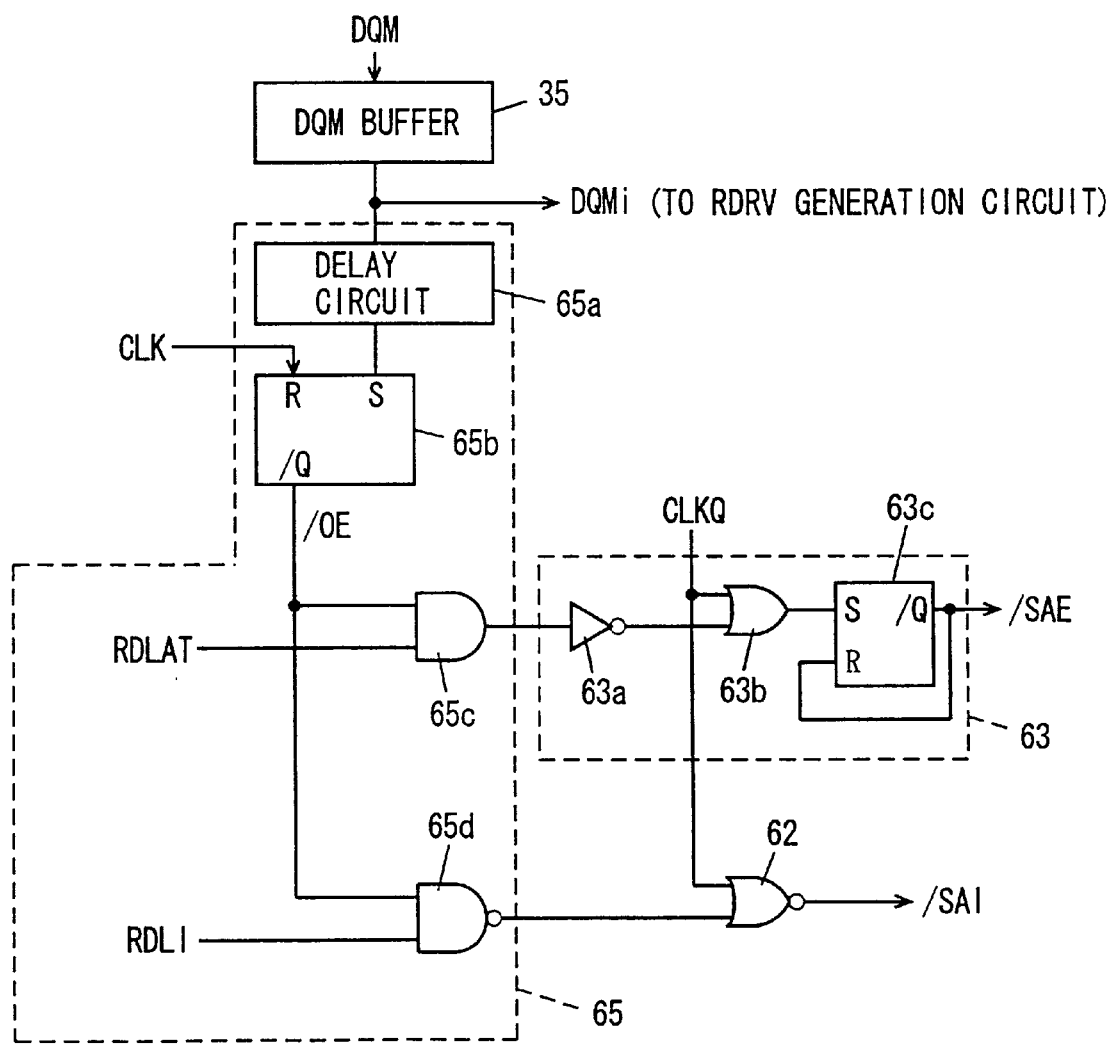
FIG. 33 schematically shows another structure of the DQ control circuit of FIG. 23.

FIG. 33 schematically shows a structure of a modification of the fourth embodiment of the present invention. The structure of DQ control circuit 65 is shown in FIG. 33.

Referring to FIG. 33, DQ control circuit 65 includes a delay circuit 65a delaying mask designation signal DQMi from DQM buffer 35 by a predetermined time, a set/reset flip-flop 66b set when the output signal of delay circuit 65a is rendered active and reset when clock signal CLK is rendered active (rise), an AND circuit 65c receiving an output signal /OE from an output /Q of set/reset flip-flop 65b and read data latch designation signal RDLAT, and an AND circuit 65d receiving output signal /OE from set/reset flip-flop 65b and read amplifier isolation designation signal RDLI. Signals RDLAT and RDLI are generated according to read detect signal RDET as shown in FIG. 28. Mask designation signal DQMi is also applied to the RDRV generation circuit (refer to FIG. 12) to maintain read data driver activation signal RDRV inactive in the clock cycle where mask designation is provided.

Gate circuit 63 generating read amplifier activation signal /SAE has a structure similar to that shown in FIG. 30, provided that a set/reset flip-flop that is set in response to the output signal of OR circuit 63b and reset at an elapse of a predetermined time since activation of the output signal of OR circuit 63b is employed as one shot pulse generation circuit 63c. It is to be noted that the delay circuit applying a reset signal to the reset input R of the flip-flop corresponding to one shot pulse generation circuit 63c is not shown. The operation of DQ control circuit 65 of FIG. 33 will be described with reference to the timing charts of FIGS. 34 and 35.

The operation when the CAS latency is 2 will be first described with reference to FIG. 34.

Figure 34:
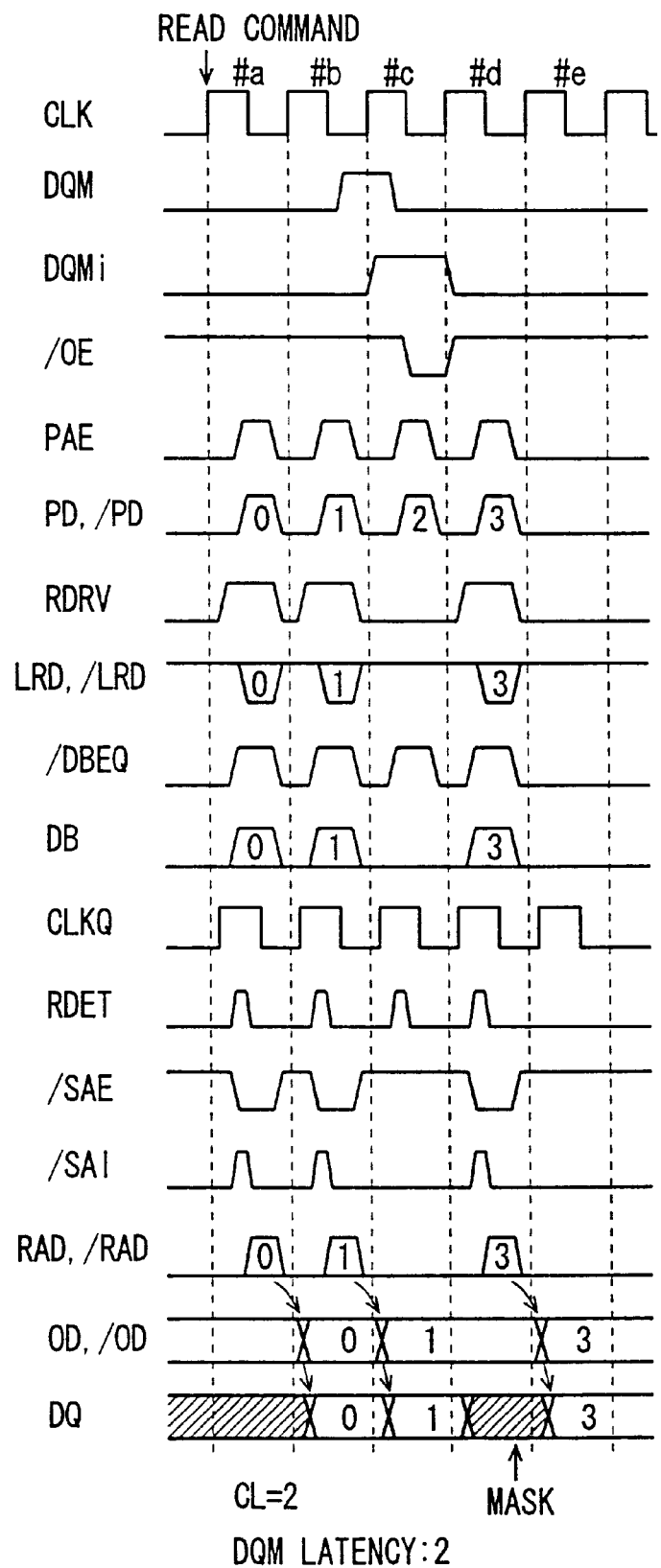
FIGS. 34 and 35 are timing charts representing an operation of the circuit of FIG. 33.

In FIG. 34, each of the control signals of FIG. 23 will be shown together. With application of a read command at clock cycle #a, preamplifier activation signal PAE is rendered active, whereby data of a selected memory is transmitted to output nodes PD and /PD of preamplifier 32. Also, read data driver activation signal RDRV is rendered active, and the data amplified by preamplifier 32 is transmitted to data bus DB. In the data read out operation of read data driver 4#, data bus equalize designation signal /DBEQ attains an H level, whereby the voltage level on data bus DB is driven from the level of the precharged voltage (L level) to the level corresponding to the data read out by read data driver 4#.

Read detect signal RDET is rendered active, and signals RDLAT and RDLI are driven to an active state. Since mask designation signal DQM is at an inactive state of an L level in clock cycle #a, read amplifier isolation designation signal /SAI is pulled up to an H level according to read detect signal RDET, and data bus DB is connected to read amplifier 57. Then, read amplifier activation signal /SAE is rendered active, whereby read amplifier 57 carries out an amplifying operation. Therefore, at clock cycle #a, data is transmitted to internal nodes RAD and /RAD of read amplifier 57, and then is transmitted to output latch 59 via transfer circuit 58 according to read out clock signal CLKQ. Thus, data is output via output buffer 60 in clock cycle #b.

An internal read out operation of the next data is similarly carried out at clock cycle #b.

At clock cycle #c, external mask designation signal DQM is set to an H level. In this state, internal mask designation signal DQMi keeps an H level during clock cycle #c, and signal /OE is rendered active at an L level at an elapse of a predetermined time. Preamplifier activation signal PAE is rendered active independent of internal mask designation signal DQMi, and data is read out also in clock cycle #c. However, read data driver activation signal RDRV is maintained at an inactive state by this internal mask designation signal DQMi, so that the internal nodes of read data driver 4# are maintained at a standby state of an H level.

Data bus equalize designation signal /DBEQ is rendered active according to clock signal CLK to equalize data bus DB. Therefore, data bus DB is maintained at the high impedance state of an L level during clock cycle #c.

Read out clock signal CLKQ and read detect signal RDET are rendered active. Since signal /OE attains an L level, the output signal of AND circuit 65c is maintained at an L level, and read amplifier activation signal /SAE is maintained at an inactive state of an H level. Read amplifier isolation designation signal /SAI is maintained at an L level since the output signal of NAND circuit 65d is at an H level. Therefore, read amplifier 57 maintains an inactive state, and data bus DB and read amplifier 57 are maintained at an isolated state from each other during clock cycle #c. Internal nodes RAD and /RAD of read amplifier 57 are maintained at a standby state of an L level by the equalize circuit, as will be described afterwards. Therefore, data is not read out during clock cycle #c. Output buffer 60 maintains an output high impedance state.

In clock cycle #d, external mask designation signal DQM is set at an L level. Internal mask designation signal DQMi is also set at an L level. Therefore, the data output from preamplifier 32 and read data driver 4# is transmitted to read amplifier 57 to be amplified. The amplified data is externally read out via transfer circuit 58, output latch 59, and output buffer 60.

When mask designation signal DQM is rendered active in the case where the CAS latency is 2, internal data read out is inhibited during that clock cycle. Also, a mask is applied on external read out data at the next clock cycle. Therefore, a mask is applied on the external read out data at the elapse of two clock cycles from the application of mask designation. In FIG. 34, a mask is applied on the data in clock cycle #e.

Figure 35:
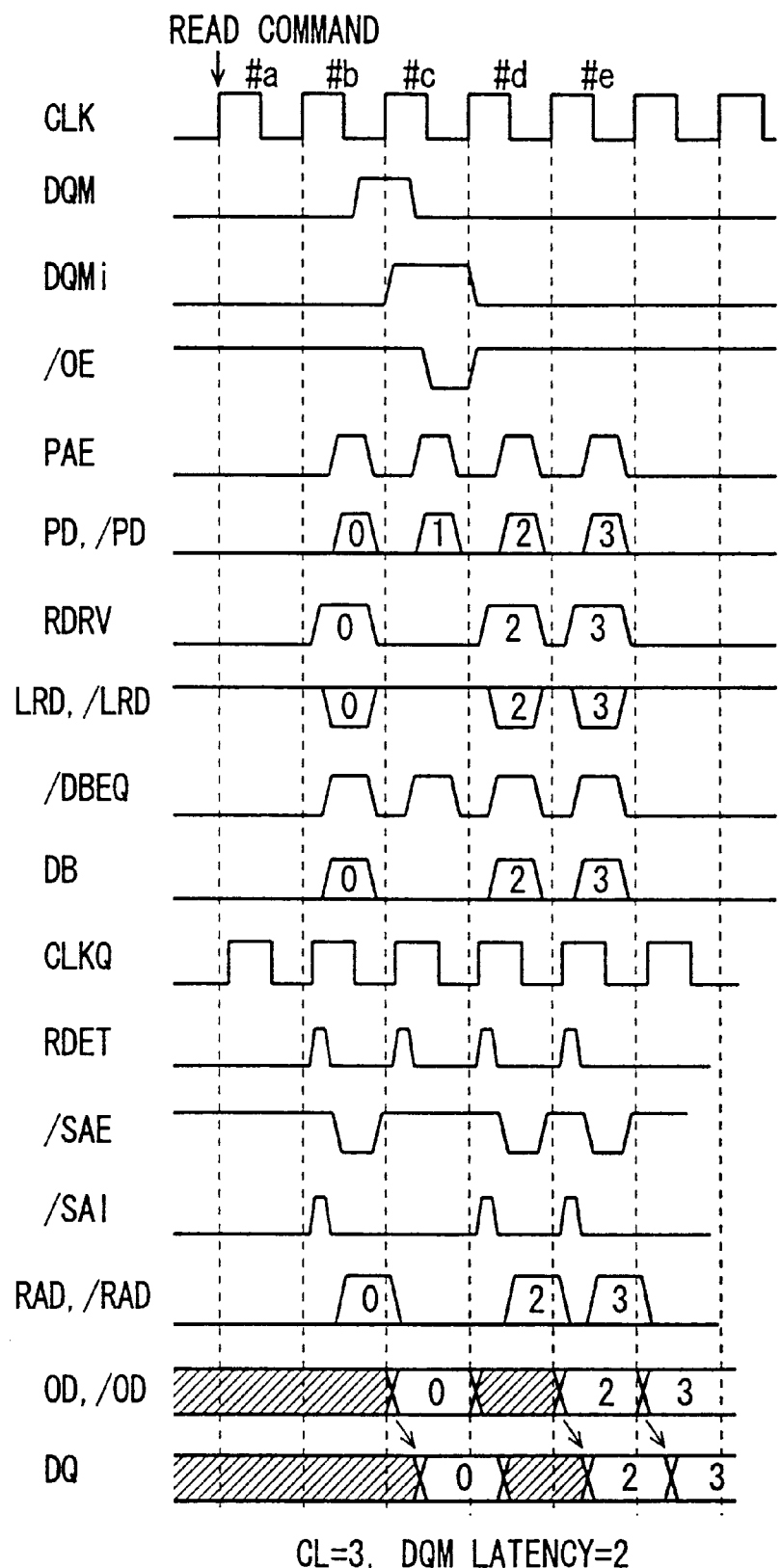

The operation when the CAS latency is 3 will be described with reference to FIG. 35.

A read command is applied at clock cycle #a. Mask designation signal DQM is at an inactive state of an L level, and signal /OE maintains an H level. When the CAS latency is 3, the circuits succeeding the preamplifier will be sequentially rendered active from the next clock cycle #b. Therefore, preamplifier activation signal PAE is rendered active at clock cycle #b, whereby the data is transmitted to data bus DB via the CL shifter and read data driver 4#. Then, read amplifier activation signal /SAE is rendered active, so that the data on data bus DB is amplified. At the next clock cycle #c, data is transmitted to output latch 59 via transfer circuit 58 according to activation (rise) of read clock cycle CLKQ, and then data is transmitted to pad PPD.

When mask designation signal DQM is set at an H level in clock cycle #c, internal mask designation signal DQMi is rendered active at an H level at clock cycle #c. Therefore, although preamplifier activation signal PAE is rendered active in cycle #c, read data driver activation signal RDRV maintains an inactive state, and data bus DB maintains a standby state of an L level. Although read detect signal RDET is rendered active in clock cycle #c, the output signal of AND circuit 65c of FIG. 33 is fixed at an L level since signal /OE is at an active state of an L level, and read amplifier activation signal /SAE maintains the inactive state of an H level. NAND circuit 65d provides an output signal of an H level, and read amplifier isolation designation signal /SAI maintains the L level, and data bus DB is still isolated from read amplifier 57. Therefore, read amplifier 57 does not carry out an amplifying operation, and the internal nodes thereof are held at the standby state of an L level. The output latch also maintains the standby state. Thus, the output buffer attains an output high impedance state, so that data is not output.

When mask designation signal DQM is set to an L level in clock cycle #d, internal mask designation signal DQMi is driven to an L level. Signal /OE is maintained at the H level. Therefore, the data of a memory cell is transmitted to data bus DB according to preamplifier activation signal PAE and read data driver activation signal RDRV. Then, the signal on data bus DB is transmitted to read amplifier 57 via read amplifier isolation gate 56. Since signal /OE is at an H level, read amplifier activation signal /SAE and read amplifier isolation designation signal /SAI are rendered active/inactive according to signal /RDLAT and RDLI. As a result, read amplifier 57 carries out an amplifying operation. The data amplified by read amplifier 57 in clock cycle #d is transmitted to pad PPD via transfer circuit 58, output latch 59, and output buffer 60. A similar data read out operation is carried out in clock cycle #e.

A mask is applied on the output data at an elapse of 2 clock cycles when mask designation is applied in the case where the CAS latency is 3. More specifically, the DQM latency (the number of clock cycles required starting from application of mask designation up to application of a mask on external read out data) is 2 even when the CAS latency is altered. A mask can be applied on output data at a constant DQM latency regardless of the CAS latency.

By driving the read amplifier activation signal to an inactive state according to mask designation signal DQM, the read amplifier can be set at a standby state. The data retained in the read amplifier is transferred to the output latch via transfer circuit 58 in response to activation of read out clock signal CLKQ. Therefore, the output buffer can be set at an output high impedance state according to the retained data of the read amplifier. In contrast to the case where the output buffer itself is set to an output high impedance state according to the mask designation signal, it is not necessary to take into account difference between the timing of data transfer from the read amplifier according to read out clock signal CLKQ and the timing of setting the output high impedance state of the output buffer. Also, it is not necessary to take into account difference in timing between the internal mask designation signal and read out clock signal CLKQ upon application of a mask designation. A mask can be applied properly on the external read out data to reliably prevent erroneous data from being output in masking.

Figure 36:
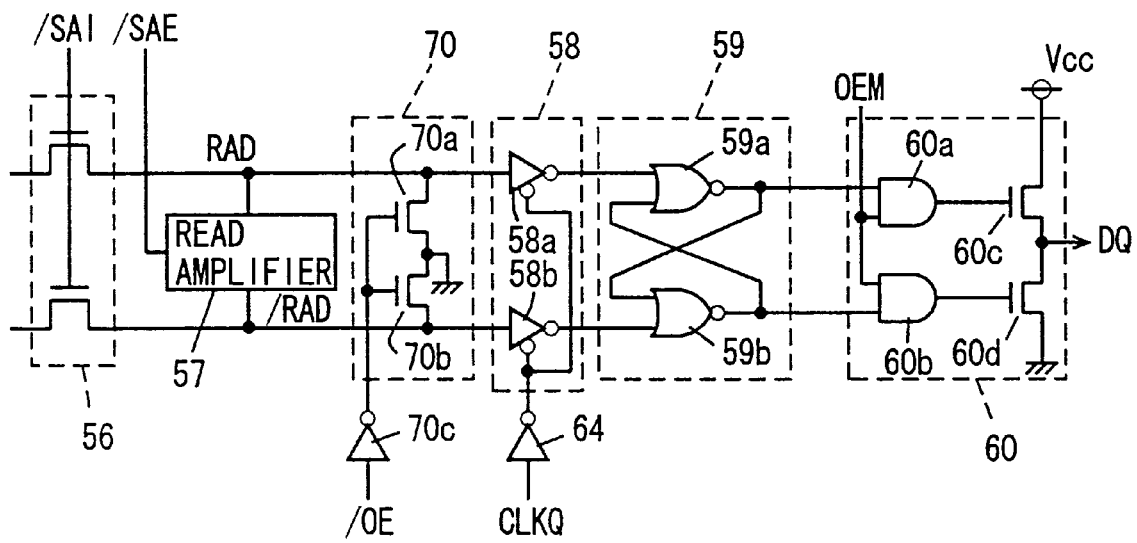
FIG. 36 shows a modification of the semiconductor memory device of FIG. 23.

FIG. 36 specifically shows a structure of the data output portion of the modification of the fourth embodiment. Referring to FIG. 36, an equalize circuit 70 is provided to precharge nodes RAD and /RAD of read amplifier 57 to the level of the ground voltage according to an output signal of inverter 70c that receives signals /OE. Equalize circuit 70 includes n channel MOS transistors 70a and 70b that drive nodes RAD and /RAD to the level of the ground voltage when the output signal of inverter 70c is at an H level.

Output latch 59 is formed of an NOR type flip-flop that latches the output signals of transfer circuit 58. Output latch 59 includes NOR circuits 59a and 59c receiving the output signals of tri-state inverter buffers 58a and 58b, respectively. NOR circuits 59a and 59b have their outputs cross-coupled.

Output buffer 60 includes an AND circuit 60a receiving an output permit signal OEM and an output signal of NOR circuit 59a, an AND circuit 60b receiving output permit signal OEM and an output signal of NOR circuit 59b, an n channel MOS transistor 60c rendered conductive when the output signal of AND circuit 60a is at an H level, to generate read out data of the level of power supply voltage Vcc, and an n channel MOS transistor 60d rendered conductive when the output signal of AND circuit 60b is at an H level, to generate read out data of the level of the ground voltage. Output permit signal OEM is rendered active for the burst length period at the elapse of the (CL−2) clock cycle(s). This output permit signal OEM is a signal independent of the mask designation signal. The operation of the output portion of FIG. 36 will be described with reference to the timing chart of FIG. 37.

Figure 37:
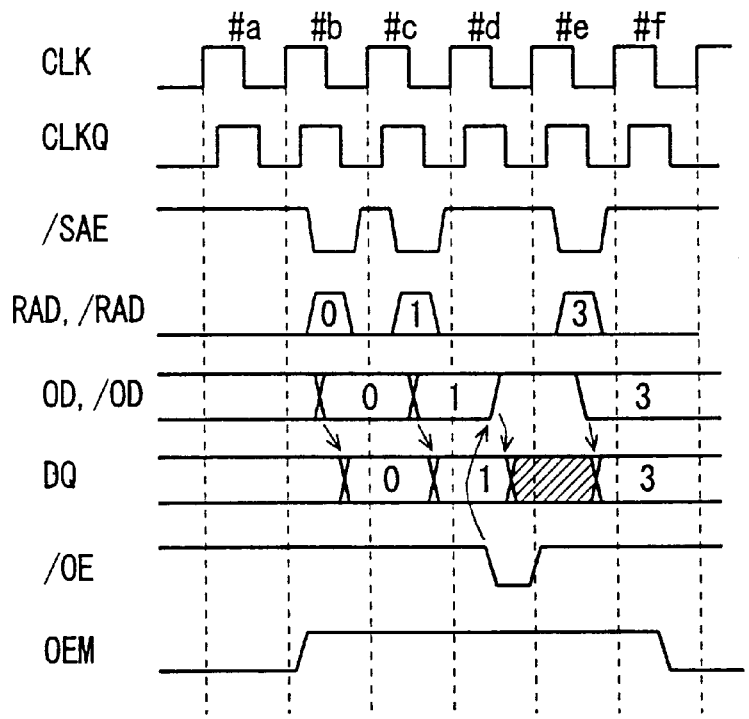
FIG. 37 is a timing chart representing an operation of the output circuit of FIG. 36.

In FIG. 37, the operation when the CAS latency is 2 or 3 is represented.

At clock cycle #b, read amplifier activation signal /SAE attains an active state, whereby read amplifier 57 carries out an amplifying operation. When read out clock signal CLKQ is at an H level during activation of read amplifier activation signal /SAE in clock cycle #b, tri-state inverter buffers 58a and 58b of transfer circuit 58 operate, whereby the data amplified by read amplifier 57 is transferred to output latch 59. Output permit signal OEM is at an active state in clock cycle #b, so that the data transferred to output latch 59 is transmitted to output buffer 60. Output buffer 60 outputs the data transferred from output latch 59 externally via a pad since output permit signal OEM is at an H level.

At clock cycle #c, read amplifier activation signal /SAE is driven to an active state again, so that the data transmitted via read amplifier isolation gate 56 is amplified. The amplified data is transferred to output buffer 60 via transfer circuit 58 and output latch 59.

When signal /OE is driven to an L level according to the mask designation signal in clock cycle #d, read amplifier activation signal /SAE maintains the inactive state of an H level during clock cycle #d. Equalize circuit 70 is responsively rendered active, and nodes RAD and /RAD are fixed at the L level. Meanwhile, read amplifier isolation gate 56 isolates the data bus from read amplifier 57 since isolation designation signal /SAI is at an L level, as described before. Therefore, nodes RAD and /RAD are equalized to the level of the ground voltage by equalize circuit 70. When read out clock signal CLKQ is pulled up to an H level, the L level signal is transmitted to output latch 59 via transfer circuit 58. Tri-state inverter buffers 58a and 58b in transfer circuit 58 both provide signals of an H level, while NOR circuits 59a and 59b provide output signals of an L level. Therefore, even when output permit signal OEM is at an H level, AND circuits 60a and 60b provide output signals of an L level. MOS transistors 60c and 60d are both made non-conductive, and therefore output buffer 60 enters an output high impedance state to allow the output data to be masked.

When the mask is released at clock cycle #e, read amplifier activation signal /SAE is rendered active again. Data is output via read amplifier 57, transfer circuit 58, output latch 59 and output buffer 60. When data of the burst length is read out, output permit signal OEM is driven to an inactive state of an L level at clock cycle #f, whereby output buffer 60 attains an output high impedance state.

By providing an equalize circuit 58 as shown in FIG. 36 to drive nodes RAD and /RAD of read amplifier 57 to the level of the ground voltage equal to that in a standby state when a mask is applied, output buffer 60 can be set reliably to an output high impedance state. This prevents data to be masked from being output even when the timing differs between output signal /OE and read out clock signal CLKQ. More specifically, even when signal /OE attains an active state of an L level when read clock signal CLKQ is at an H level, nodes RAD and /RAD are driven to an L level, and the output signals of transfer circuit 58 attain an H level to allow output buffer 60 to be driven to an output high impedance state.

In the case where signal /OE attains an L level after read clock signal CLKQ is driven to an L level, equalize circuit 70 is rendered active after transfer circuit 58 attains an output high impedance state subsequently to the transfer of the read out data via transfer circuit 58. The signals of the L level at nodes RAD and /RAD are transferred via transfer circuit 58 according to the fall of the next read clock signal CLKQ. Therefore, transfer of the to-be-masked data via transfer circuit 58 can be prevented reliably in either case.

By equalizing nodes RAD and /RAD according to signal /OE even in the case where the CAS latency differs to differ the timing relationship between read out clock signal CLKQ and read amplifier activation signal /SAE, a mask can be properly applied on the output data easily.

According to the fourth embodiment of the present invention, a read amplifier is provided, and the data bus is equalized to the level of the ground voltage for each cycle. The sensing operation is initiated according to read clock signal CLKQ and read detect signal RDET. Therefore, the sensing operation (amplifying operation) of read out data can be carried out properly regardless of the clock frequency. Furthermore, since the read amplifier isolation gate conducts during the equalize period of the data bus, the nodes of the read amplifier can be reset to the L level by the data bus equalize circuit to allow a correct amplifying operation. Also, since a data bus equalize circuit is provided external to the read amplifier, the equalize circuit does not have to be arranged in the proximity of the pad. Accordingly, the area occupied by the output control circuitry of the pad can be reduced to facilitate layout. Since the node potential of the read amplifier is equalized according to equalization of the data bus, a further control signal for equalizing the nodes of the read amplifier is not required. Therefore, timing control is facilitated.

In data output masking, the read amplifier isolation designation signal and the read amplifier activation signal both attain an inactive state. Therefore, a mask can be applied on the output data properly without control of the DQM latency. Also, the data to be masked can be reliably prevented from being output instantaneously in masking. Thus, erroneous operation can be suppressed.

Since an amplifying operation of the data on the data bus equalized to the L level is effected by use of a differential amplifier type read amplifier, a sense amplifying operation can be carried out by activation of the read amplifier even when the amplitude of the data bus is small. A signal of a small amplitude can be transmitted onto the read data bus to carry out high speed signal transmission. Also, an amplifying operation of read out data can be realized correctly. Further, the time required for propagation of the signal on the data bus can be shortened to allow high speed read out.

In the foregoing, the data buses and the read amplifier nodes are described to be equalized to the L level of the ground voltage. However, the level of the equalize voltage may be the power supply voltage Vcc level or an intermediate voltage level.

Fifth Embodiment

Figure 38:
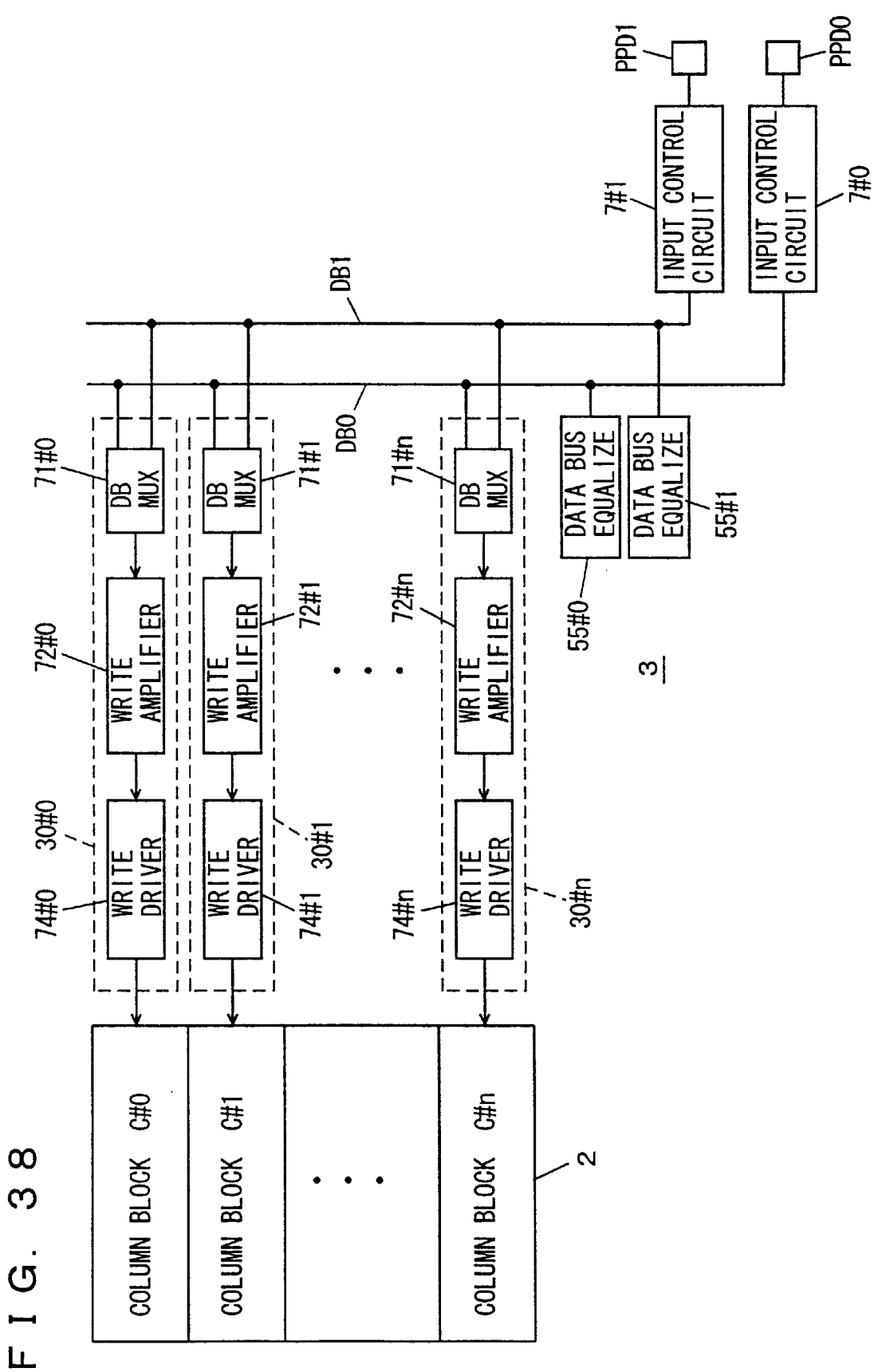
FIG. 38 schematically shows a structure of a main part of a semiconductor memory device according to a fifth embodiment of the present invention.

FIG. 38 schematically shows a structure of a main part of a semiconductor memory device according to a fifth embodiment of the present invention. In FIG. 38, the structure of the data writing portion for one memory array 2 is shown. Memory array 2 is divided into a plurality of column blocks C#0–C#n in FIG. 38. Internal write circuits 30#0–30#n are provided corresponding to column block C#0–C#n, respectively. Internal write circuits 30#–30#n are included in internal write/read circuit 30-0–30-n shown in FIG. 11, respectively.

Data buses DB0 and DB1 transmitting complementary data signals are provided common to column blocks C#0–C#n. Data buses DB0 and DB1 are provided also common to the memory array of the other banks not shown. Input control circuits 7#0 and 7#1 are arranged corresponding to data buses DB0 and DB1, respectively. Input control circuits 7#0 and 7#1 transmit the write data from pads PPD0 and PPD1 located in the neighborhood onto corresponding data buses DB0 and DB1. Data bus equalize circuits 55#0 and 55# are provided to data buses DB0 and DB1, similarly to the previous fourth embodiment.

Internal write circuits 30#0–30#n include data bus selectors (DBMUX) 71#0–71#n selecting either data bus DB0 or DB1 according to the select signal, write amplifiers 72#0–72#n amplifying the output signals of corresponding data bus selectors, and write drivers 74#0–74#n further amplifying the data from corresponding write amplifiers 72#0–72#n to write the amplified data into a selected memory cell. In the structure of write circuits 30#0–30#n of FIG. 38, the write data driver is not configured to be selectively rendered active in response to a select signal, and instead of data bus selectors 71#0–71#n that select a bus according to a select signal are provided. This configuration is made to alleviate the load on the data bus in data reading.

Figure 39:
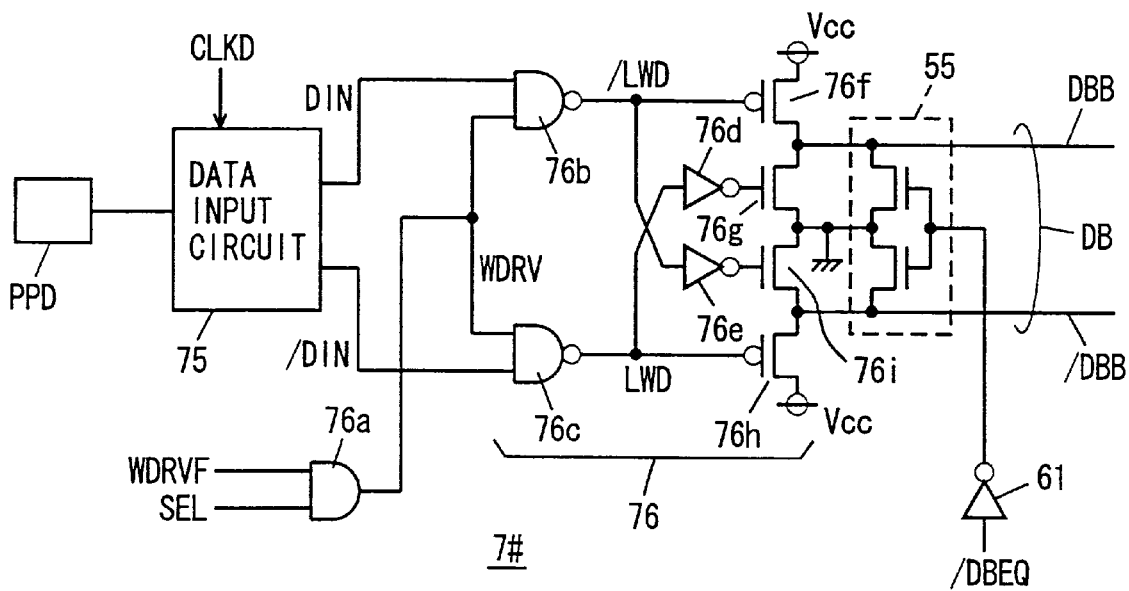
FIG. 39 shows a structure of the input control circuit of FIG. 38.

FIG. 39 shows the structure of input control circuit 7#0–7#1 of FIG. 38. Since input control circuits 7#0 and 7#1 have the same structure, one input control circuit 7# is indicated representatively in FIG. 39.

Referring to FIG. 39, input control circuit 7# includes a data input circuit 75 incorporating the data applied to pad PPD in synchronization with write clock signal CLKD to generate complementary input write data DIN and /DIN, and a write data driver 76 driving data bus lines DBB and /DBB according to complementary write data DIN and /DIN from data input circuit 75 when made active. Data input circuit 75 has a structure similar to that of the DQM buffer of FIG. 14, and incorporates the write data applied to pad PPD in synchronization with write clock signal CLKD to generate complementary internal write data DIN and /DIN. Clock signal CLKD for writing is generated from the clock generation circuit shown in FIG. 9 according to external clock signal ext.CLK.

Write data driver 76 includes an AND circuit 76a receiving write data driver activation signal WDRVF and select signal SEL, a NAND circuit 76b receiving output signal WDRV of AND circuit 76a and data signal DIN from data input circuit 75, a NAND circuit 76c receiving output signal WDRV from AND circuit 76a and complementary data signal /DIN from data input circuit 75, an inverter 76e receiving the output signal of NAND circuit 76b, an inverter 76d receiving the output signal of NAND circuit 76c, a p channel MOS transistor 76f connected between the power supply node and data bus line DBB, and receiving the output signal of NAND circuit 76b at its gate, an n channel MOS transistor 76g connected between data bus line DBB and the ground node, and receiving the output signal of inverter 76d at its gate, an n channel MOS transistor 76i connected between data bus line /DBB and the ground node and receiving the output signal of inverter 76e at its gate, and a p channel MOS transistor 76h connected between the power supply node and data bus line /DBB and receiving the output signal of NAND circuit 76c at its gate.

Write data driver 76 has a structure similar to that of the read data driver, and is selectively set to an operable state according to select signal SEL. In a non-selected write data driver, the output signals of NAND circuits 76b and 76c attain an H level. The output signals of inverters 76d and 76e attain an L level. Therefore, the non-selected write data driver 76 attains an output high impedance state.

Data bus equalize circuit 55 is rendered active in response to data bus equalize designation signal /DBEQ applied via inverter 61a to equalize data bus lines DBB and /DBB to the level of the ground voltage.

Figure 40:
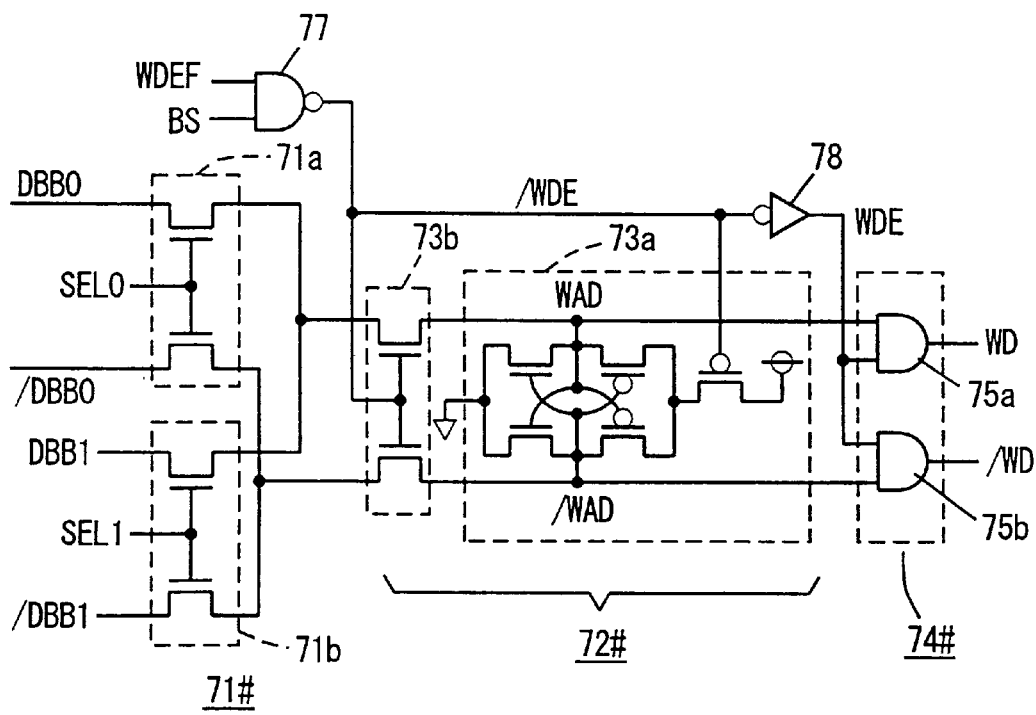
FIG. 40 shows a structure of the internal write circuit of FIG. 38.

FIG. 40 shows a structure of the internal write circuit of FIG. 38. Since internal write circuits provided corresponding to respective column blocks C#0–C#n have the same structure, the structure of one internal write circuit is shown representatively in FIG. 40. As shown in FIG. 38, the internal write circuit includes a data bus selector 71#, a write amplifier 72# and a write driver 74#. Data bus selector 71# includes a select circuit 71a selecting data bus lines DBB0 and /DBB0 provided corresponding to pad PPD0 according to select signal SEL0, and a select circuit 71b selecting data bus lines DBB1 and /DBB1 provided corresponding to pad PPD1 according to select signal SEL1. In FIG. 40, select circuits 71a and 71b are shown being formed by transfer gates.

Write amplifier 72# includes a write amplifier circuit 73a rendered active in response to activation (L level) of write driver activation signal /WDE to carry out a sense amplifying operation, and a write amplifier isolation gate 73b rendered non-conductive in response to activation of write driver activation signal /WDE to isolate write amplifier circuit 73a from the data bus line. Similarly to the read amplifier, write amplifier 73a includes cross-coupled p channel MOS transistors and cross-coupled n channel MOS transistors, and a sense activation transistor (p channel MOS transistor) transmitting the power supply voltage to the cross-coupled p channel MOS transistors in response to activation of write driver activation signal /WDE.

Write driver 74# includes an AND circuit 75a enabled in response to activation of write driver activation signal WDE to amplify the signal on node WAD of the write amplifier to generate internal write data WD via an array IO line (not shown) to a selected memory cell, and an AND circuit 75b enabled in response to activation of write driver activation signal WDE to amplify the signal on node /WAD to generate internal write data /WD onto the array IO line. Write driver 74# is formed of AND circuits 75a and 75b, and maintains internal write data WD and /WD both at the level of the ground voltage in a standby state (when write driver activation signal WD is inactive). However, write driver 74# may be a drive circuit formed of an NAND circuit. The operation of the data write circuitry shown in FIGS. 38 and 40 will now be described with reference to the timing chart of FIG. 41.

Figure 41A:
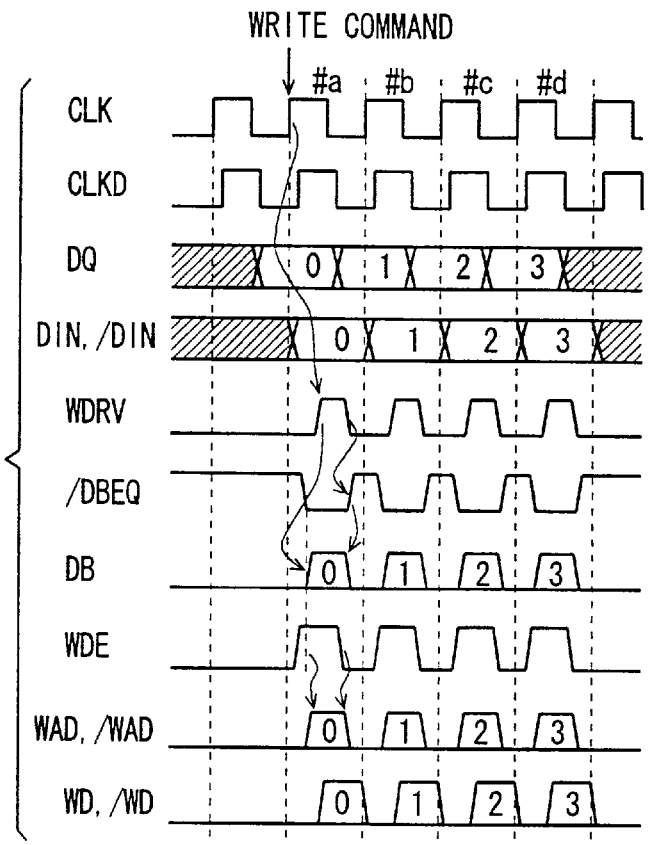
FIGS. 41A and 41B are timing charts representing an operation of the circuit of FIG. 40.

The write operation when the CAS latency is 2 will first be described with reference to FIG. 41A.

A clock signal CLKD for writing is generated at each clock cycle in synchronization with internal clock signal CLK. When a write command is applied at clock cycle #a, the write data is applied to pad PPD at the same time. Data input circuit 75 incorporates the data applied to pad PPD according to write clock signal CLKD to generate internal write data DIN and /DIN. Consider the case where the burst length is 4 and four data are applied successively. When a write command is applied, write data driver activation signal WDRV is driven to an active state. Internal write data signals DIN and /DIN from data input circuit 75 are amplified and transmitted onto data bus DB. The voltage levels of data bus lines DBB and /DBB equalized to the level of the ground voltage by data bus equalize circuit 55 according to data bus equalize designation signal /DBEQ are changed according to the output signal from write data driver 76.

The signal transmitted from write driver 76 onto data bus DB is sent to write amplifier 72# via data bus selector 71#. Write driver activation signal WDEF is pulled up to an H level at clock cycle #a. Block select signal BS is rendered active, and write driver activation signal WDE is pulled up to an H level. At the rise of write driver activation signal WDE, write driver activation signal /WDE is at an L level, and responsively, write amplifier isolation gate 73b enters a non-conductive state, while write amplifier 73a is rendered active at the same time or at a later time. Accordingly, the data transmitted via data bus DB is amplified at high speed by write amplifier 73a, and internal write data WD and /WD are generated via write driver 74#.

By providing a write amplifier isolation gate 75b to the write amplifier, write amplifier 73a can amplify at high speed the signals of a small amplitude transmitted to nodes WAD and /WAD thereof (the load of nodes WAD and /WAD is small in data writing). Accordingly, a signal of a small amplitude can be transmitted onto data bus DB to enable data transfer of high speed. Since data bus DB and write amplifier 73a are connected through series connection of the transfer gates, the circuit structure for data bus selection and write amplifier isolation can be simplified to reduce the area occupied thereby.

Figure 41B:
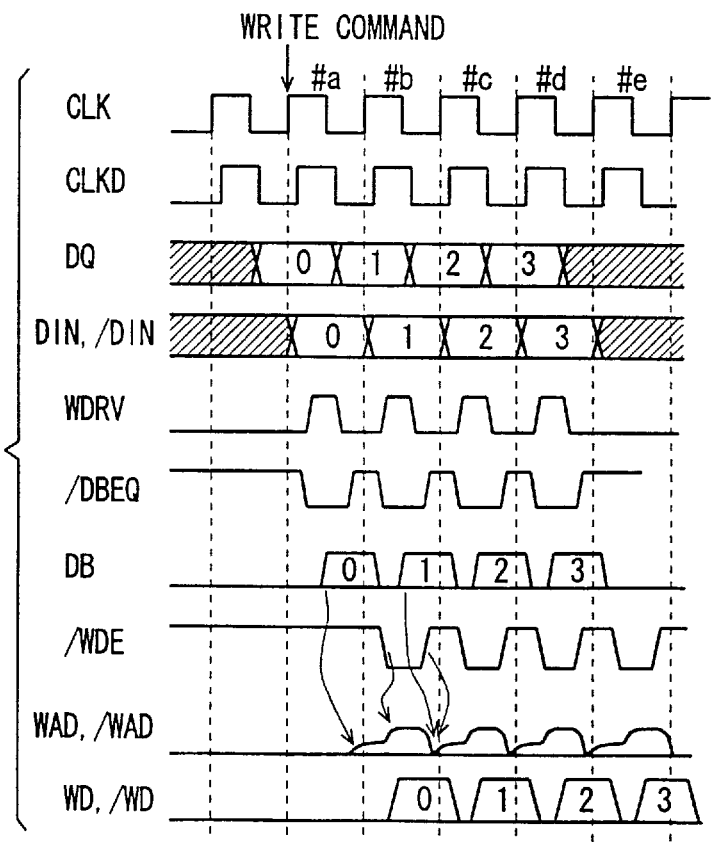

The operation of writing when the CAS latency is 3 will be described with reference to FIG. 41B. When a write command is applied at clock cycle #a, data input circuit 75 generates internal write data signals DIN and /DIN in synchronization with write clock signal CLKD. Write data drive activation signal WDRV is rendered active, whereby write data is transmitted onto data bus DB. The period of approximately one clock cycle is required for the data signal to be transmitted to write amplifier 72# via data bus DB when the CAS latency is 3. The signal potential on nodes WAD and /WAD of write amplifier circuit 73a is changed according to the write data in clock cycle #b. Then, write driver activation signal WDEF is rendered active in this clock cycle #b, whereby the signals of a small amplitude transmitted onto nodes WAD and /WAD are amplified, and then write data WD and /WD are generated by write driver 74#. Upon completion of the amplifying operation by write amplifier 72#, write amplifier isolation gate 73b is rendered conductive to connect data bus DB to nodes WAD and /WAD. The voltages of nodes WAD and /WAD are equalized to the level of the ground voltage by data bus equalize circuit 55. The write data applied at each of clock cycles #a, #b, #c and #d is generated as internal write data WD and /WD in clock cycles #b, #c, #d and #e, and is written into the selected memory cell over the period of approximately one clock cycle.

In the foregoing, data bus DB is so described as to be equalized to the level of the ground voltage. Alternatively, data bus DB may be equalized to the level of an intermediate voltage or the power supply voltage. When data bus DB is equalized to the level of the power supply voltage, data bus select circuits 71a and 71b in data bus selector 71# and write amplifier isolation gate 73b are replaced with p channel MOS transistors.

Control signals WDRVF and WDEF are generated from the write control circuit when a write command is applied and write amplification signal φw is rendered active using the control circuitry described in the previous first to third embodiments. Block select signal BS is also shifted by a predetermined time according to the CAS latency in data writing. This shifting can be easily implemented by using the shifter of FIG. 12. Data bus equalize designation signal /DBEQ is generated according to signal WDRF.

Modification

Figure 42:
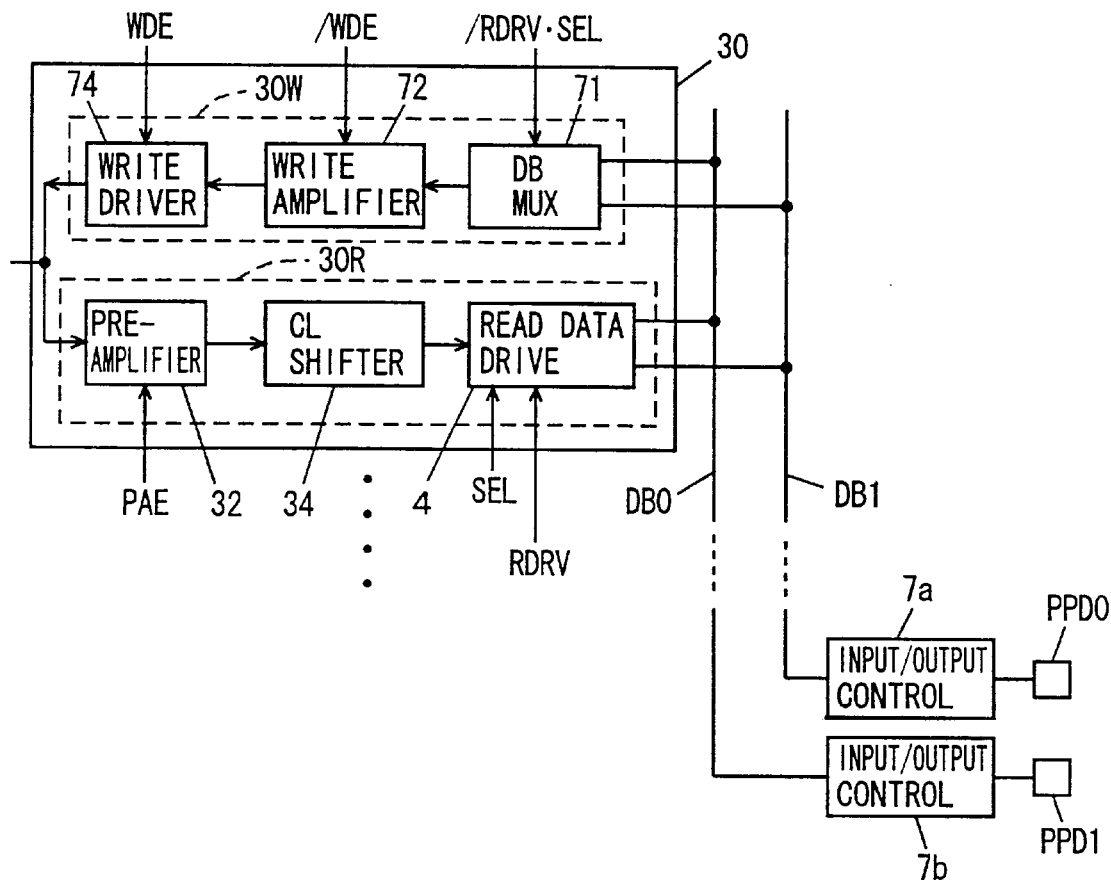
FIG. 42 schematically shows a structure of a modification of the fifth embodiment.

FIG. 42 shows a structure of a modification of the fifth embodiment of the present invention. In FIG. 42, an internal read/write circuit 30 is provided to data buses DB0 and DB1. As described in the previous second embodiment, a plurality of internal read/write circuits are coupled in parallel to data buses DB0 and DB1. One internal read/write circuit 30 representatively is shown in FIG. 42.

Internal read/write circuit 30 includes an internal read circuit 30R (30#ia) for reading out data, and an internal write circuit 30W (30#i) for writing data. Internal read circuit 30R includes a preamplifier 32 rendered active in response to preamplifier activation signal PAE (including block select signal) to amplify the read out memory cell data, a CL shifter 34 shifting (delaying) the output signal of preamplifier 32 by a predetermined time (CAS latency −2 clock cycles), and a read data drive circuit 4 rendered active in response to activation of select signal SEL and read data drive activation signal RDRV to amplify the data from CL shifter 34 and transmit the amplified data to data bus DB0 or DB1.

Internal write circuit 30W includes a data bus selector (DBMUX) 71 enabled selectively in response to an ANDed signal of select signal SEL and read data drive activation signal /RDRV (/RDRV-SEL) to select data bus DB0 or DB1, a write amplifier 72 rendered active in response to activation of write drive activation signal /WDE to amplify the data from data bus selector 71, and a write driver 74 rendered active in response to activation write driver activation signal WDE to amplify the data amplified by write amplifier 72 and transmitting the amplified data onto an array IO line (not shown).

Read data drive circuit 4 transmits data to data bus DB0 or DB1 according to select signal SEL when read drive activation signal RDRV is active as shown in FIG. 22. Read data driver activation signal RDRV does not include a block select signal. When read data drive circuit 4 is rendered active, data bus selector 71 is at a non-conductive state. More specifically, all the data bus selectors coupled to data buses DB0 and DB1 are set to a non-conductive state when read data driver activation signal RDRV is active. Accordingly, internal write circuit 30W is isolated from data buses DB0 and DB1 to alleviate the load of read data drive circuit 4. As a result, data can be transmitted speedily to input/output control circuits 7a and 7b via data bus DB0 and/or DB1.

Figure 43:
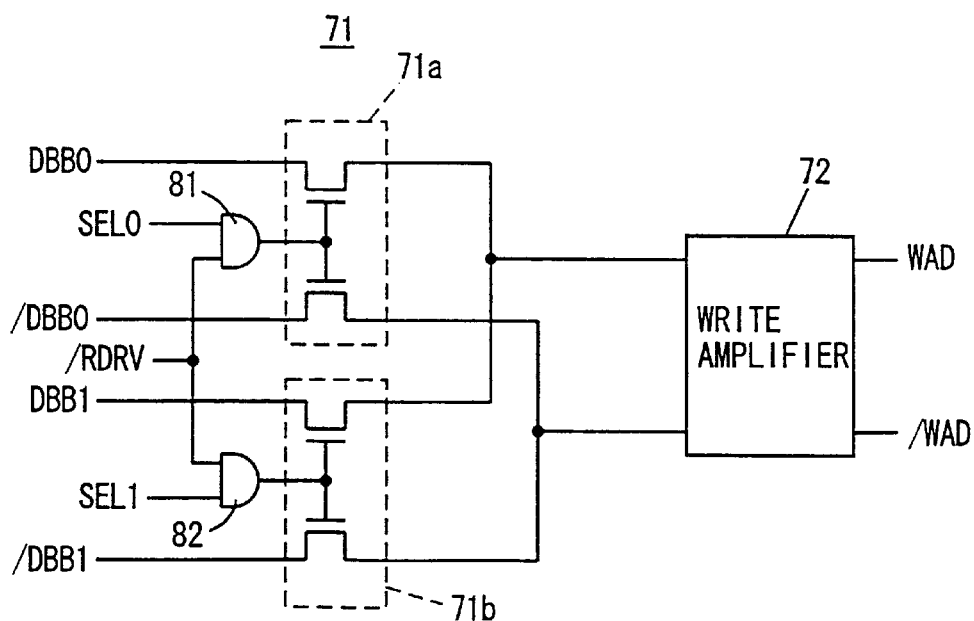
FIG. 43 schematically shows a structure of the data bus selector of FIG. 42.

FIG. 43 schematically shows a structure of the data bus selector of FIG. 42. Referring to FIG. 43, data bus selector 71 includes a bus select circuit 71a provided corresponding to data bus lines DBB0 and /DBB0 and having its conductive/non-conductive state controlled by AND circuit 81 that receives select signal SEL0 and read data driver activation signal /RDRV, and a select circuit 71b provided corresponding to data bus lines DBB1 and /DBB1, and selectively set to a conductive/non-conductive state according to the signal from AND circuit 82 receiving select signal SEL1 and read data driver activation signal /RDRV.

When read data driver activation signal RDRV is active, signal /RDRV attains an L level, and select circuits 71a and 71b both attain a non-conductive state. Select circuits 71a and 71b are coupled to write amplifier 72. Therefore, by setting data bus selector 71 to a non-conductive state during operation of read data drive circuit 4, data bus lines DBB0, /DBB0, DBB1 and /DBB1 can be isolated from write amplifier 72 to alleviate the loads on bus lines DBB0, /DBB0, DBB1 and /DBB1. Thus, read out data can be transferred at high speed.

In the structure of FIG. 42, read data driver activation signal RDRV may be ANDed with the bank address signal so that read data drive activation signal RDRV may be rendered active only in a selected bank.

According to the fifth embodiment of the present invention, complementary data signals are transmitted, and the write amplifier is rendered active with the write amplifier isolated from the data bus in a data write operation. Therefore, a signal of a small amplitude can be transmitted via the data bus for data writing. Since connection between the data bus and the write amplifier is effected by use of a transfer gate, the circuit structure is simplified. As a result, the area occupied by the circuitry is reduced.

Since all the data bus selectors are set at a non-conductive state when the read data drive activation signal is active, the load on the data bus is reduced to allow data to be transmitted at high speed.

Sixth Embodiment

Figure 44:
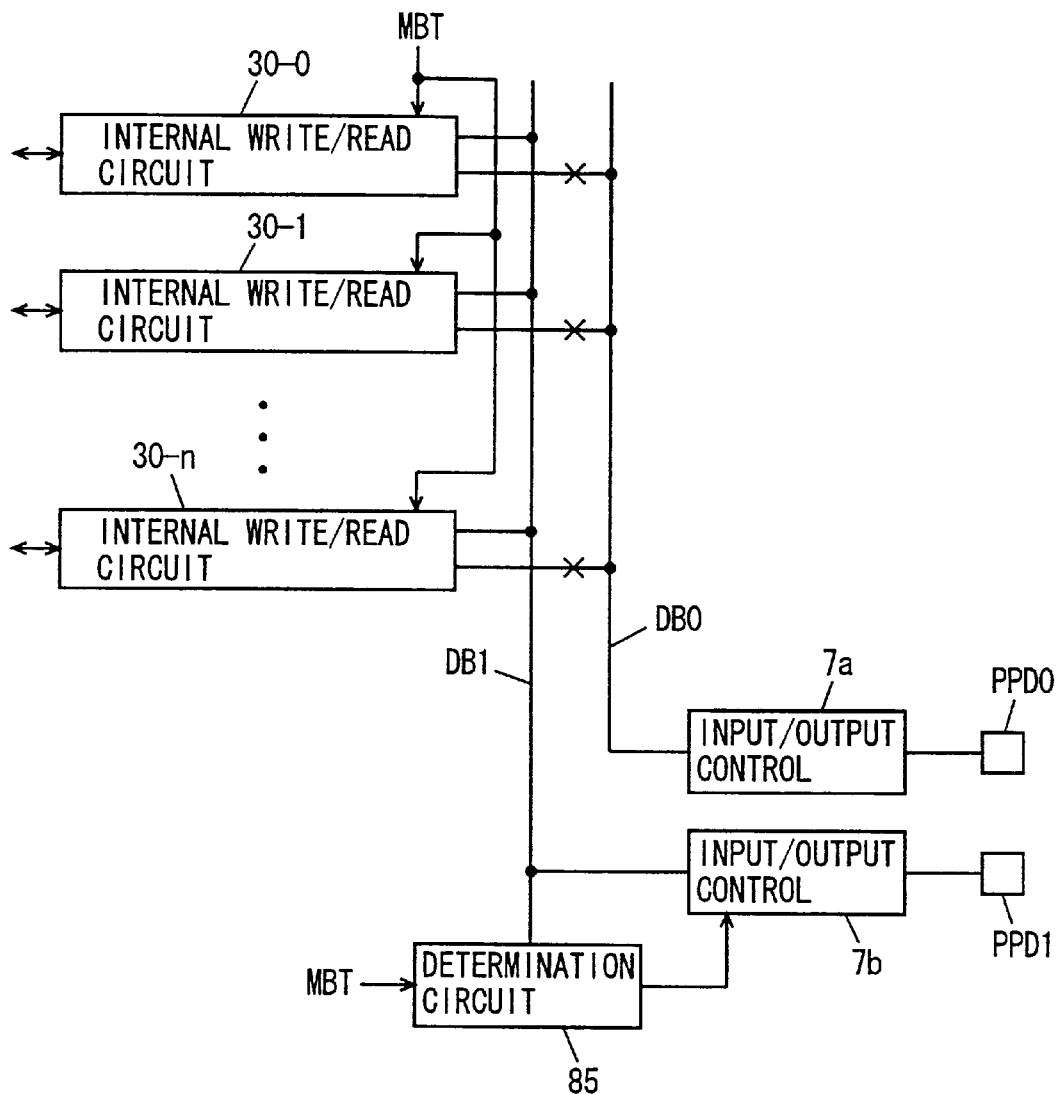
FIG. 44 schematically shows a structure of a main part of a semiconductor memory device according to a sixth embodiment of the present invention.

FIG. 44 schematically shows a structure of a main part of a semiconductor memory device according to a sixth embodiment of the present invention. In FIG. 44, internal read/write circuits 30-0~30-n are connected in common to data buses DB0 and DB0. Internal read/write circuits 30-0~30-n have their connection paths forcibly set to data bus DB1 according to a multibit test mode designation signal MBT. Therefore, even in the case where internal read/write circuits 30-0~30-n are coupled to data bus DB0 in a ×2-bit configuration, these internal read/write circuits 30-0~30-n are coupled to data bus DB1 in a multi-bit test mode. When data of 2 bit is read out from each column block in the memory array corresponding to these internal read/write circuits 30-0~30-n, all the data are transmitted onto data bus DB1 in the multibit test mode. In a ×1-bit configuration, only data bus DB1 is used. Data buses DB0 and DB1 are coupled to pads PPD0 and PPD1 via input/output control circuits 7a and 7b, respectively. A determination circuit 85 for determining whether the logic levels of the complementary data signals transmitted onto data bus DB1 are identical or not in a multi bit test mode is provided to data bus DB1. The output signal of determination circuit 85 is provided to pad PPD1 via the read amplifier in input/output control circuit 7b, of which structure will be described in detail afterwards.

Figure 45:
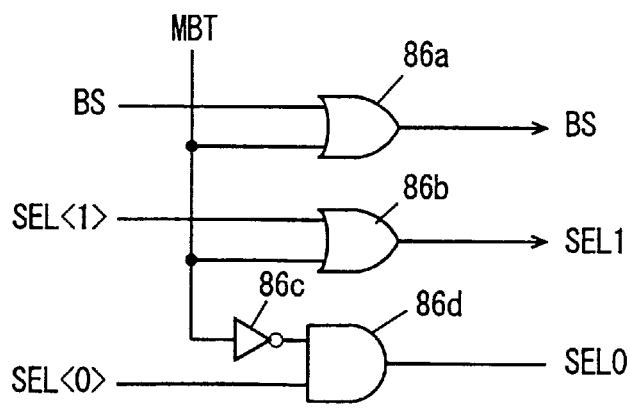
FIG. 45 schematically shows a structure of select signal generation circuitry according to the fifth embodiment of the present invention.

FIG. 45 schematically shows a stricture of the portion for generating a select signal and a block select signal in a multibit test mode. Referring to FIG. 45, the control signal generation circuitry includes an OR circuit 86a receiving a multibit test mode designation signal MBT and a block select signal BS, an OR circuit 86b receiving multibit test mode designation signal MBT and a bus select signal SEL<1>, an inverter 86c receiving multibit test mode designation signal MBT, and an AND circuit 86d receiving the output signal of inverter 86c and a bus select signal SEL<0>. OR circuit 86a outputs the block select signal BS that is applied to internal read/write circuits 30-0~30-n. OR circuit 86b outputs select signal SEL1. AND circuit 86d provides select signal SEL0. Therefore, block select signals BS is at a selected state in the multibit test mode, and block select signals for all the column blocks in the memory array are selected and all the internal read/write circuits 30-0~30-n shown in FIG. 44 operate in parallel. Select signal SEL1 is forcibly set to an active state of an H level in the multibit test mode, and internal read/write circuits 30-0~30-n are all coupled to data bus DB1 regardless of the word configuration. Select signal SEL0 is forcibly set to an inactive state of an L level in the multibit test mode, whereby internal write/read circuits 30-0~30-n are isolated from data bus DB0.

According to the above-described structure, data can be written and read out utilizing complementary data bus in the multibit test mode.

Figure 46:
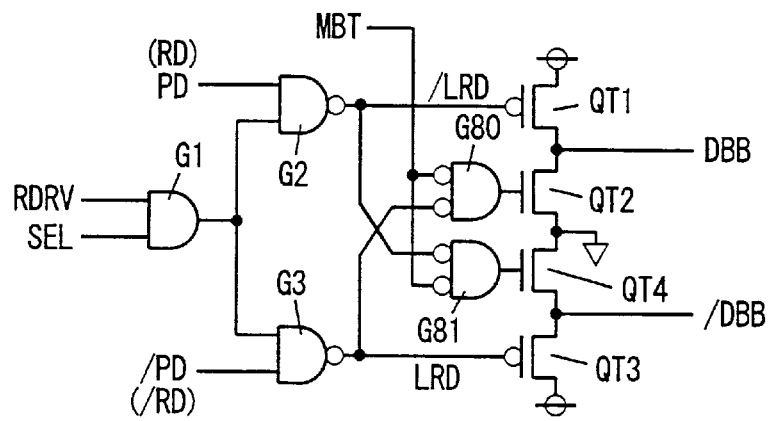
FIG. 46 schematically shows a structure of the read data driver in the internal read/write circuit of FIG. 44.

FIG. 46 shows a structure of a read data driver included in internal read/write circuits 30-0~30-n of FIG. 44. The read data driver of FIG. 46 differs from the read data driver of FIG. 8 in that NOR circuits G80 and G81 are used instead of inverters G4 and G5. NOR circuit G80 receives multibit test mode designation signal MBT and the signal of a node LRD. NOR gate circuit G81 receives multibit test mode designation signal MBT and the signal of a node /LRD. The remaining structure is similar to that of FIG. 8, and corresponding components have the same reference characters allotted.

In a normal operation mode, multibit test mode designation signal MBT is at an L level, and NOR circuits G80 and G81 function as inverters. Select signal SEL is determined according to the word configuration. In response to activation of read data driver activation signal RDRV, the read data driver drives data bus lines DBB and /DBB according to the signals of nodes PD and /PD (preamplifier output node) or nodes RD and /RD (CL shifter output nodes).

In the multibit test mode, select signal SEL is forcibly set at an H or L level regardless of the word configuration. Where the read data driver is connected to the corresponding data bus, select signal SEL attains an H level, and the read data driver operates according to activation of read data driver activation signal RDRV. Where the read data driver is isolated from the corresponding bus, select signal SEL is at an L level and the read data driver maintains the output high impedance state even when read data driver activation signal RDRV is rendered active. NOR circuits G80 and G81 have their output signals fixed at an L level in the multibit test mode. MOS transistors QT2 and QT4 maintain a non-conductive state. Data bus lines DBB and /DBB are precharged to the L level of the ground voltage as described in the previous third and fourth embodiments. In reading out data, one of the output signals of NAND circuits G2 and G3 attain an H level, and the other output signal attains an L level. Therefore, one of MOS transistors QT1 and QT3 is rendered conductive, whereby one of data bus lines DBB and /DBB is driven to an H level. A plurality of read data drivers are wired-connected in parallel to data bus lines DBB and /DBB.

In writing data in the multibit test mode, bus connection is effected by the data bus selector described in the previous sixth embodiment. The column blocks in the memory array are selected at the same time, so that the same data bit is written in parallel via pad PPD1 shown in FIG. 44, the write data driver included in input/output control 7b, and data bus DB1. In a read out operation, data are read out in parallel from the memory cells into which data are written simultaneously. The read out operation is carried out in parallel by internal write/read circuits 30-0~30-n.

Figure 47:
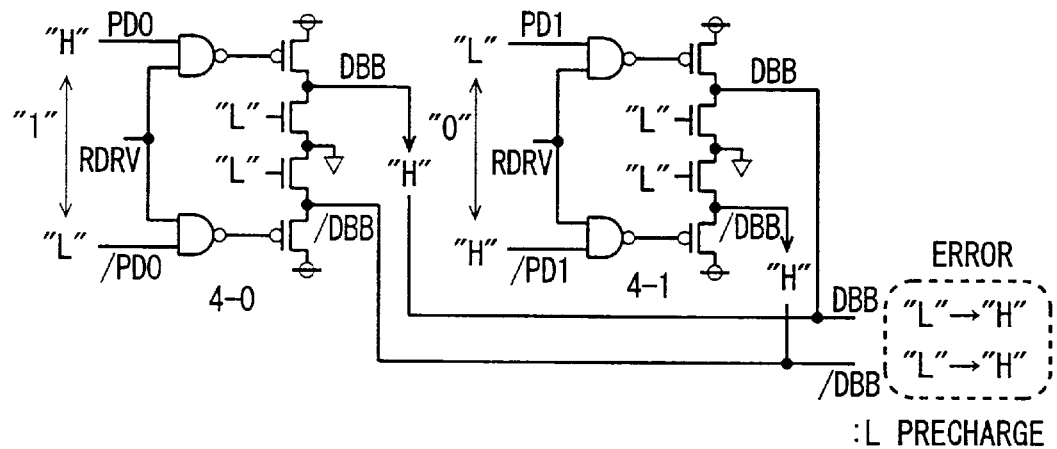
FIG. 47 shows an example of output data in a multi-bit test according to the fifth embodiment of the present invention.

Consider the operation of two read data drivers 4-0 and 4-1 as shown in FIG. 47. It is assumed that data "1" and data "0" are read out to read data drivers 4-0 and 4-1, respectively. In this case, nodes PD0 and /PD0 attain an H level and an L level, respectively, while nodes PD1 and /PD1 attain an L level and an H level, respectively. In the multibit test mode, the n channel MOS transistor that discharges data bus lines DBB and /DBB to the level of the ground voltage receives a signal of an L level at its gate to attain a non-conductive state. Therefore, a signal of an H level is output from read data driver 4-1 via a corresponding p channel MOS transistor to data bus line DBB. Also, read data driver 4-0 maintains data bus line /DBB at a high impedance state. In read data driver 4-1, data bus line DBB is set at a high impedance state, and a signal of an H level is output to data bus line /DBB. Therefore, data bus lines DBB and /DBB are both driven to an H level by read data drivers 4-0 and 4-1. Identification is made that data of different logic levels are read out when the voltages of data bus lines DBB and /DBB both are at an H level. It can therefore be recognized that there is a defective memory cell in the memory cells selected simultaneously. Determination is made that data is read out properly when the voltages of one of data bus lines DBB and /DBB is at an L level.

Figure 48:
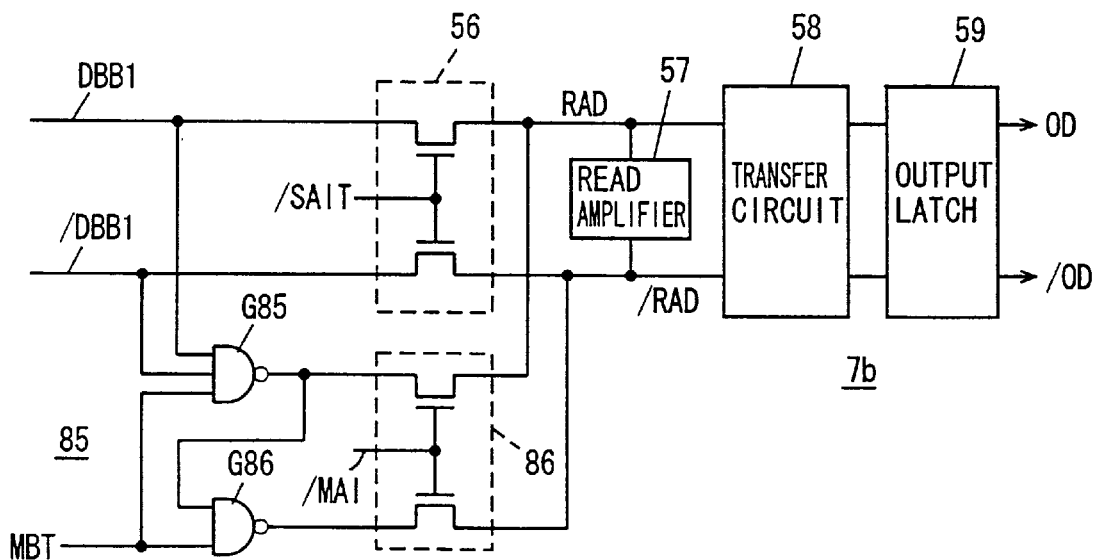
FIG. 48 shows a structure of the determination circuit of FIG. 44.

FIG. 48 schematically shows a structure of determination circuit 85 of FIG. 44. Referring to FIG. 48, determination circuit 85 includes a NAND circuit G85 receiving the signal on data bus lines DBB1 and /DBB1 and multibit test mode designation signal MBT, a NAND circuit G86 receiving the output signal of NAND circuit G85 and multibit test mode designation signal MBT, and a test isolation gate 86 selectively rendered conductive when isolation designation signal /MAI is inactive, to couple the output signals of NAND circuits G85 and G86 to nodes RAD and /RAD of read amplifier 57. Test isolation gate 86 is provided corresponding to read amplifier 57 and in parallel to read amplifier isolation gate 56 that attains a non-conductive state when read amplifier isolation designation signal /SAIT is active. Similarly to the previous fourth embodiment, the output control circuit includes transfer circuit 58 transferring the signals of nodes RAD and /RAD of read amplifier 57, output latch 59 latching the output signal of transfer circuit 58, and an output buffer not shown.

When multibit test mode designation signal MBT is inactive, the output signals of NAND circuits G85 and G86 are fixed at the H level. Under this state, test isolation gate 86 is non-conductive, so that the output signals of NAND gate circuits G85 and G86 exert no adverse effect on the amplifying operation of read amplifier 57. In a normal operation mode, read amplifier isolation gate 56 is selectively rendered conductive/non-conductive according to read amplifier isolation designation signal /SAIT, whereby data bus lines DBB1 and /DBB1 are coupled to read amplifier 57.

In the multibit test mode, multibit test mode designation signal MBT is at an H level. When one of data bus lines DBB1 and /DBB1 is at an L level, NAND circuit G85 provides an output signal of an H level whereas NAND circuit G86 provides an output signal of an L level. Respective signals of an H level and an L level are transmitted to nodes RAD and /RAD to be amplified by read amplifier 57. Then, data is read out via transfer circuit 58 and output latch 59 to result in an output of data "1". When data bus lines DBB1 and /DBB1 both attain an H level, NAND circuit G85 provides an output signal of an L level whereas NAND circuit G86 provides an output signal of an L level, and these output signals are amplified by read amplifier 57. The data read out via transfer circuit 58 and output latch 59 is "0". Determination can be made whether a selected memory cell is normal/abnormal by checking the logic level of this read out data.

In a data read out operation in the multibit test mode, NAND circuits G85 and G86 are used, so that data bus lines DBB1 and /DBB1 exhibit the voltage swing of amplitude of the CMOS level. Determination is made only on whether writing/reading of a memory cell data has been carried out properly, the measurement of the operation timing margin and the like is not carried out in the multibit test mode. In the multibit test mode, the operating frequency is slow, so that data bus lines DBB1 and /DBB1 can be driven at the CMOS level sufficiently.

Due to the structure in which all read data drivers are coupled commonly to a data bus, and the data bus line voltage is altered in one direction from the equalize voltage (voltage in a standby state), these read data drivers can be wired-connected to properly transmit the read out data onto the data bus line.

Figure 49:
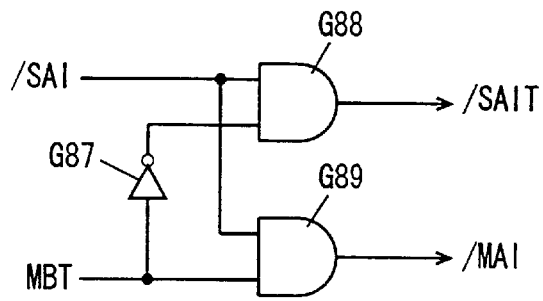
FIG. 49 shows a structure of control signal generation circuitry of FIG. 48.

FIG. 49 schematically shows a structure of the portion for generating isolation designation signals /SAIT and /MAI.

Referring to FIG. 49, the isolation designation signal generation circuitry includes an inverter G85 receiving multibit test mode designation signal MBT, an AND gate G88 receiving read amplifier isolation designation signal /SAI and the output signal of inverter G86, and an AND circuit G89 receiving read amplifier isolation designation signal /SAI and multibit test mode designation signal MBT. Isolation designation signal /SAIT is output from AND circuit G88 to be applied to read amplifier isolation gate 56 shown in FIG. 48. Isolation control signal /MAI is output from AND circuit G89 to be applied to test isolation gate 86 shown in FIG. 48.

In the structure shown in FIG. 49, isolation designation signal /SAIT from AND circuit G88 is always at an L level, so that read amplifier isolation gate 56 of FIG. 48 maintains the conductive state in a multibit test mode. The output signal of AND circuit G89 is altered according to read amplifier isolation designation signal /SAI, whereby test isolation gate 86 is driven to a conductive/non-conductive state. Therefore, the output signal of determination circuit 85 can be transmitted to read amplifier 57 at a timing identical to that of a normal operation mode.

In a normal operation mode, multibit test mode designation signal MBT is at an L level, and AND circuit G88 has its output signal altered according to read amplifier isolation designation signal /SAI, whereas AND circuit G89 has its output signal fixed to the L level. Therefore, test isolation gate 86 is at a non-conductive state in a normal operation mode, so that no adverse effect is exerted on the read out operation. According to the sixth embodiment of the present invention, a plurality of read data drivers are coupled in common to the data bus line to determine the match/mismatch of the logic levels of the signals on the data bus lines in a multibit test mode used. It is therefore not necessary to additionally provide a bus line exclusively used for testing. The same data bus can be used for a normal operation mode and for a multibit test mode. Thus, the area occupied by the interconnection lines can be reduced.

In the foregoing, the data bus lines are described to be equalized to the L level. However, the data bus lines may be equalized to an intermediate voltage level or a power supply voltage level. The structure of the read data driver is appropriately modified according to the equalize voltage of each data bus line.

Seventh Embodiment

Figure 50:
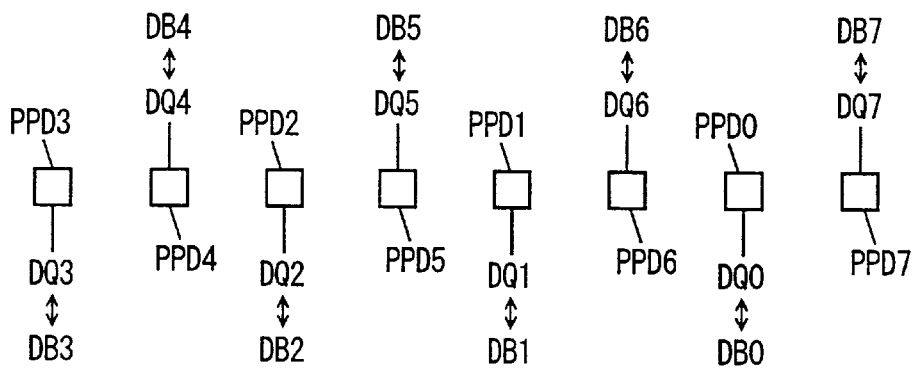
FIG. 50 shows a pad arrangement of a semiconductor memory device according to a seventh embodiment of the present invention.

FIG. 50 schematically shows a structure of the pad arrangement of a semiconductor memory device according to the present invention. In FIG. 50, eight pads PPD0–PPD7 are arranged in alignment. The pad arrangement assumes the LOC (Lead On Chip) structure. Pads PPD0, PPD1, PPD2 and PPD3 input/output data DQ0, DQ1, DQ2 and DQ3 via lead frame extending at one side. Pads PPD4–PPD7 arranged between pads PPD0–PPD3 input/output data DQ4–DQ7 via the lead frame extending at the other side. Input/output circuits are arranged in the proximity of pads PPD0–PPD7.

Consider the case where the number of bits of the input/output data, i.e., the word configuration, is switched between a ×8-bit configuration and a ×4-bit configuration in the semiconductor memory device of the present invention. In the ×8-bit configuration, all pads PPD0–PPD7 are used. In the ×4-bit configuration, pads PPD0, PPD2, PPD4 and PPD6 are used. In a multibit test mode, pads PPD0, PPD2, PPD4 and PPD6 out of the eight pads of PPD0–PPD7 are used in the ×4-bit configuration. A data bus is arranged in a one-to-one correspondence to pads PPD0–PPD7.

Figure 51:
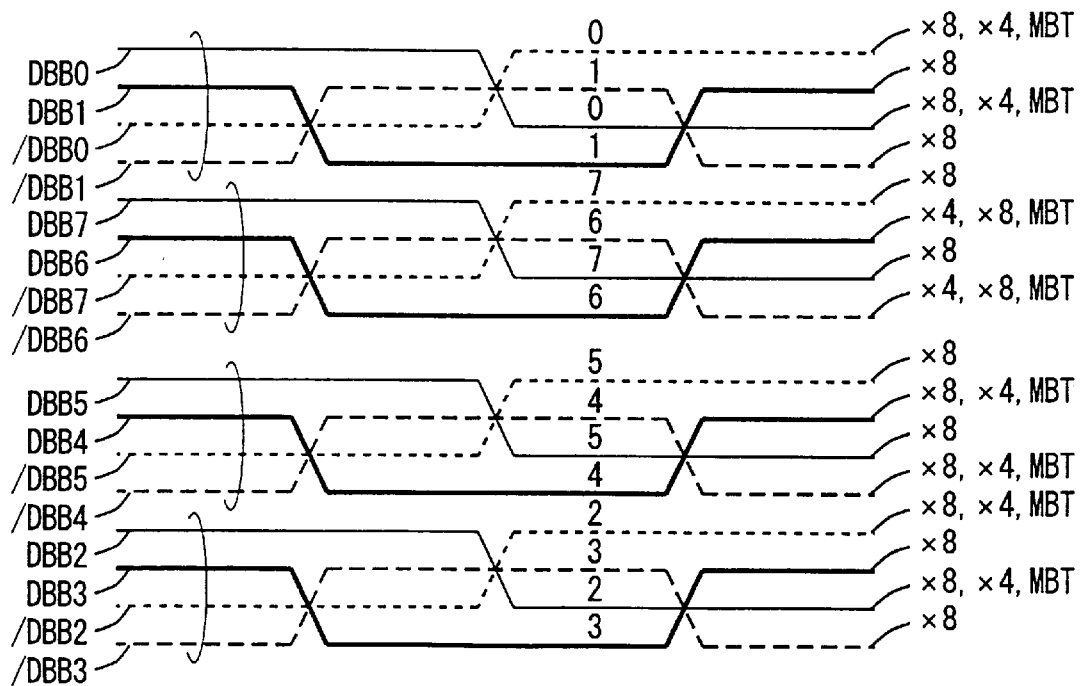
FIG. 51 shows a data bus arrangement of the seventh embodiment of the present invention.

FIG. 51 schematically shows the arrangement of the data bus according to a second embodiment of the present invention. The bus lines of the data bus used in a ×4-bit configuration, a ×8-bit configuration and in the multibit test mode and the bus lines of the data bus used only in a ×8-bit configuration are alternately arranged, with the position thereof interchanged via cross sections at a predetermined region. Four data bus lines are arranged forming a set. In each set of the data bus lines, the bus line used only in the ×8-bit configuration and the bus line used in the ×8-bit configuration, ×4-bit configuration and a multibit test mode are arranged alternately. A bus line corresponding to one pad is arranged between a pair of bus lines corresponding to another pad. In order to accommodate the ×8-bit configuration, 16 bus lines DBB0, /DBB0–DBB7, /DBB7 are arranged as shown in FIG. 51. Data bus lines DBB0, /DBB0, and DBB1, /DBB1 are arranged as one set. Data bus lines DBB7, DBB6, /DBB7 and /DBB6 are arranged as another set. Data bus lines DBB5, /DBB5, DBB4, /DBB4 are arranged as other set. Data bus lines DBB2, DBB3, /DBB2 and /DBB3 are arranged as a further set.

In each set, adjacent data bus lines are always bus lines of different pairs (bus lines corresponding to different pads). In each divisional region, a bus line of a pair is arranged between the bus lines of another pair even if a cross section is included.

In the ×8-bit configuration, all these bus lines are used. Since each data bus line has a cross section, the capacitive coupling of each data bus line is reduced. As a result, the noise by the capacitive coupling between adjacent buses is reduced. Since paired data bus lines have a twist structure (a structure having a cross section), paired bus lines have noise occur in common mode to cancel the noise. Thus, a data signal can be transmitted stably. Particularly, a bus line that is used only in a ×8-bit configuration is arranged between the pair of bus lines used in a ×8-bit configuration, a ×4-bit configuration, and in a multibit test mode. Therefore, by setting an unused data bus at a fixed potential in a ×4-bit configuration, the unused data bus lines can be thoroughly used as a shield line to allow substantial cancel of the noise.

Each set includes the data buses corresponding to the pair of pads that are located as close as possible. Since the data buses are arranged in a one-to-one correspondence with respect to pads PPD0–PPD7 and data buses DB0–DB7 extend in one direction from these pads, (refer to FIG. 1) the length of the pair of data buses can be made substantially equal by selecting the pair of pads that are at closest possible positions. Accordingly, the parasitic capacitance of each line can be made substantially equal to allow the effect of the capacitive coupling to be canceled properly (refer to FIG. 52).

The ×4-bit configuration and the ×8-bit configuration can be realized by use of select signals SEL and SEL1. In a multibit test mode, the data bus used in the ×4-bit configuration is employed by multibit test mode designation signal MBT (indicated by the same reference character to multibit test). This is realized by forced setting of the select signal by multibit test mode designation signal MBT in the previous sixth embodiment.

Figure 52:
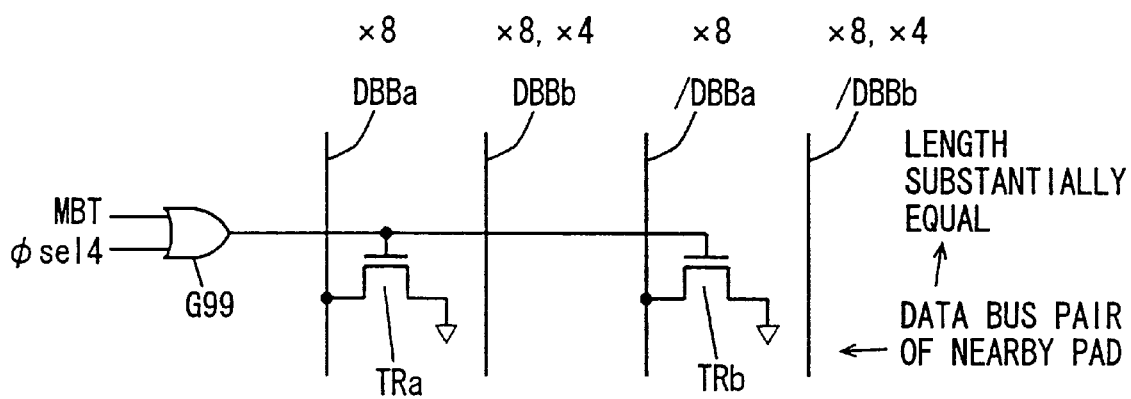
FIG. 52 schematically shows a structure of a modification of the seventh embodiment.

FIG. 52 shows an example of a structure of the data bus lines. In FIG. 52, data bus lines DBBa, DBBb, /DBBa and /DBBb are depicted as the data bus lines of one set. Data bus lines DBBa and /DBBa are used only in a ×8-bit configuration. Data bus lines DBBb and /DBBb are used in a ×8-bit configuration, a ×4-bit configuration, and in a multibit test mode. These data bus lines DBBa, DBBb, /DBBa and /DBBb are sequentially arranged in this order. N channel MOS transistors TRa and TRb receiving the output signal of OR circuit G99 to fix data bus lines DBBa and /DBBa to a predetermined potential (ground potential or power supply potential) are provided corresponding to data bus lines DBBa and /DBBa.

OR circuit G99 receives multibit test mode designation signal MBT and a column select signal φsel4 indicating that the word configuration is a ×4-bit configuration. Since bus lines DBBa and /DBBa are not used in the ×4-bit configuration, MOS transistors TRa and TRb are rendered conductive, and bus lines DBBa and /DBBa are fixed to the level of a predetermined voltage. Also in a multibit test mode, OR circuit G99 provides an output signal of an H level, so that data bus lines DBBa and /DBBa are fixed to the level of a predetermined voltage.

When data bus line DBBa and /DBBa are fixed at the level of the power supply voltage, p channel MOS transistors are used for MOS transistors TRa and TRb. Accordingly, by shielding the used data bus lines DBBb and /DBBb with data bus lines DBBa and /DBBa that are set at the level of the fixed potential, the noise can be completely canceled in a ×4-bit configuration and in a multibit test mode.

Figure 53:
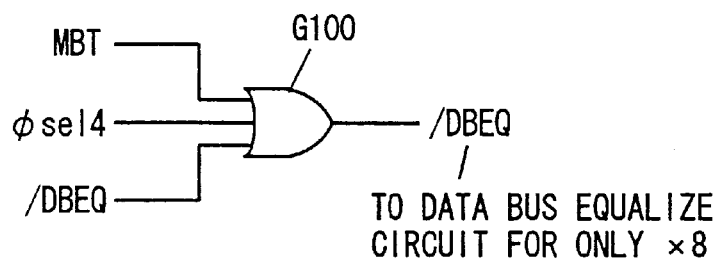
FIG. 53 shows a modification of the control signal generation circuitry of FIG. 52.

FIG. 53 schematically shows a structure of the data bus potential control unit. Referring to FIG. 53, an OR circuit G100 is provided which receives multibit test mode designation signal MBT, bus select signal φsel4, and data bus equalize designation signal /DBEQ. Signal /DBEQ from OR circuit G100 is applied to the data bus equalize circuit. In a normal ×8-bit configuration, signal φsel4 is at an L level and multibit test mode designation signal MBT is at an L level. Therefore, equalization of a corresponding data bus can be controlled according to data bus equalize designation signal /DBEQ.

In a ×4-bit configuration, bus select signal φsel4 and data bus equalize designation signal /DBEQ are at an H level, and the corresponding data bus equalize circuit is constantly on, and the corresponding data bus line is fixed at the level of the ground voltage.

In the multibit test mode, data bus equalize designation signal φDBEQ from OR circuit G100 attains an H level by multibit test mode designation signal MBT, and the corresponding data bus equalize circuit is constantly at a conductive state, and the unused data bus line is fixed at the level of the ground voltage.

When the control circuit shown in FIG. 53 is employed, the existing data bus equalize circuit can be used to fix the potential of the data bus line. Accordingly, the area occupied by the circuitry can be reduced.

The structure of selecting the bus lines of the four bits of the data buses used in a ×4-bit configuration in a multibit test mode can be realized by setting the path of the data bus selector in the previous sixth embodiment according to the logic sum of multibit test mode designation signal MBT and the ×4bit select signal.

As shown in FIG. 52, bus lines in a set are the data bus pair provided corresponding to adjacent pads, and the length thereof can be set substantially equal, and also, the parasitic capacitances thereof are equal to each other. Even if a cross section is provided, the distribution of the parasitic capacitance in each cross section region can be made equal. Thus, a proper noise cancellation can be realized.

In the foregoing, description is provided for the switching between a ×4-bit configuration and a ×8-bit configuration. The structure of the present seventh embodiment can be extended to the switching of multibit configurations such as a ×32-bit configuration, ×16-bit configuration, and a ×8-bit configuration. The cross section can be easily realized by the interconnection of different layers.

According to the seventh embodiment of the present invention, a data bus line used in a certain bit configuration and a data bus line that is not used in that certain word configuration are arranged forming a set, alternately and having a cross section. Therefore, the capacitive coupling noise between the data bus lines can be reduced properly. As a result, a signal can be transmitted speedily and stably. Although the read data drivers are OR-wired to a data bus line in a multibit test mode, a signal indicating the test result can be generated since adjacent bus lines are shielded by a bus line that is fixed at a predetermined potential.

In a semiconductor memory device of a multibit configuration consuming a larger current to likely to cause a power supply noise, data can be transmitted speedily over a data bus line without an effect of capacitive coupling.

Eighth Embodiment

Figure 54:
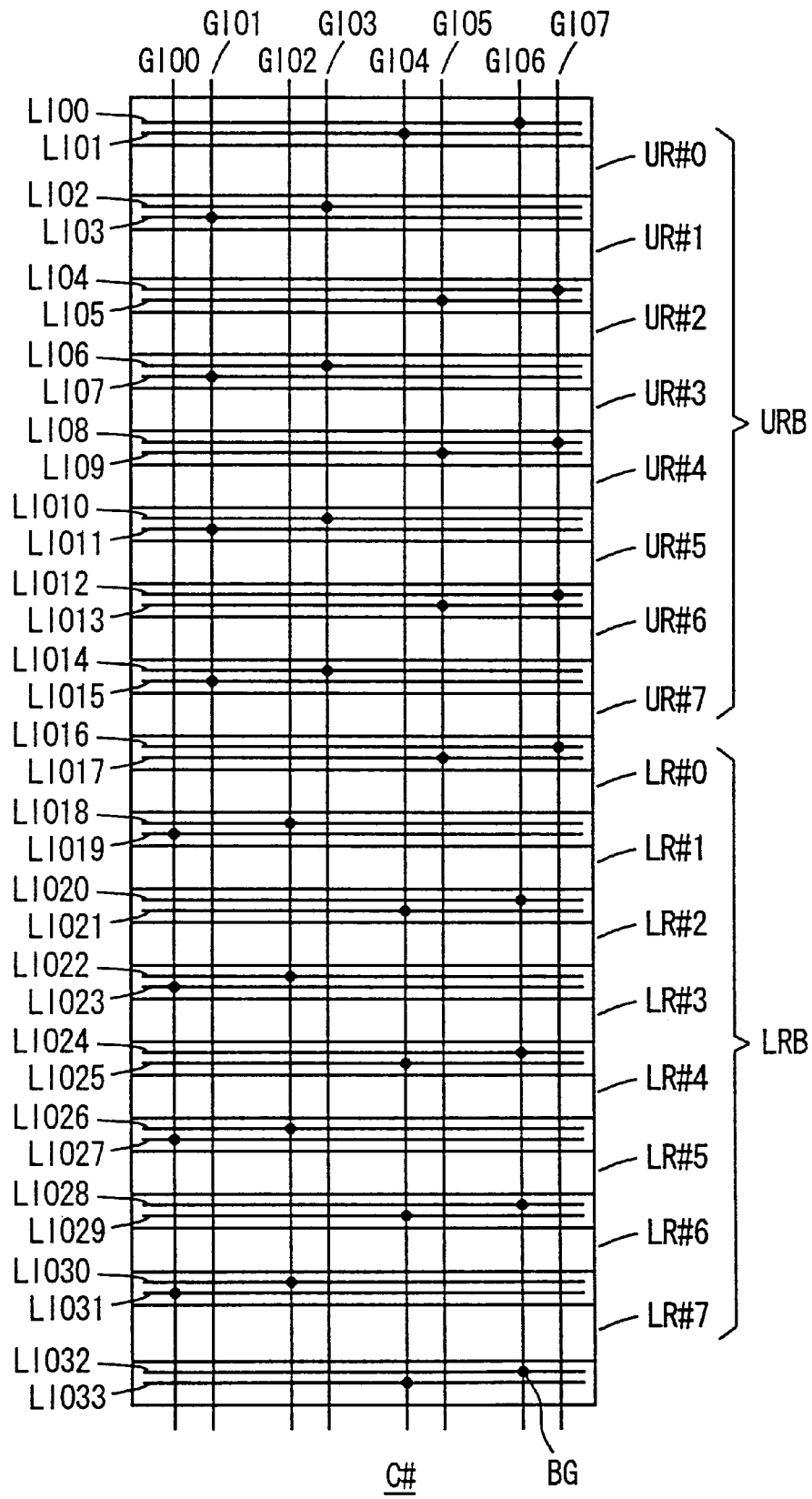
FIG. 54 schematically shows a structure of the array of a semiconductor memory device according to an eighth embodiment of the present invention.

FIG. 54 shows a structure of main part of a semiconductor memory device according to an eighth embodiment of the present invention. In FIG. 54, the structure of one column block C# is illustrated representatively. Column block C# is divided in the column direction into a plurality of row blocks UR#0–UR#7 and LR#0–LR#7 each including a plurality of word lines. Row blocks UR#0–UR#7 form the upper side row block (global block) URB. Row blocks LR#0–LR#7 form the lower side row block (global block) LRB. In selection, one row block is selected from upper side row block URB and one row block is selected from lower side row block LRB. Global IO buses GIO0–GIO7 are arranged extending in the column direction over row blocks UR#0–UR#7 and LR#0–LR#7. Global IO buses GIO0, GIO2, GIO4 and GIO6 are provided corresponding to lower side row block LRB. Global IO buses GIO1, GIO3, GIO5 and GIO7 are provided corresponding to upper side row block URB.

Local IO buses LIO0–LIO33 are arranged for row blocks UR#0–UR#7, and LR#0–LR#7, respectively. Each four buses of global IO buses LIO0–LIO33 are provided corresponding to one row block. Two local IO buses are shared by adjacent row blocks. For example, row block UR#0 transfers data with local IO buses LIO0–LIO3. Local IO buses LIO2 and LIO3 are shared by row blocks UR#0 and UR#1. Local IO buses LIO0–LIO33 transfer data with a corresponding row block.

Local IO buses LIO0–LIO33 are connected to global IO buses GIO0–GIO7 via respective block select gates BG. A local IO bus provided corresponding to a selected row block (the row block including a selected word line) is coupled to a global IO bus via a corresponding block select gate BG.

According to the arrangement of the global/local IO bus of FIG. 54, global IO buses GIO0, GIO2, GIO4 and GIO6 are provided corresponding to the row blocks of lower side row block LRB, while global IO buses GIO1, GIO3, GIO5 and GIO7 are provided corresponding to upper side row block URB. However, local IO buses LIO16 and LIO17 provided corresponding to lower block LR#0 in lower row side block LRB are coupled respectively to global IO buses GIO5 and GIO7 that are provided corresponding to upper side row block URB, via block select gates BG.

Local IO buses LIO0 and LIO1 provided corresponding to row block UR#0 are coupled to global IO buses GIO4 and GIO6 respectively via block select gates BG. The reason why the connection between the local IO bus and the global IO bus differ in row blocks UR#0 and LR#0 is set forth in the following. In operation, one row block is selected from each of upper and lower side row blocks URB and URB. When upper row block UR#7 is selected, lower row block LR#7 is selected. This is because a row block of the same position is selected in both upper side row block URB and lower side row block LRB.

When row block UR#7 is selected and local IO buses LIO16 and LIO17 are coupled to global IO buses GIO4 and GIO6, row block LR#7 and local IO buses LIO32 and LIO33 are coupled to global IO buses GIO and GIO6. In this case, data collision occurs in global IO buses GIO4 and GIO6. Local IO buses LIO16 and LIO17 are coupled to global IO buses GIO5 and GIO7 to prevent such data collision.

When row block LR#0 is selected and row block UR#0 is selected, the data of row block LR#0 is transmitted to local IO buses LIO16 and LIO17. When local IO buses LIO0 and LIO1 are coupled to global IO buses GIO5 and GIO7, collision occurs between the data from row block UR#0 and the data of row block LR#0. Therefore, local IO buses LIO0 and LIO1 are coupled respectively to global IO buses GIO4 and GIO6 to prevent such data collision.

When row blocks UR#0 and LR#0 located at one side end in upper side row block URB and lower side row block LRB are selected, the manner of connection of the local IO bus and the global IO bus differs from that in the selection of another row block in the upper and lower side row blocks. More specifically, in end row block UR#0 at one end, local IO buses LIO0 and LIO1 are coupled to global IO buses GIO4 and GIO6. The remaining row blocks UR#1–UR#7 are coupled to global IO buses GIO5 and GIO7 to transmit selected memory cell data. In end block LR#0 at one end, local IOs buses LIO16 and LIO17 are coupled to global IO buses GIO5 and GIO7. In the remaining row blocks LR#1–LR#7, memory cell data is transmitted via global IO buses GIO4 and GIO6. As for global IO buses GIO0–GIO3, the connection between the local IO bus and the global IO bus is similar for row blocks of the upper and lower side row blocks URB and LRB.

In the present invention, each data bus is provided in a one-to-one correspondence to a pad. In a multibit test mode, data from a pad is transmitted to a plurality of memory cells. In this multibit test mode, connection between the data bus and the global IO bus is modified according to whether the end block is selected or not, so that determination of a column of defective memory cells, i.e. spare determination, can be carried out.

Figure 55:
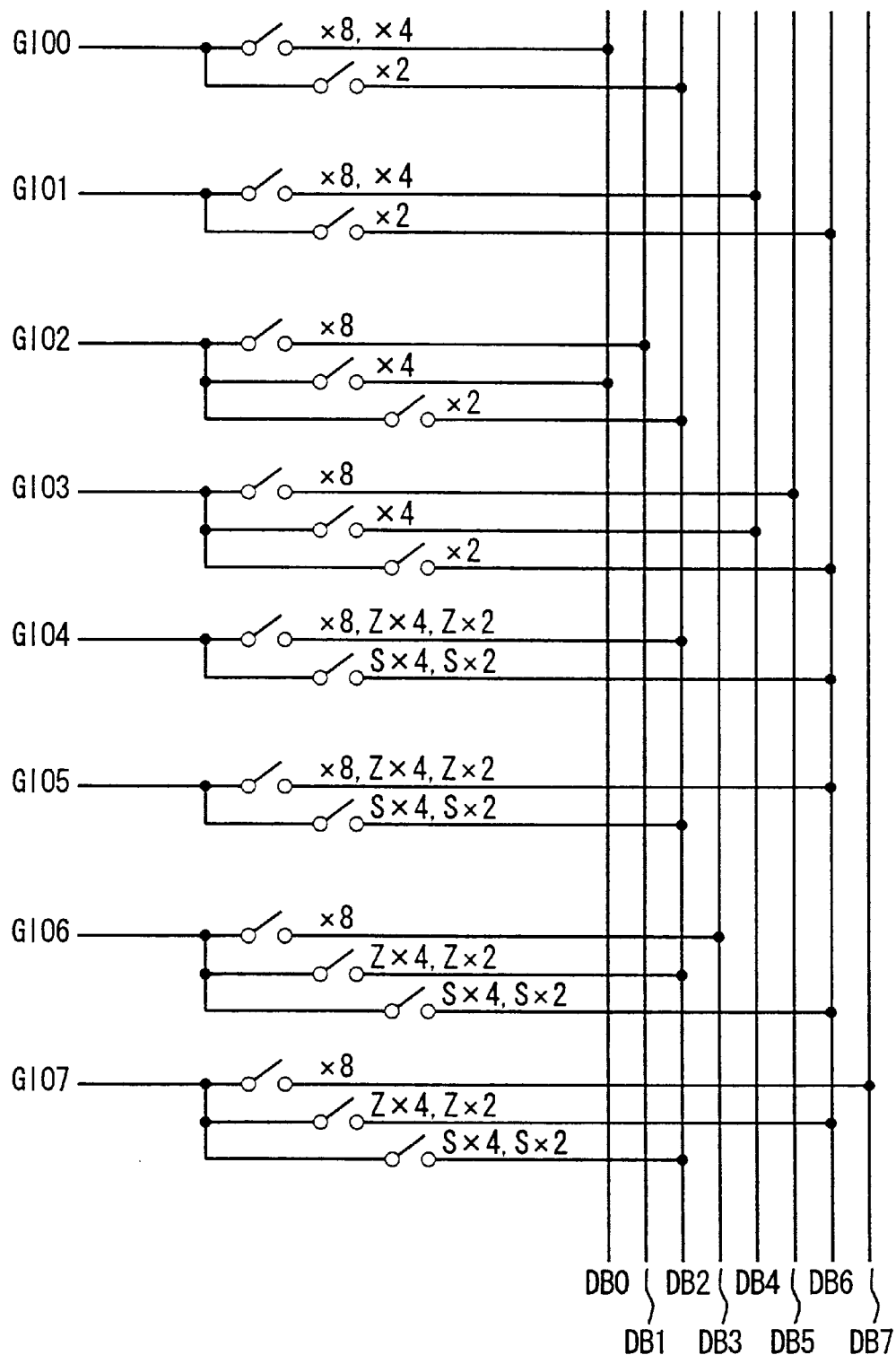
FIG. 55 schematically shows the correspondence between a global data bus and a data bus according to the eighth embodiment of the present invention.

FIG. 55 shows the correspondence between a global IO bus and a data bus. Referring to FIG. 55, global IO bus GIO is coupled to data bus DB0 in a ×8-bit configuration and a ×4-bit configuration, and to data bus DB2 in a ×2-bit configuration. Global IO bus GIO1 is coupled to data bus DB4 in a ×8-bit configuration and in a ×4-bit configuration, and to data bus DB6 in a ×2-bit configuration. Global IO bus GIO2 is coupled to data bus DB1 in a ×8-bit configuration, to data bus DB0 in a ×4-bit configuration, and to data bus DB2 in a ×2-bit configuration.

Global IO bus GIO3 is coupled to data bus DB5 in a ×8-bit configuration, to data bus DB4 in a ×4-bit configuration, and to data bus DB6 in a ×2-bit configuration.

The connection between global data buses GIO0–GIO3 and data buses is determined uniquely for each word configuration regardless of selection/non-selection of the end block. This is because the connection between a local IO bus and a global IO bus is identical in both the upper and lower side row blocks URB and LRB, as shown in FIG. 54, so that modification is not required.

Global IO bus GIO4 is coupled to data bus DB2 in a ×8-bit configuration, and to data bus DB2 when a row block other than the end block is selected in a ×4-bit configuration or a ×2-bit configuration. When the end block is selected in the ×4-bit configuration or the ×2-bit configuration, global IO bus GIO4 is coupled to data bus DB6. In FIG. 55, reference character ZX4 indicates that a row block other than the end block is selected in a ×4-bit configuration. Reference character ZX2 indicates the case where a row block other than the end block is selected in a ×2-bit configuration. Reference character SX4 indicates the case where the end block is selected in a ×4-bit configuration. Reference character SX2 indicates to the case where the end block is selected in the ×2-bit configuration.

Global IO bus GIO5 is coupled to data bus DB6 in a ×8-bit configuration, or when a row block other than the end block is selected in a ×4-bit configuration or ×2-bit configuration, and coupled to data bus DB2 when the end block is selected in a ×4-bit configuration or a ×2-bit configuration.

Global IO bus GIO6 is coupled to data bus DB3 in a ×8-bit configuration, to data bus DB2 when a row block other than the end block is selected in a ×4-bit configuration or a ×2-bit configuration, and coupled to data bus DB6 when the end block is selected in a ×4-bit configuration or a ×2-bit configuration.

Global IO bus GIO7 is coupled to data bus DB7 in a ×8-bit configuration, to data bus DB6 when a row block other than the end block is selected in a ×4-bit configuration or a ×2-bit configuration, and coupled to data bus DB2 when an end block is selected in a ×4-bit configuration or a ×2-bit configuration.

Although each global IO bus is depicted to be coupled to a data bus by mechanical switching in FIG. 55, connection between a global IO bus and a data bus can be switched by switching a select signal for a read data driver in an internal read out/write circuit of a previous embodiment, or by generating a corresponding select signal to a bus selector.

In a ×8-bit configuration, global IO buses GIO0–GIO7 are coupled to data buses DB0–DB7, respectively. This connection is fixed regardless of selection/non-selection of the end block. This is because testing is not carried out under a ×8-bit configuration in a multi-bit test mode (forced to a ×4- or ×2-bit configuration).

Figure 56:
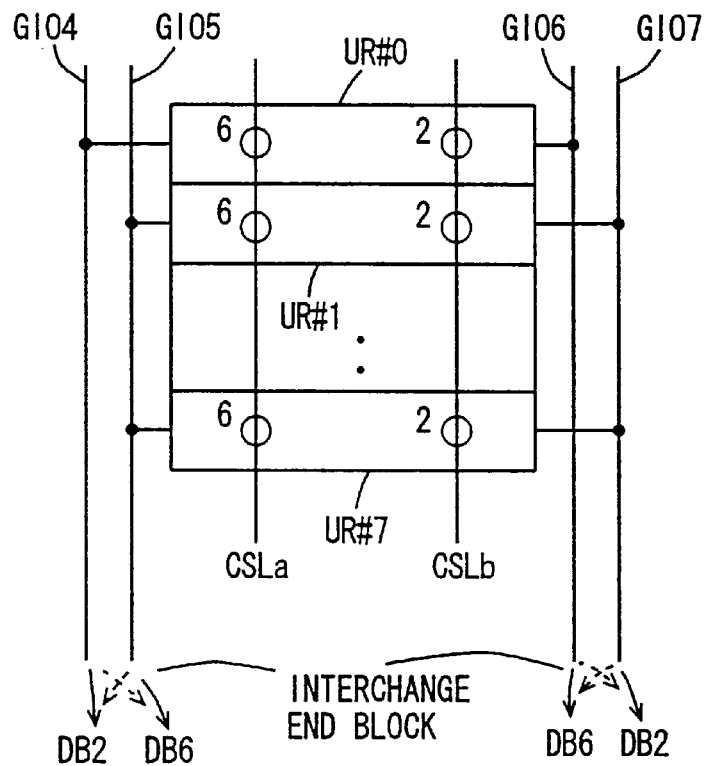
FIG. 56 schematically depicts an operation of the semiconductor memory device of the eighth embodiment.

FIG. 56 shows the connection between row blocks UR#0–UR#7 of the upper side row block and global data buses GIO04–GIO7 of FIG. 54. Row block UR#0 is coupled to global IO buses GIO4 and GIO6 via the local IO bus. Row blocks UR#1–UR#7 are coupled to global IO buses GIO5 and GIO7 via corresponding local IO buses. Column select lines CSLa and CSLb are provided in common to row blocks UR#0–UR#7. These column select lines transmit a column select signal from a column decoder not shown to select memory cells of 2 bits in total.

When a block other than the end block is selected in a ×4-bit configuration or a ×2-bit configuration, global IO buses GIO4 and GIO7 are coupled to data bus DB2, whereas global IO buses GIO5 and GIO6 are coupled to data bus DB6. When the end block, i.e., row block UR#0, is selected, global IO bus GIO4 is coupled to data bus DB6 whereas global IO bus GIO6 is coupled to data bus DB2. Therefore, data (6) on data bus DB6, i.e., from pad PPD6, is stored in the memory cell on column select line CSLa. Data (2) on data bus DB2, i.e. from pad PPD2, is stored in the memory cell on column select line CSLb. Therefore, identification is facilitated of whether there is a defective memory cell in the column direction in a multibit test mode.

Even when any of row blocks UR#0–UR#7 is selected in a multibit test mode, the write data from pad PPD6 and the write data from pad PPD2 are transmitted to data bus DB6 and data bus DB2, respectively, to enable determination of logic match/mismatch. A plurality of column blocks are provided in parallel. The data written from the same pad is read out to the same data bus in each column block. Therefore, by determining whether the memory cell on the same column is normal defective in each column block, identification can be made of the distribution of a defective memory cell in the column direction for each column block. Therefore, a defective memory cell can be repaired by replacement using a redundant column. Distribution of a defective memory cell in the row direction can easily be identified every row block. Thus, determination can be made of whether a defective column can be repaired or not using a multibit test mode even when a data bus and a pad are provided in a one-to-one correspondence and the connection between a data bus and a memory array row block differs according to the position of the row block.

Figure 57:
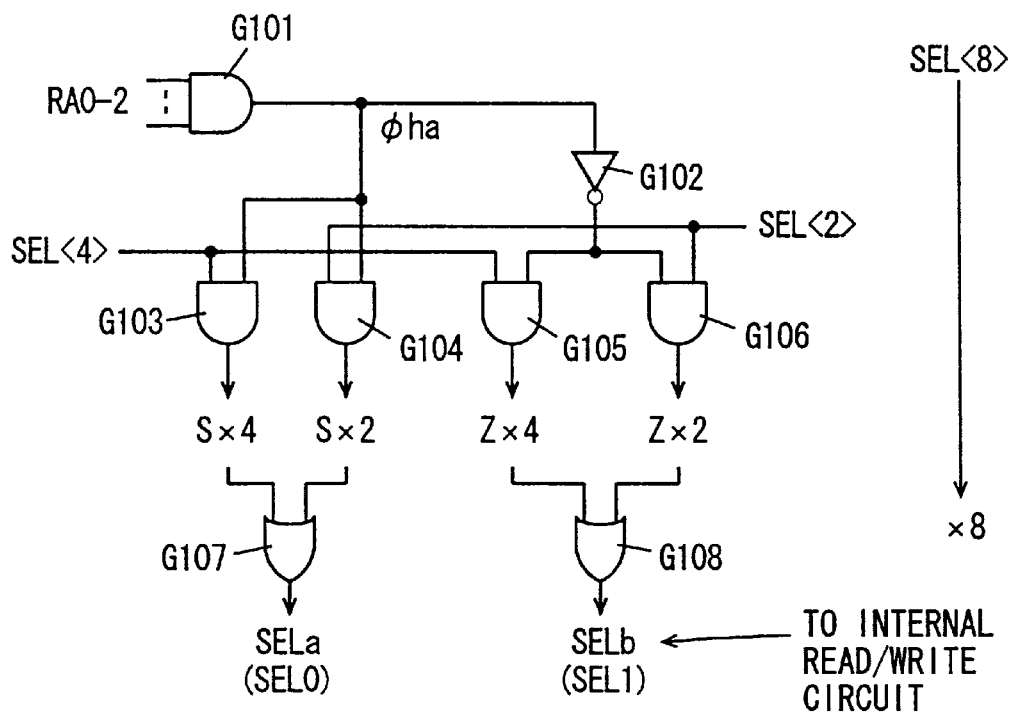
FIG. 57 schematically shows a structure of select signal generation circuitry according to the eighth embodiment of the present invention.
Figure 58:
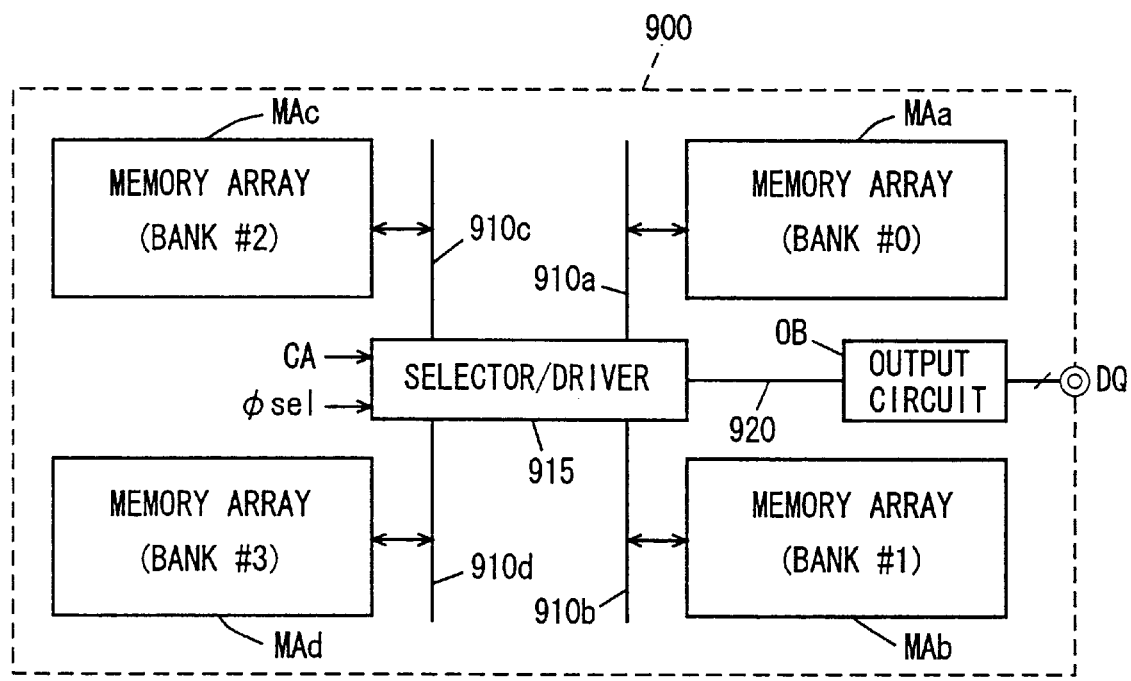
FIG. 58 schematically shows an entire structure of a conventional semiconductor memory device.
Figure 59:
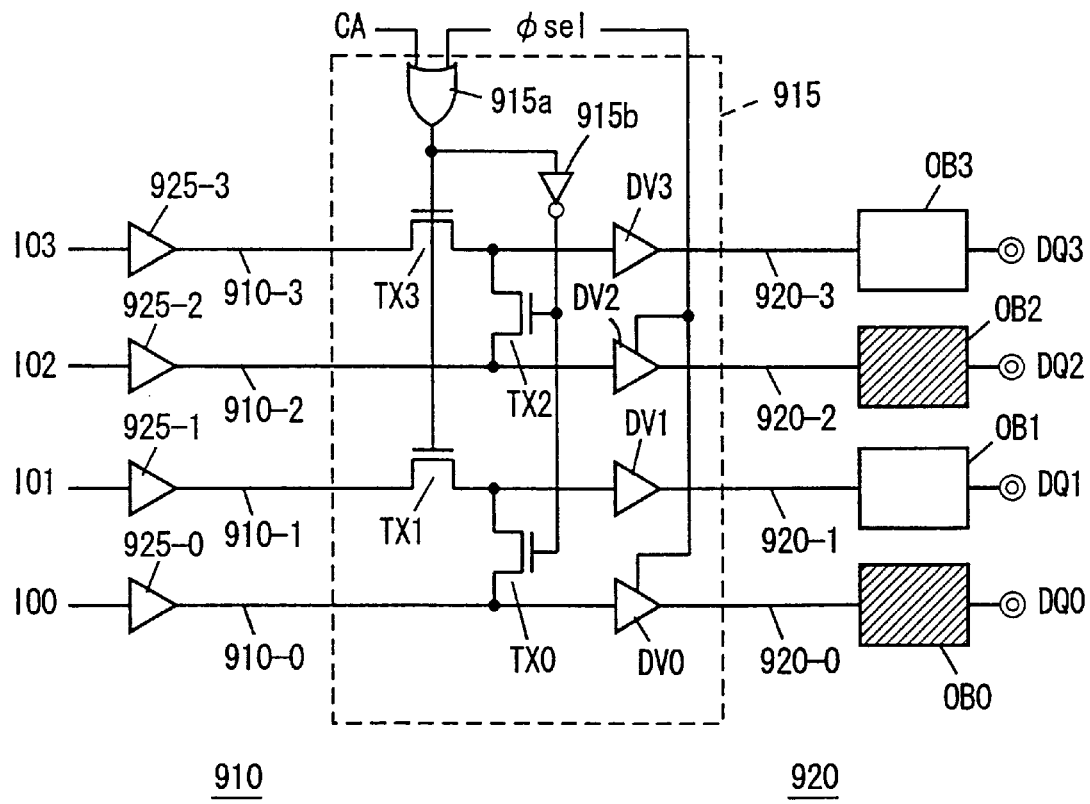
FIG. 59 schematically shows a structure of the selector/driver of FIG. 58.

FIG. 57 schematically shows a structure of a bus connection switch control signal generation circuitry. Referring to FIG. 57, a bus switch control signal generation circuitry includes an AND type decode circuit GIO1 receiving row address signal bits RA0–RA2 (RA0–2) to output a signal φha indicating whether a specified row block is the end block or not, an inverter GIO2 inverting the output signal of decode circuit GIO1, an AND circuit GIO3 receiving end block designation signal φha and a ×4-bit configuration designation signal SEL<4>, an AND circuit GIO4 receiving end block specification signal φha and a ×2-bit configuration designation signal SEL<2>to output a signal SX2, an AND circuit GIO5 receiving the output signal of inverter GIO2 and a ×4-bit configuration designation signal SEL<4>to output a signal ZX4, an AND circuit GIO6 receiving ×2 bit configuration designation signal SEL<2>and the output signal of inverter GIO2 to output signal ZX2, an OR circuit GIO7 receiving output signals SX4 and SX2 of AND circuits GIO3 and GIO4 to output a select signal SELa, and an OR circuit G108 receiving signals ZX4 and ZX2 respectively from AND circuits GIO5 and GIO6 to output a select signal SELb. Select signals SELa and SELb are applied to internal read/write circuits provided corresponding to respective global IO buses of each column block.

In a ×8bit configuration, end block designation signal φha is not used. A signal ×8 is generated from ×8-bit configuration designation signal SEL<8>. By utilizing the structure shown in FIG. 57, the connection between a data bus and a global IO bus can be easily switched according to selection/nonselection of the end block to implement the connection shown in FIG. 55.

According to the eighth embodiment of the present invention, correspondence between a data bus provided in a one-to-one correspondence with the pad and a global IO bus is switched according to whether the end block is selected or not. Therefore, determination can easily be made of whether redundancy replacement is allowed or not by means of multibit testing.

In a multibit test mode, whether the data bus of 4 or 2 bits is used arbitrarily determined.

In a ×2-bit configuration and a ×4-bit configuration, which of the global IO buses should be selected for data access can easily be determined by modifying the number of bits of the column block select signal according to the word configuration.

A ×32-bit configuration or a ×16-bit configuration can easily be realized by using a similar structure.

In the ×8-bit configuration, layout is facilitated since the portion of the circuit receiving a select signal (read data driver and bus selector) is arranged in an alternate manner of 2 and 3 in number for each global IO bus, as shown in FIG. 55.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of pads;
   a plurality of memory arrays each having a plurality of memory cells;
   a plurality of data buses provided corresponding to said plurality of pads, respectively, each of the data buses being provided common to said plurality of memory arrays; and
   a plurality of read data drivers arranged corresponding to said plurality of data buses in each of said plurality of memory arrays, for transmitting data read out from corresponding memory arrays to corresponding data buses, said plurality of read data drivers including read data drivers driving a same data bus and read data drivers driving data buses differing from each other in each of the memory arrays.

2. The semiconductor memory device according to claim 1, further comprising control circuitry for setting a read data driver to be used out of said plurality of read data drivers to an operable state according to word configuration information indicating the number of pads used out of said plurality of pads, wherein data from the read data driver of the operable state is transmitted to a data bus provided corresponding to the pad used out of said plurality of data buses.

3. The semiconductor memory device according to claim 1, further comprising an output circuit arranged corresponding to each of said plurality of data buses in a proximity of said plurality of pads, for transmitting data applied via a corresponding data bus to a corresponding pad.

4. The semiconductor memory device according to claim 1, wherein each of said plurality of data buses transfers both read data read out from a selected memory cell of said plurality of memory arrays and write data to be written into said selected memory cell in said plurality of memory arrays, and wherein
   said semiconductor memory device further comprises a plurality of write data drivers arranged corresponding to said plurality of read data drivers respectively in each of said plurality of memory arrays, for transmitting data on a corresponding data bus to a corresponding memory array.

5. The semiconductor memory device according to claim 4, further comprising circuitry for setting said plurality of write data drivers selectively to an operable state according to word configuration information specifying the number of pads used out of said plurality of pads.

6. The semiconductor memory device according to claim 4, further comprising a plurality of input circuits one arranged corresponding to each of said plurality of data buses in a proximity of said plurality of pads, for transmitting data from a corresponding pad to a corresponding data bus.

7. The semiconductor memory device according to claim 1, wherein said plurality of memory arrays form a plurality of banks each driven to a selected state independent of others.

8. A semiconductor memory device comprising:
a data bus;
a memory array including a plurality of memory cells;
a preamplifier, coupled to said memory array, for amplifying data from a selected memory cell of said memory array;
a read data driver, coupled to said preamplifier and said data bus, for driving said data bus according to output data of said preamplifier; and
mask control circuitry, coupled to said read data driver, for incorporating a mask designation signal in synchronization with a clock signal to render said read data driver inactive in response to mask designation of said mask designation signal.

9. The semiconductor memory device according to claim 8, further comprising a shift circuit for delaying output data of said preamplifier by a period of a predetermined number of cycle(s) of said clock signal for application to said read data driver, said predetermined number being at least zero.

10. The semiconductor memory device according to claim 8, further comprising:
a pad provided corresponding to said data bus; and
an output circuit for generating read data according to data on said data bus for transmission to said pad.

11. The semiconductor memory device according to claim 8, further comprising a write data driver coupled to said data bus to generate write data according to data on said data bus and transmitting the generated data to the selected memory cell in said memory array in a data writing operation,
wherein said mask control circuitry includes a circuit for rendering said write data driver inactive in response to said mask designation signal in the data writing operation.

12. The semiconductor memory device according to claim 11, wherein said circuit of said mask control circuitry further includes a circuit for rendering said read data driver or said write data driver inactive in a cycle of said clock signal where said mask designation signal is applied according to an operation mode of data reading or data writing.

13. The semiconductor memory device according to claim 8, wherein
said memory array is divided into a plurality of blocks each including the plurality of memory cells,
said preamplifier includes a plurality of preamplifier circuits arranged corresponding to said plurality of blocks respectively, each preamplifier circuit being able to output ternary data and amplifying data read out from a corresponding block when made active,
said data bus is provided in common to said plurality of blocks,
said read data driver includes a plurality of read data drive circuits provided corresponding to said plurality of preamplifiers, respectively, each read data drive circuit driving said data bus according to output data of a corresponding preamplifier circuit, each read data drive circuit attaining an output high impedance state according to data output when a corresponding preamplifier circuit is at an inactive state, and said plurality of preamplifier circuits are selectively rendered active by a preamplifier activation circuit responsive to a block specifying signal specifying a block in said memory array and a preamplifier activation signal rendered active in synchronization with said clock signal in a data reading operation.

14. The semiconductor memory device according to claim 13, further comprising a shift circuit provided corresponding to each said plurality of preamplifier circuits, for shifting ternary output data from a corresponding preamplifier circuit by a period of a predetermined number of at least 0 cycles of said clock signal for application to a corresponding read data drive circuit.

15. The semiconductor memory device according to claim 13, wherein each of said plurality of preamplifier circuits comprises
an amplify circuit for amplifying memory cell data for outputting to one pair of output nodes when activated,
a precharge circuit for precharging said one pair of output nodes to a first potential when activated, and
a pair of cross-coupled transistors connected to said one pair of output nodes, for driving an output node of said one pair closer in potential to said first potential to a level of said first potential.

16. The semiconductor memory device according to claim 14, wherein each of said plurality of shift circuits comprises
a first latch stage for incorporating and latching output data of a corresponding preamplifier circuit in response to said preamplifier activation signal, and
a second latch stage for incorporating and latching output data of said first latch stage in response to inactivation of said read data driver.

17. The semiconductor memory device according to claim 8, further comprising a write data driver arranged between said memory array and said data bus and electrically coupled to said data bus, for producing an internal write data in accordance with data on said data bus for transmission to the selected memory cell in said memory array when activated in a data writing operation mode.

18. The semiconductor memory device according to claim 8, further comprising a shift circuit coupled between said preamplifier and said read data driver, for shifting the output data of said preamplifier in synchronization with said clock signal for transmission to said read data driver.

19. The semiconductor memory device according to claim 18, wherein said preamplifier supplies ternary data through the use of complementary data signals, and said shift circuit receives the ternary data as said output data for shifting.

20. The semiconductor memory device according to claim 18, wherein said semiconductor memory device operates in synchronization with said clock signal, and a period of shifting of said shift circuit is determined in accordance with a column latency, said column latency defining a period required from application of a data read instruction to external outputting of a valid data in terms of said clock signal.

21. The semiconductor memory device according to claim 1, wherein said plurality of data buses transfer data for corresponding pads, and
wherein each bus line pair of said plurality of data buses has a bus line of a data bus corresponding to another pad arranged therebetween and has a twist structure in which positions of bus lines of each bus line pair are exchanged.

22. The semiconductor memory device according to claim 21, wherein said plurality of pads are selectively used according to either one of a first word configuration in which at least a first plurality of pads are used and a second word configuration in which a second plurality of pads are used, and wherein said plurality of data buses are arranged such that a data bus corresponding to a pad used in said first word configuration and a data bus corresponding to a pad used in said first and second word configurations form a set, and bus lines of different data buses corresponding to different pads are arranged alternately in each set.

23. The semiconductor memory device according to claim 21, wherein said first plurality is smaller than said second plurality, and wherein said semiconductor memory device further comprises circuitry for fixing a data bus corresponding to a pad used in said second word configuration and unused in said first word configuration to a predetermined potential in said first word configuration.

24. The semiconductor memory device according to claim 21, further comprising circuitry for causing data read in a multibit test mode to be transmitted ont the data bus corresponding to the pad used in said first word configuration, the multibit test mode carrying out testing of plurality of memory cells simultaneously, and for setting the data bus differing from said data bus corresponding to the pad used in said first word configuration to a predetermined potential in said multibit test mode.

25. The semiconductor memory device according to claim 22, wherein each said set includes data buses arranged corresponding to pads arranged in close proximity to each other.

26. The semiconductor memory device according to claim 2, wherein said plurality of memory arrays include a plurality of row blocks, said plurality of row blocks being divided into at least two global blocks, and said semiconductor memory device comprises:

a plurality of local data buses arranged corresponding to said plurality of row blocks, for transferring data with a corresponding row block;

a plurality of global data buses arranged in common to said plurality of row blocks, a connection manner between a local data bus corresponding to a row block at one side end of one global block and the global data buses differing from the connection manner between a local data bus of another row block in said one global block and the global data buses, a row block in each of said at least two global blocks being rendered active simultaneously, and the read data drivers being arranged such that a plurality of read data drivers for one global data bus are provided corresponding to the data buses differing from each other; and control circuitry for selectively rendering said plurality of read data drivers active to decide correspondence between said plurality of global data buses and said plurality of data buses according to word configuration information indicating the number of pads used out of said plurality of pads and a row block specifying signal specifying a selected row block in said memory array.

27. The semiconductor memory device according to claim 26, wherein said row block specifying signal specifies whether a selected row block is the row block at said one side end.

28. The semiconductor memory device according to claim 26, wherein activation and inactivation of said plurality of read data drivers are controlled ignoring said row block specifying signal when said word configuration information designates usage of all said plurality of pads.

29. The semiconductor memory device according to claim 26, wherein a read data deiver is provided for a predetermined data bus out of said plurality of data buses with respect to each of said plurality of global data buses.

* * * * *

UNITED STATES PATENT AND TRADEMARK OFFICE
CERTIFICATE OF CORRECTION

PATENT NO. : 6,166,989 Page 1 of 1
DATED : December 26, 2000
INVENTOR(S) : Takeshi Hamamoto et al.

It is certified that error appears in the above-identified patent and that said Letters Patent is hereby corrected as shown below:

<u>Claim 12,</u>
Line 2, delete "further".

Signed and Sealed this

Eighth Day of January, 2002

Attest:

Attesting Officer

JAMES E. ROGAN
*Director of the United States Patent and Trademark Office*